United States Patent
Bronner et al.

(10) Patent No.: US 12,002,513 B2
(45) Date of Patent: Jun. 4, 2024

(54) SELF-ANNEALING DATA STORAGE SYSTEM

(71) Applicant: Rambus Inc., San Jose, CA (US)

(72) Inventors: Gary B. Bronner, Los Altos, CA (US); Brent Steven Haukness, Sunnyvale, CA (US); Mark A. Horowitz, Menlo Park, CA (US); Mark D. Kellam, Siler City, NC (US); Fariborz Assaderaghi, Emerald Hills, CA (US)

(73) Assignee: Rambus Inc., San Jose, CA (US)

( * ) Notice: Subject to any disclaimer, the term of this patent is extended or adjusted under 35 U.S.C. 154(b) by 41 days.

(21) Appl. No.: 17/567,401

(22) Filed: Jan. 3, 2022

(65) Prior Publication Data

US 2022/0238159 A1    Jul. 28, 2022

Related U.S. Application Data

(63) Continuation of application No. 14/940,084, filed on Nov. 12, 2015, now Pat. No. 11,244,727, which is a (Continued)

(51) Int. Cl.
*G11C 16/06* (2006.01)
*G11C 13/00* (2006.01)
(Continued)

(52) U.S. Cl.
CPC .......... *G11C 16/06* (2013.01); *G11C 13/0002* (2013.01); *G11C 13/0033* (2013.01);
(Continued)

(58) Field of Classification Search
CPC ............................... G11C 7/04; H01L 21/324
See application file for complete search history.

(56) References Cited

U.S. PATENT DOCUMENTS

| 3,383,614 A | 5/1968 | Emmons et al. |
| 4,264,376 A * | 4/1981 | Yatsuda ............... H01L 29/518 |
| | | 438/909 |

(Continued)

FOREIGN PATENT DOCUMENTS

| EP | 0540287 A2 | 5/1993 |
| JP | 11-026391 | 1/1999 |

(Continued)

OTHER PUBLICATIONS

Kim et al., "Effect of Thermal Annealing on Nonvolatile Memory Structures Containing a High-k La2O3 Charge-trapping Layer", Journal of the Korean Physical Society, vol. 58, No. 2, Feb. 2011, pp. 264-269 (Year: 2011).*

(Continued)

*Primary Examiner* — Henry Tsai
*Assistant Examiner* — Aurangzeb Hassan
(74) *Attorney, Agent, or Firm* — Charles Shemwell

(57) ABSTRACT

Control logic within a memory control component outputs first and second memory read commands to a memory module at respective times, the memory module having memory components disposed thereon. Interface circuitry within the memory control component receives first read data concurrently from a first plurality of the memory components via a first plurality of data paths, respectively, in response to the first memory read command, and receives second read data concurrently from a second plurality of the memory components via a second plurality of data paths, respectively, in response to the second memory read command, the first plurality of the memory components including at least one memory component not included in the second plurality of the memory components and vice-versa.

18 Claims, 41 Drawing Sheets

Related U.S. Application Data continuation of application No. 14/097,503, filed on Dec. 5, 2013, now Pat. No. 9,202,572, which is a continuation of application No. 13/726,042, filed on Dec. 22, 2012, now abandoned, which is a continuation of application No. 12/859,554, filed on Aug. 19, 2010, now Pat. No. 8,344,475, which is a continuation-in-part of application No. 12/516,499, filed as application No. PCT/US2007/085979 on Nov. 29, 2007, now abandoned, said application No. 12/859,554 is a continuation-in-part of application No. 12/676,594, filed as application No. PCT/US2008/075261 on Sep. 4, 2008, now Pat. No. 8,193,573.

(60) Provisional application No. 61/235,964, filed on Aug. 21, 2009, provisional application No. 60/867,704, filed on Nov. 29, 2006, provisional application No. 60/970,223, filed on Sep. 5, 2007.

(51) Int. Cl.
   *G11C 16/26* (2006.01)
   *G11C 7/04* (2006.01)
   *H01L 21/324* (2006.01)

(52) U.S. Cl.
   CPC .......... *G11C 13/0035* (2013.01); *G11C 16/26* (2013.01); *G11C 7/04* (2013.01); *H01L 21/324* (2013.01)

(56) References Cited

U.S. PATENT DOCUMENTS

| | | | |
|---|---|---|---|
| 4,374,316 | A | 2/1983 | Inamori et al. |
| 5,898,706 | A | 4/1999 | Dufresne et al. |
| 5,956,350 | A | 9/1999 | Irrinki et al. |
| 6,009,033 | A | 12/1999 | Li et al. |
| 7,719,048 | B1 | 5/2010 | Babcock et al. |
| 8,193,573 | B2 | 6/2012 | Bronner et al. |
| 2001/0026496 | A1 | 10/2001 | Hidaka |
| 2002/0194427 | A1 | 12/2002 | Hashemi |
| 2003/0105828 | A1 | 6/2003 | Sano et al. |
| 2003/0145136 | A1 | 7/2003 | Tierney et al. |
| 2003/0191890 | A1 | 10/2003 | Okamoto et al. |
| 2003/0217236 | A1 | 11/2003 | Rowlands |
| 2004/0013263 | A1 | 1/2004 | Maclean |
| 2004/0066758 | A1 | 4/2004 | Van Doren et al. |
| 2004/0230735 | A1 | 11/2004 | Moll |
| 2004/0250020 | A1 | 12/2004 | Kuwata |
| 2005/0080948 | A1 | 4/2005 | Rowlands |
| 2005/0080952 | A1 | 4/2005 | Oner et al. |
| 2005/0097280 | A1 | 5/2005 | Hofstee et al. |
| 2005/0114587 | A1 | 5/2005 | Chou et al. |
| 2005/0188149 | A1* | 8/2005 | Kaler ............... G06F 12/0246 711/165 |
| 2005/0224849 | A1* | 10/2005 | Isenberger ............ G11C 11/22 257/295 |
| 2005/0236662 | A1 | 10/2005 | Lee |
| 2005/0268048 | A1 | 12/2005 | Hofstee et al. |
| 2006/0062047 | A1 | 3/2006 | Bhakta et al. |
| 2006/0077737 | A1 | 4/2006 | Ooishi |
| 2006/0090027 | A1 | 4/2006 | Fujimoto et al. |
| 2006/0103007 | A1 | 5/2006 | Aitken et al. |
| 2006/0140005 | A1 | 6/2006 | Yeh |
| 2006/0233030 | A1 | 10/2006 | Choi |
| 2007/0008328 | A1 | 1/2007 | MacWilliams et al. |
| 2007/0088995 | A1 | 4/2007 | Tsern et al. |
| 2007/0113025 | A1 | 5/2007 | Ozaki et al. |
| 2007/0124532 | A1 | 5/2007 | Bennett |
| 2007/0260841 | A1 | 11/2007 | Hampel et al. |
| 2007/0268736 | A1 | 11/2007 | Cannon et al. |
| 2007/0271424 | A1 | 11/2007 | Lee et al. |
| 2008/0005471 | A1 | 1/2008 | Ma et al. |
| 2008/0005479 | A1 | 1/2008 | Tremaine |
| 2008/0028127 | A1 | 1/2008 | Ware et al. |
| 2008/0089134 | A1 | 4/2008 | Ito |
| 2008/0244135 | A1 | 10/2008 | Akesson et al. |
| 2008/0263266 | A1 | 10/2008 | Sharon et al. |
| 2009/0125671 | A1 | 5/2009 | Flynn et al. |
| 2009/0285030 | A1 | 11/2009 | Kang et al. |

FOREIGN PATENT DOCUMENTS

| | | |
|---|---|---|
| JP | 11-039890 | 2/1999 |
| JP | 11-354601 | 12/1999 |
| JP | 2003-517176 A | 5/2003 |
| JP | 2004-047027 | 2/2004 |
| JP | 2004-310930 | 11/2004 |
| JP | 2006-196650 | 7/2006 |
| JP | 2008-031187 | 2/2008 |

OTHER PUBLICATIONS

Orlando Auciello, James F.Scott, Ramamoorthy Ramesh, The Physics of Ferroelectric Memories, Jul. 1998, Physics Today (Year: 1998).*
R.Ramesh, S.Aggarwal, O.Auciello, Science and technology of ferroelectric films and heterostructures for non-volatile ferroelectric memories, 2001, Materials Science and Engineering, 32, pp. 191-236 (Year: 2001).*
Chabrerie et al., "A New Integrated Test Structure for on-chip Post-Irradiation Annealing in MOS Devices," IEEE Transactions on Nuclear Science, IEEE Service Center, New York, NY, US. vol. 45, No. 3, Jun. 1998, pp. 1438-1443. 6 pages.
CN Office Action dated Jun. 26, 2014 in CN Application No. 201080042995.8, Includes an English Translation. 9 pages.
EP Office Communication pursuant to Article 94(3) EPC, dated Sep. 27, 2012, re EP Application No. 08799167.5-2210. 4 pages.
EP Office Communication pursuant to Article 94(3) EPC, dated Sep. 28, 2010 in EP Application No. 08799167.5-2210. 4 pages.
EP Response dated Apr. 7, 2011 to the Official Communication dated Sep. 28, 2010 re EP Application No. 08799167.5. 18 pages.
EP Response to Office Action dated Apr. 4, 2013 in EP Application No. 08799167.5. 5 pages.
International Preliminary Report on Patentability (Chapter I) dated Mar. 1, 2012 re International Application No. PCT/US10/040322. 6 pages.
International Preliminary Report on Patentability (Chapter I) dated Mar. 18, 2010 re International Application No. PCT/US2008/075261, Includes Written Opinion. 7 pages.
International Preliminary Report on Patentability dated Dec. 23, 2008 for PCT/US2007/085979. 6 pages.
International Search Report and Written Opinion issued in PCT/US2008/075261, dated Mar. 24, 2009. 20 pages.
International Search Report and Written Opinion dated Aug. 30, 2010 for International Application No. PCT/US2010/040322. 9 pages.
International Search Report dated Apr. 28, 2008 for International Application No. PCT/US2007/085979. 5 pages.
JP Notice of Reasons for Rejection dated Sep. 7, 2012, re JP Application No. 2009-539495. 11 pages.
JP Office Action dated Dec. 12, 2012 in JP Application No. 2010-524138, Includes English Translation. 7 pages.
JP Office Action dated Jan. 16, 2013 in JP Application No. 2009-539495, Includes English Translation. 13 pages.
Kelleher et al., "Investigation of On-chip High Temperature Annealing of PMOS Dosimeters," IEEE Transactions on Nuclear Science, IEEE Service Center, New York, NY, US. vol. 43, No. 3, Jun. 1996, pp. 997-1001. 6 pages.

* cited by examiner

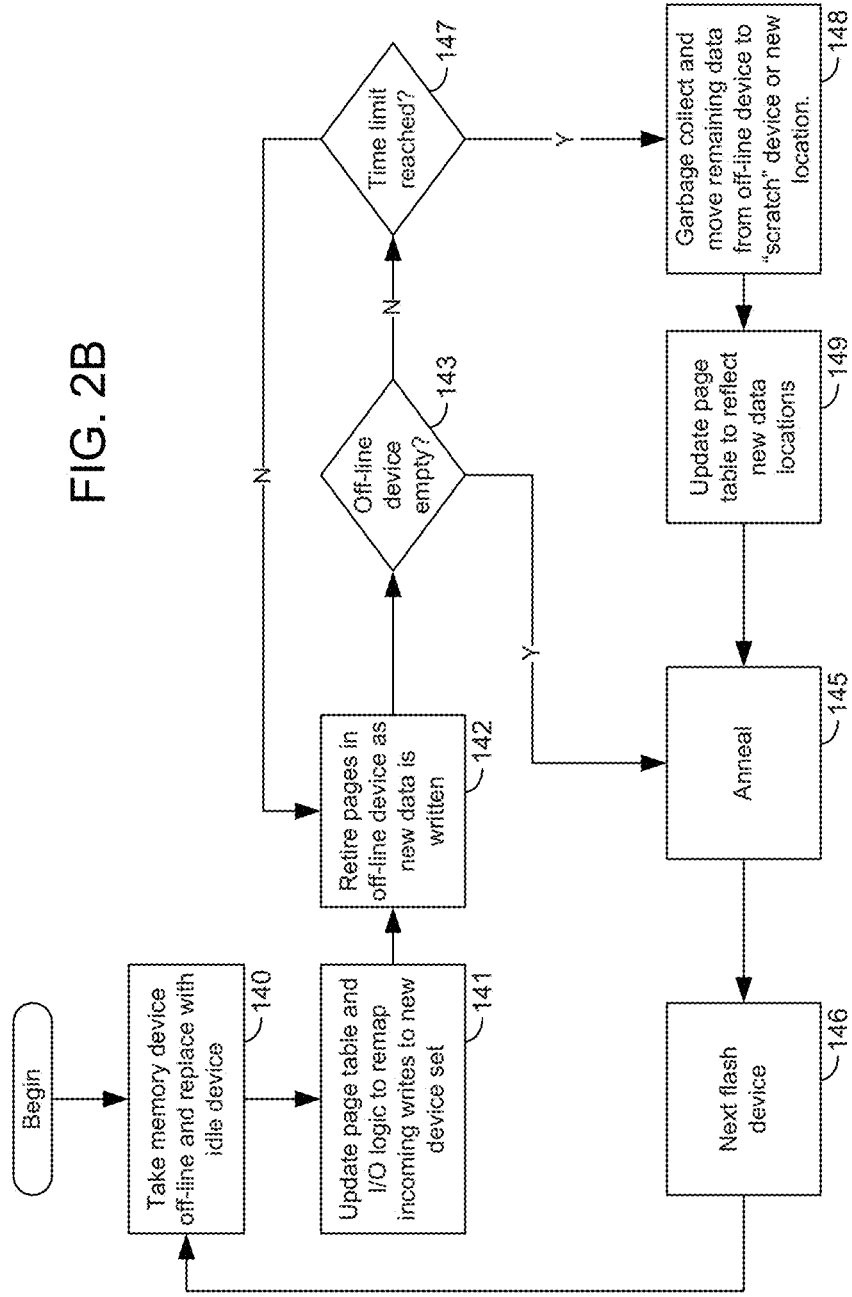

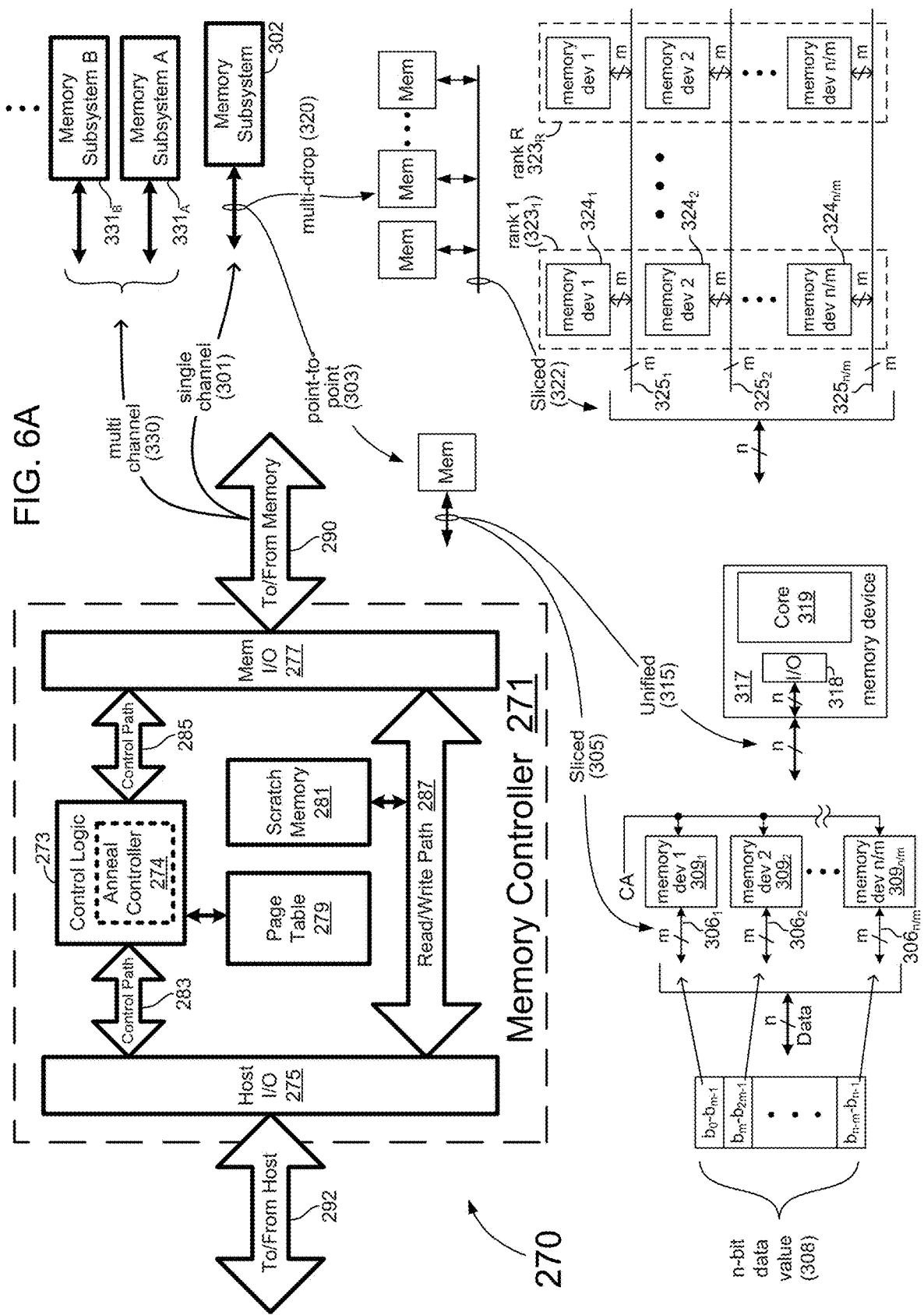

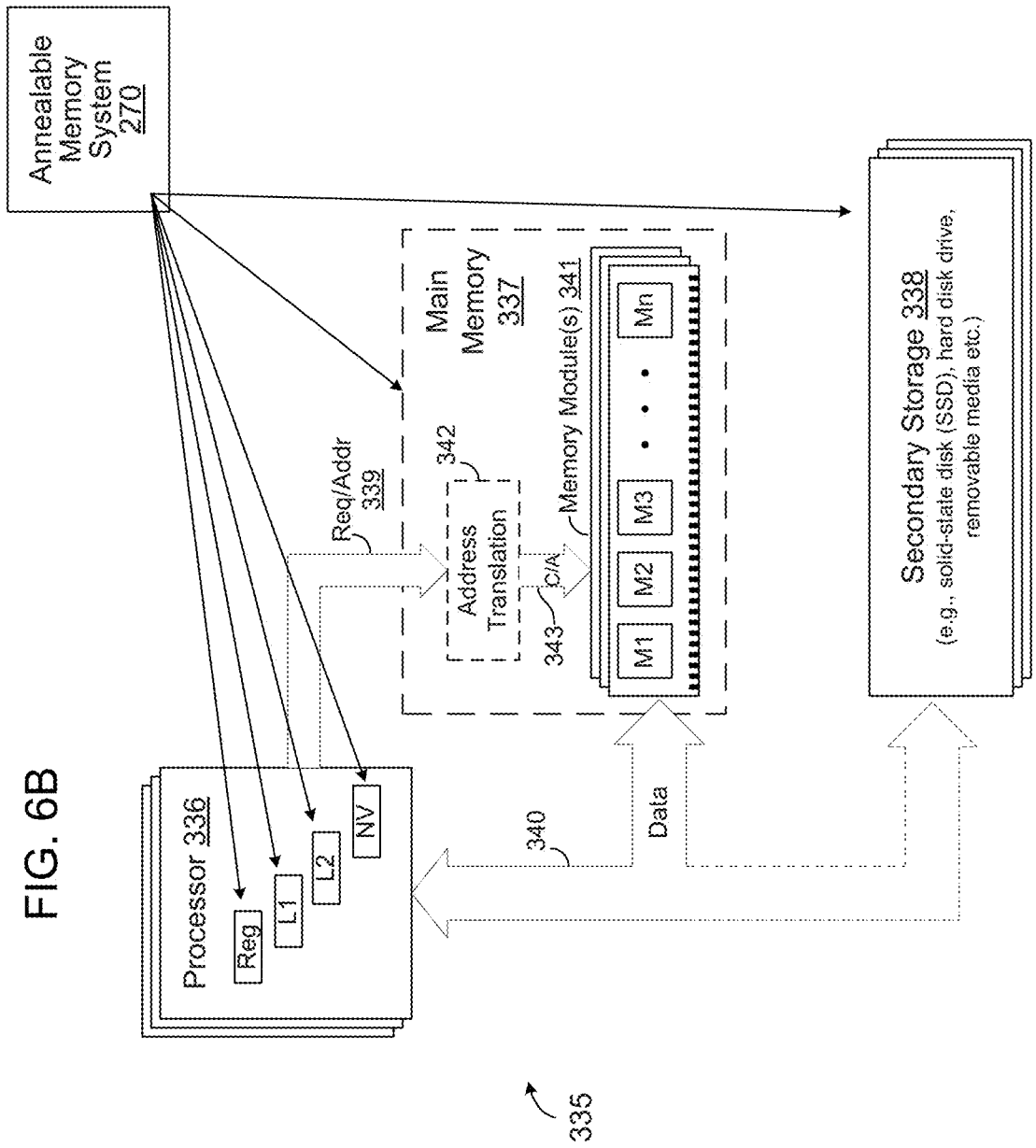

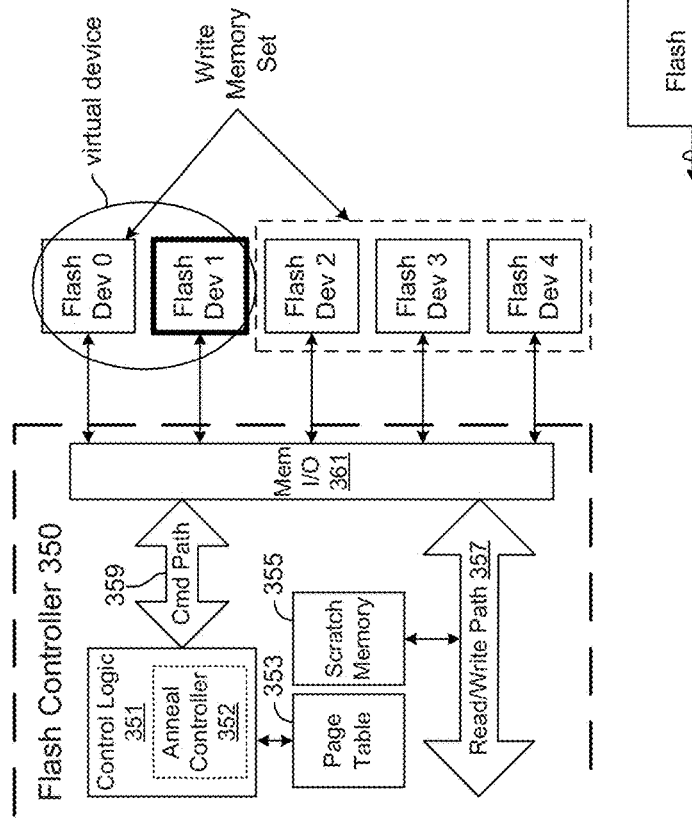
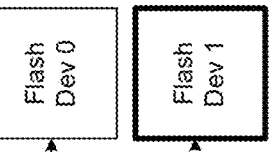
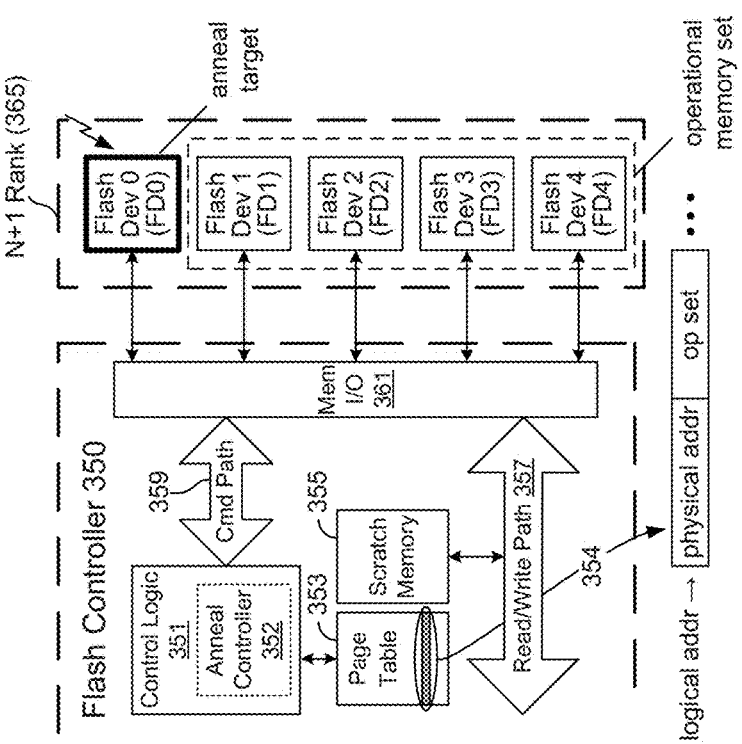

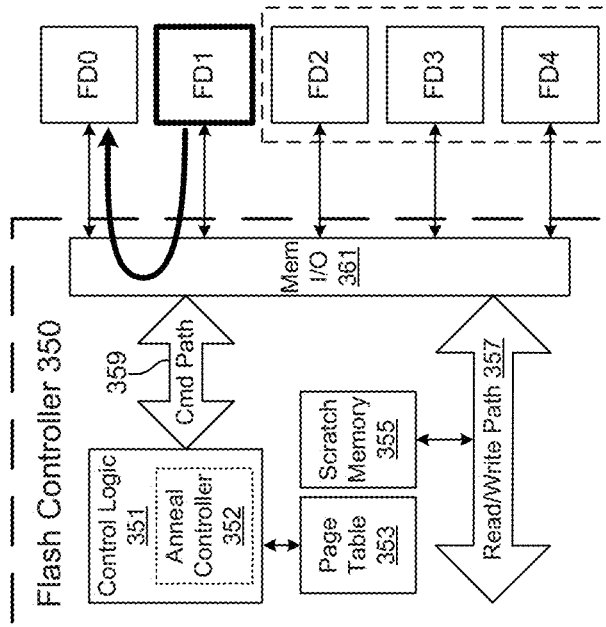

FIG. 9B

Active Evacuation: Single-Phase Transfer

Copy data from anneal target to alternate storage during active evacuation; updating PT to show new physical address (in alternate storage) and thereby invalidating corresponding entry in anneal target

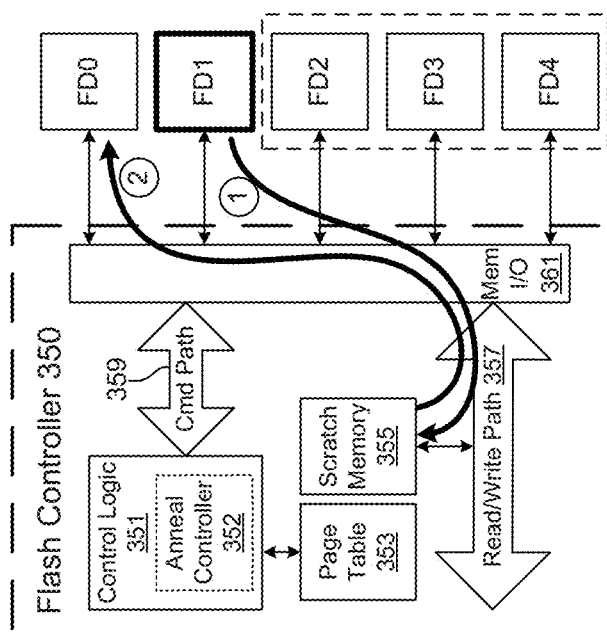

FIG. 9A

Active Evacuation: Two-Phase Transfer (1) Transfer from anneal target to scratch memory during passive or active evacuation (2) Transfer data from scratch memory to alternate storage during active evacuation; updating PT to show new physical address (in alternate storage) and thereby invalidating corresponding entry in anneal target

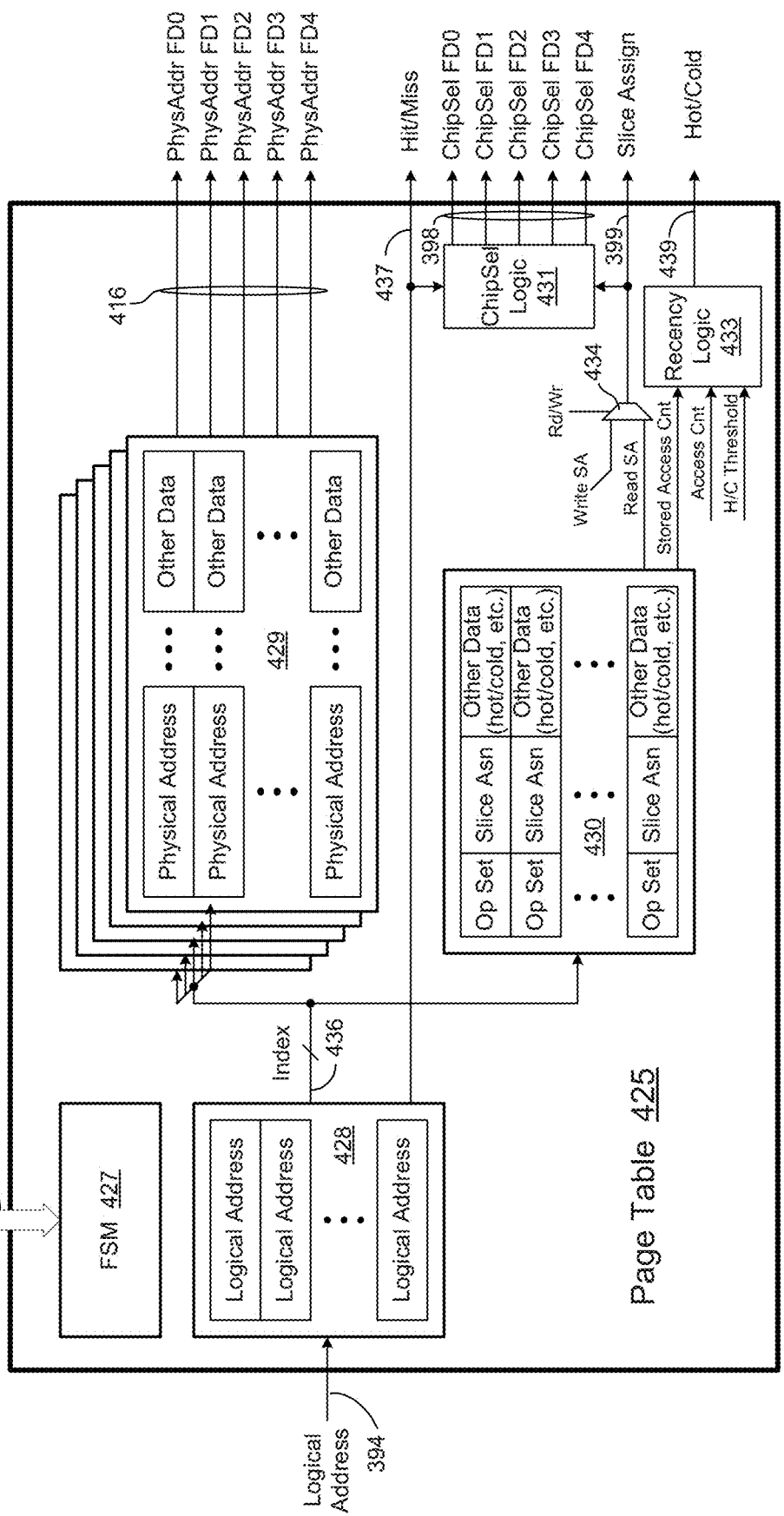

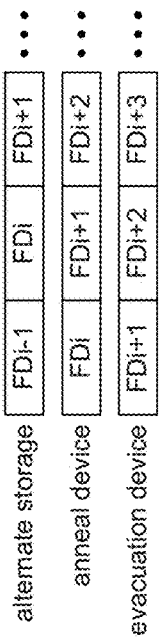
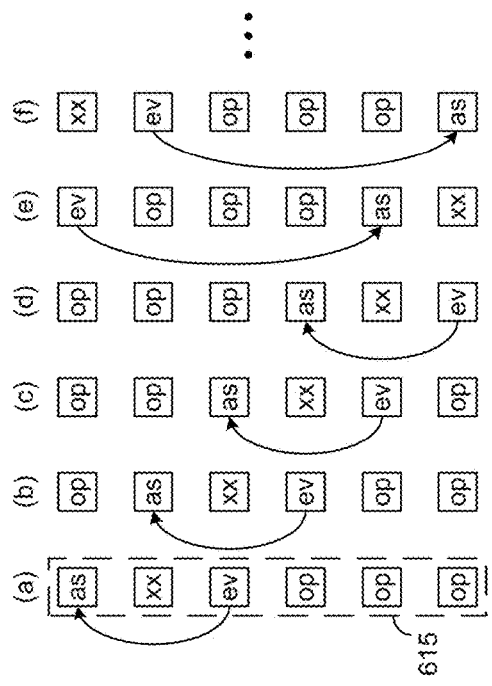
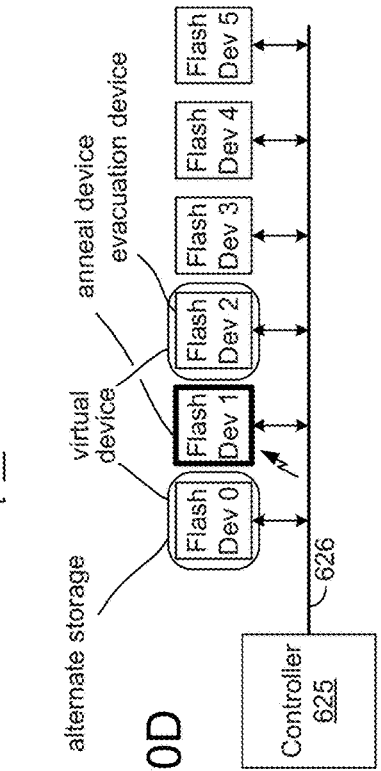
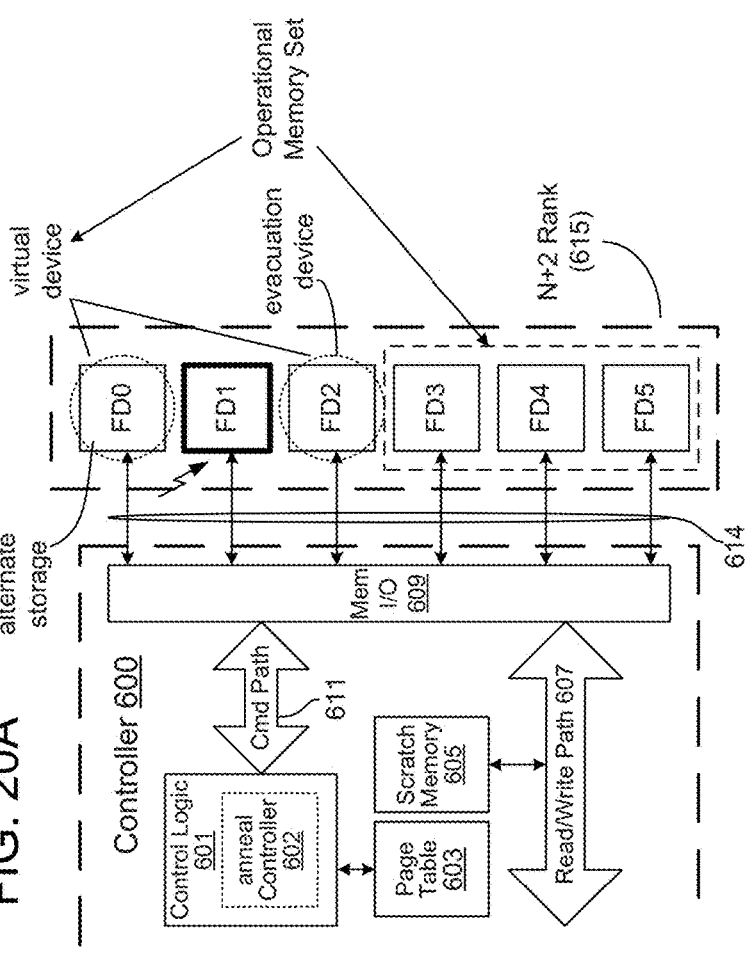
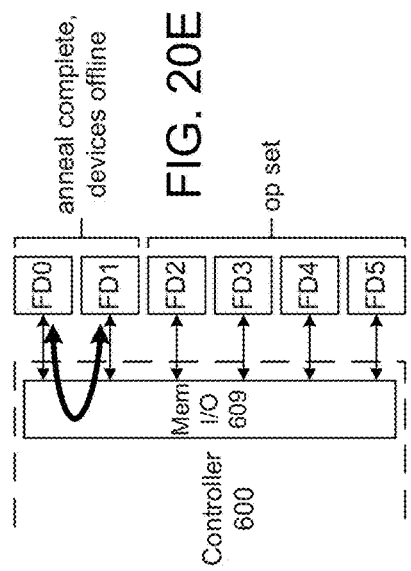

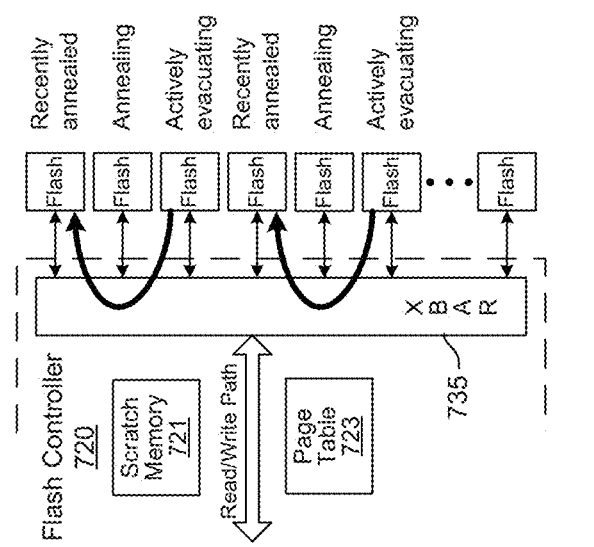
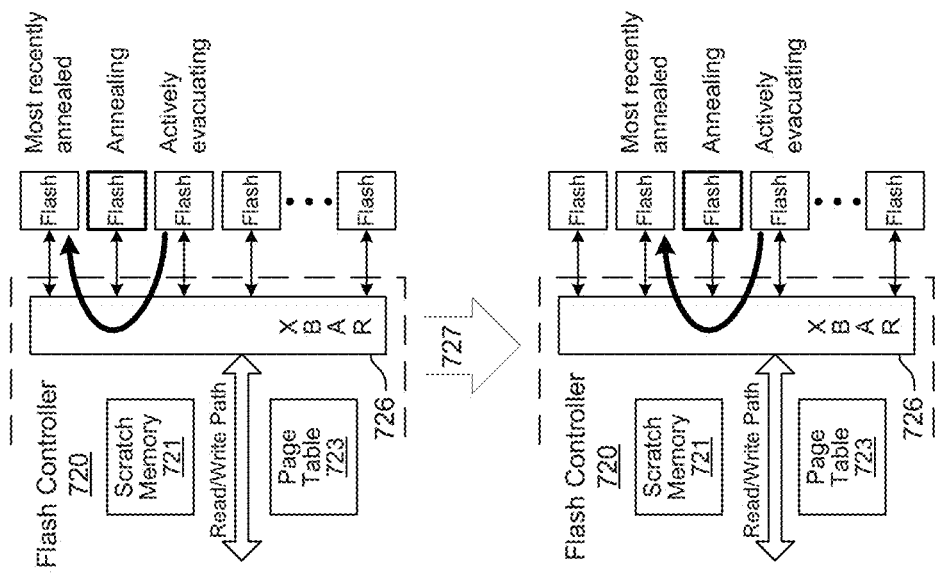
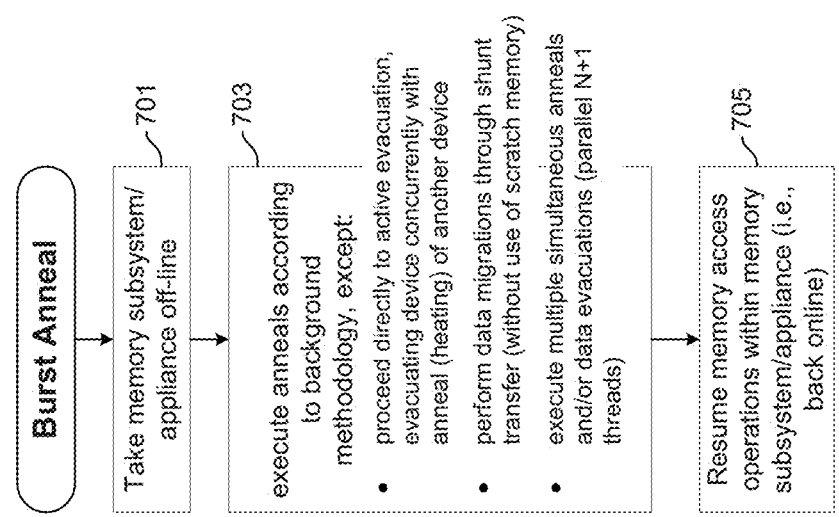

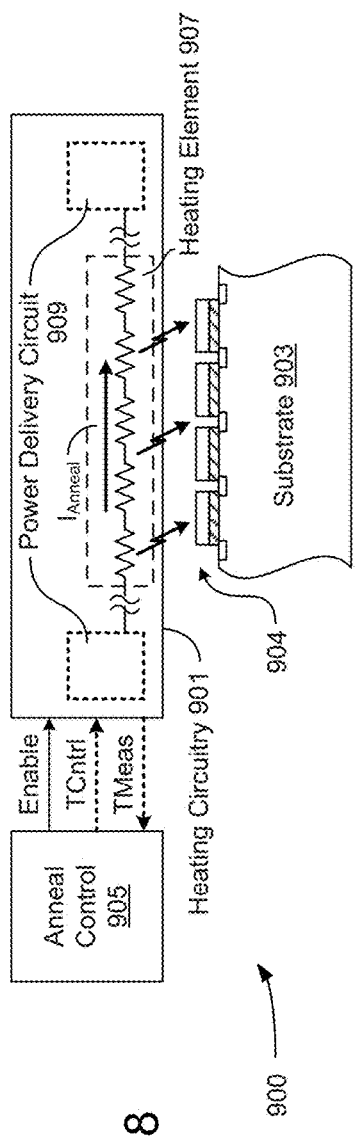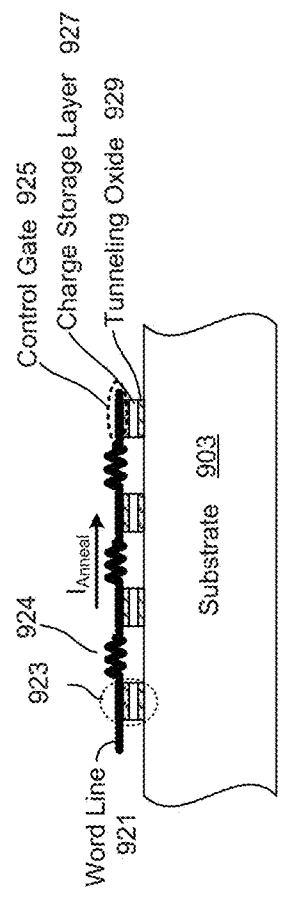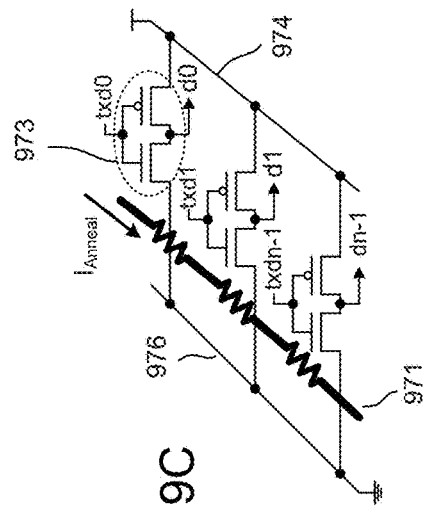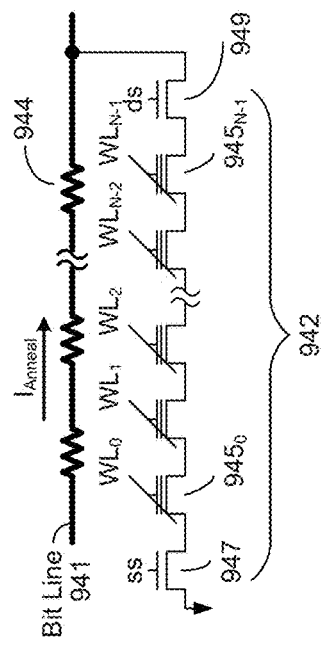
FIG. 28
FIG. 29A
FIG. 29B
FIG. 29C

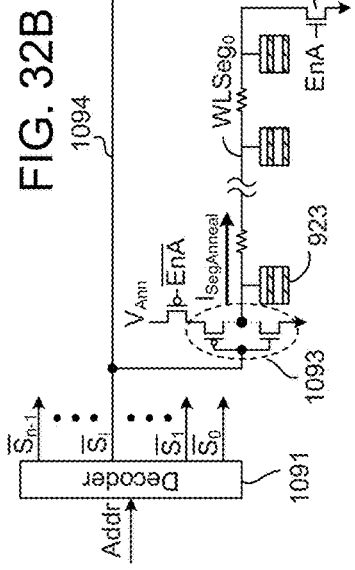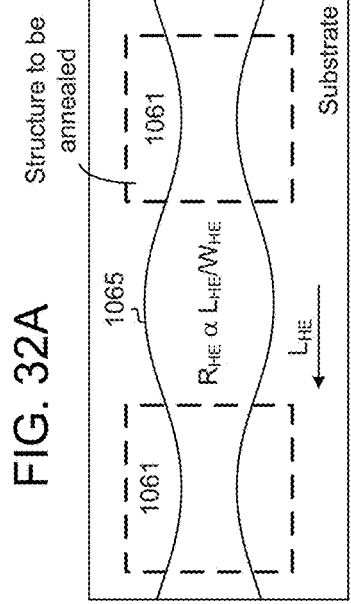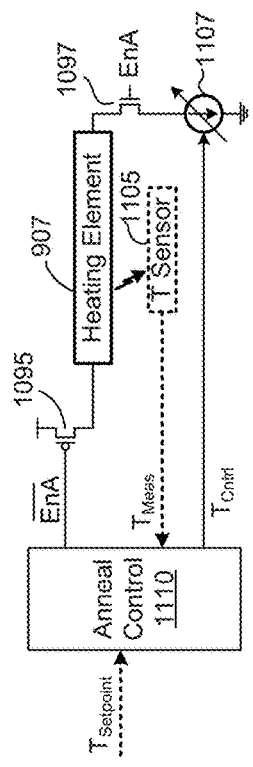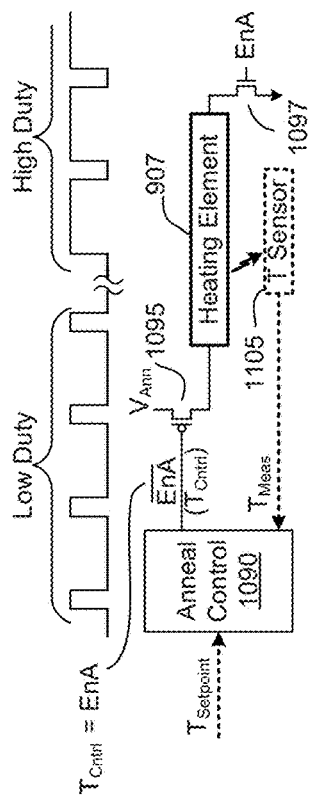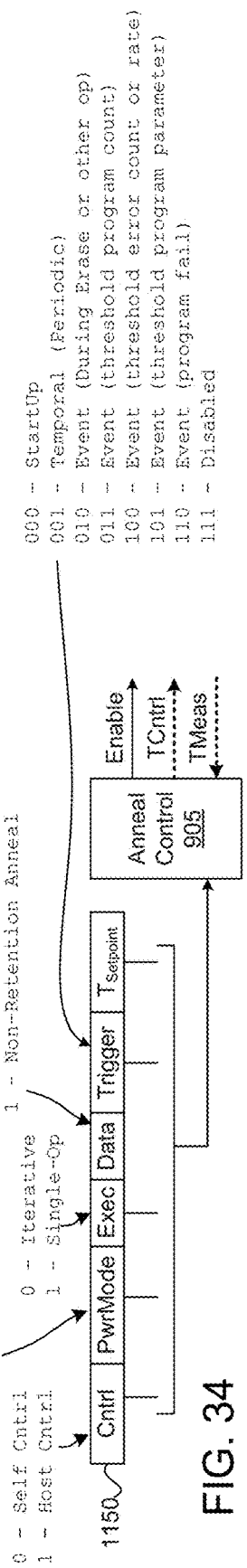

Floating Gate Anneal (Unidirectional)
*Current from WL Driver*

Floating Gate Anneal (Bidirectional)
*Current from WL Driver*
Far-Side Anneal Operation
(EN_ANNEAL_L = 0, EN_ANNEAL_R = 1)

_US 12,002,513 B2_

SELF-ANNEALING DATA STORAGE SYSTEM

CROSS REFERENCE TO RELATED APPLICATIONS

This application is a continuation of U.S. patent application Ser. No. 14/940,084, filed Nov. 15, 2015', (now U.S. Pat. No. 11,244,727), which is a continuation of U.S. patent application Ser. No. 14/097,503, filed Dec. 5, 2013 (now U.S. Pat. No. 9,202,572), which is a continuation of U.S. patent application Ser. No. 13/726,042, filed Dec. 22, 2012, which is a continuation of U.S. patent application Ser. No. 12/859,554, filed Aug. 19, 2010 (now U.S. Pat. No. 8,344,475), which claims priority to U.S. Provisional Application No. 61/235,964, filed Aug. 21, 2009, and is a continuation-in-part of U.S. patent application Ser. No. 12/516,499 filed May 27, 2009, and a continuation-in-part of U.S. patent application Ser. No. 12/676,594 filed Mar. 4, 2010 (now U.S. Pat. No. 8,193,573). U.S. patent application Ser. No. 12/516,499 claims priority under 35 U.S.C. §§ 365 and 371 to International Application No. PCT/US2007/085979 filed Nov. 29, 2007, which claims priority to U.S. Provisional Application No. 60/867,704 filed Nov. 29, 2006. U.S. patent application Ser. No. 12/676,594 claims priority under 35 U.S.C. §§ 365 and 371 to International Application No. PCT/US2008/075261 filed Sep. 4, 2008, which claims priority to U.S. Provisional Application No. 60/970,223 filed Sep. 5, 2007. Each of the aforementioned patent applications is hereby incorporated by reference.

TECHNICAL FIELD

The disclosure herein relates to data storage technology.

BACKGROUND

Program and erase operations produce cumulative defects in oxide insulators and charge-trapping layers of Flash and other floating-gate memories, limiting the useful life of such products and rendering them largely unsuitable for applications that require frequent, unlimited write operations.

It has been demonstrated that by heating floating-gate memory cells to temperatures above the normal operating range, but below a tolerable maximum, otherwise permanently-trapped carriers may be dislodged from oxides and charge-trapping layers, in effect, annealing the defects and improving longevity.

BRIEF DESCRIPTION OF THE DRAWINGS

The disclosure herein is illustrated by way of example, and not by way of limitation, in the figures of the accompanying drawings and in which like reference numerals refer to similar elements and in which:

FIG. 2B illustrates a specific instance of the generalized anneal sequence of FIG. 2A;

FIG. 6A illustrates a generalized embodiment of an anneal-enabling memory controller and the various annealable memory topologies it may support;

FIG. 6B illustrates a generalized data processing system in which the annealable memory system of FIG. 6A may be deployed FIG. 7A illustrates an example of a run-time annealable memory system formed by a flash coupled via respective point to point data links to a set of flash memory devices;

FIG. 7B illustrates the pairing of an anneal target and an alternate storage to form a virtual device within the context of the flash controller and flash memory subsystem of FIG. 7A;

FIGS. 7C and 7D illustrate detail with respect to new data writes, data updates and data reads within the flash controller and flash memory subsystem of FIGS. 7A and 7B;

FIGS. 9A and 9B illustrate exemplary data transfer operations that may be executed within the memory system of FIG. 7A to actively evacuate data from the anneal target to an alternate storage;

FIG. 11D illustrates an embodiment of a page table that may be used to support the device-specific command/address generation and sliced command/address architecture shown in the flash controller of FIG. 11C;

FIGS. 20A-20E illustrate anneal operations within a memory architecture that permits one spare device to be annealed simultaneously with data evacuation into an other spare device;

FIGS. 23A-23C illustrate a burst anneal sequence within a annealable memory subsystem or host appliance;

FIG. 28 illustrates a generalized embodiment of an on-chip (on-die) annealing circuit that may be used to reverse degeneration of oxides or other materials or structures disposed on or within a semiconductor or other type of substrate;

FIGS. 29A-29C illustrate examples of heating elements that may be employed within an integrated circuit device to support on-die annealing operations and that correspond to generalized heating element shown in FIG. 1;

FIGS. 32A and 32B illustrate exemplary approaches for achieving desired heating element resistance (or range of resistances) through control of physical characteristics or geometry of the heating element;

FIGS. 33A and 33B illustrate exemplary embodiments for controlling the amount of energy delivered to a heating element and thus controlling the annealing temperature;

FIG. 34 illustrates an embodiment of a mode register (or configuration circuit) optionally provided within an anneal-enabled integrated circuit and that may be programmed in response to host commands (or one-time programmed, for example, during device production) to provide flexible control over triggering and execution of anneal operations;

DETAILED DESCRIPTION

A system that performs in-situ annealing operations to extend the utility of use-degraded components is disclosed in various embodiments. In particular, a number of embodiments are presented in the context of an annealable memory subsystem formed by flash memory components ("flash memory" meaning any non-volatile memory that operates on a charge-trapping principle, including floating-gate cells and as well as more modern structures such as SONOS (silicon-oxide-nitride-oxide-silicon) and the like), though the circuitry and techniques disclosed may be more generally applied to increase the longevity or improve the operation of any component whose operation may be improved through an annealing operation or other maintenance operation.

As will become clear, a number of challenges are presented within an anealable memory subsystem which may or may not apply in alternative types of annealable devices, or even in future-developed annealable memory devices. For example, it is generally assumed in embodiments described below that a memory device undergoing an anneal operation (i.e., undergoing "an anneal") will lose some or all stored data, and will be unavailable for read and write access for an extended period of time. Accordingly, managing the migration (or evacuation) of data from a memory device to be annealed to an alternate storage is a characteristic of a number of embodiments described below. If these assumptions do not apply, as in annealing operations applied to improve performance of stateless circuitry (i.e., no data stored) or to memory components capable of reliably retaining data through the anneal, data migration may be omitted, thus changing the sequence of operations performed to carry out the anneal. Conversely, the data migration management techniques described herein are not limited to annealing applications and may be more generally applied to evacuate data from one or more memory devices within a memory system, thereby enabling "hot" removal of a memory device, quarantining of a defective (or suspect) memory device, execution of an operation (maintenance or otherwise) that may result in data loss within a memory device, execution of an operation that may render a memory device temporarily unavailable for read and/or write access, and so forth.

Overview of a Run-Time Annealable System

Figure 1:
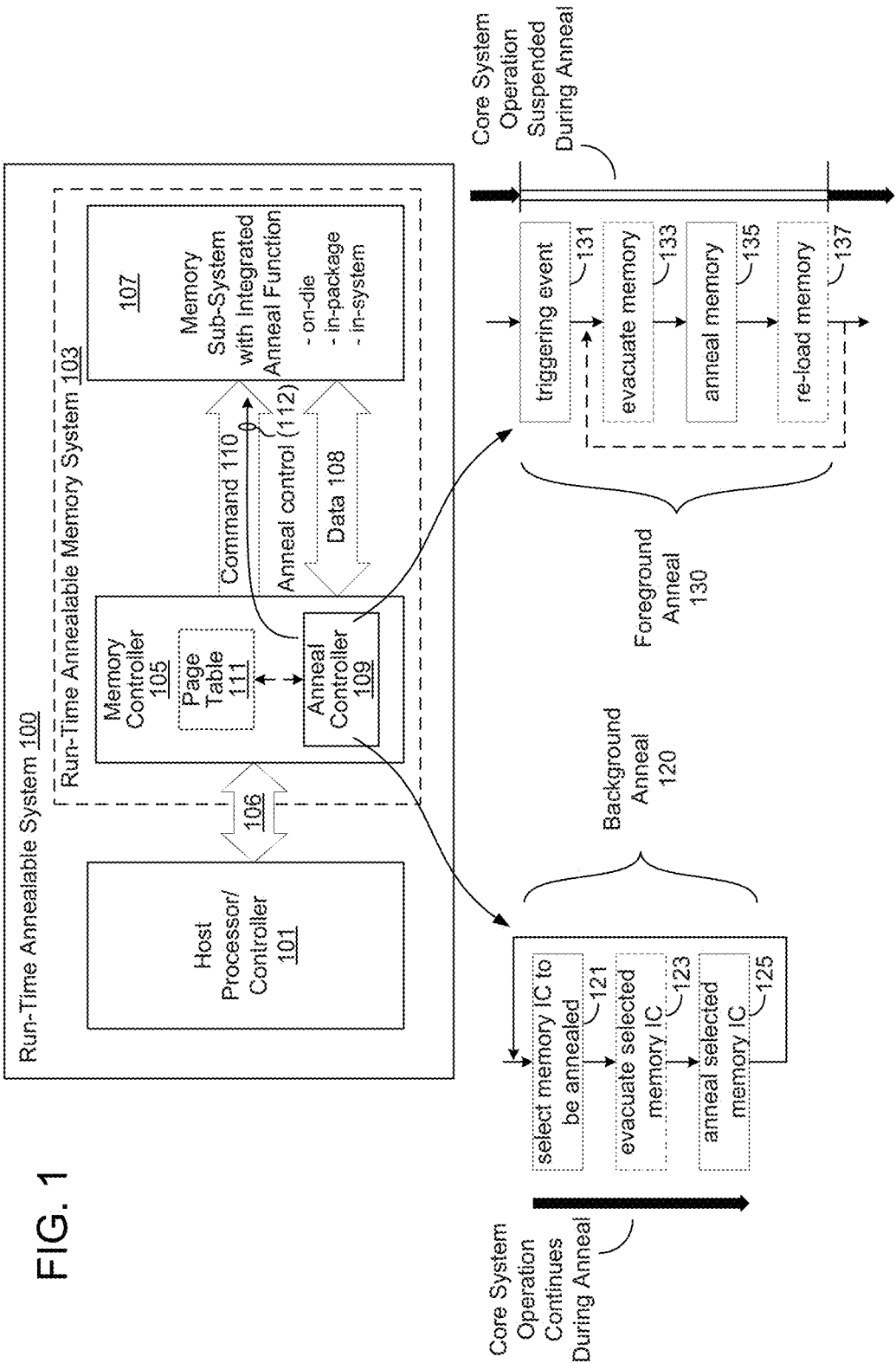
FIG. 1 illustrates an embodiment of an in-situ annealable system that includes a host processor or controller and an annealable memory system.

FIG. 1 illustrates an embodiment of a run-time annealable system 100 that includes a host processor or controller 101 and a run-time annealable memory system 103. The run-time annealable memory system 103 itself includes one or more memory controllers 105 and an anneal-capable memory subsystem 107. Focusing first on the anneal-capable memory subsystem 107, the anneal capability may be implemented by anneal circuitry integrated within an integrated-circuit memory die (on-die anneal circuitry), inside an integrated circuit package along with one or more integrated-circuit memory dice (in-package anneal circuitry), and/or formed separately from but disposed in proximity to an integrated-circuit memory die or package (in-system anneal circuitry). In general, the anneal circuitry includes three basic components any or all of which may be on-die, in-package or in-system: a heating element (or elements) that may be powered to heat an integrated circuit die to a desired annealing temperature or sequence of temperatures; power-control circuitry to deliver power to the heating elements in a manner that produces a desired annealing temperature and for selectively powering the heating elements on or off; and interface circuitry to receive commands that may be applied to the power-control circuitry to execute an anneal operation (power the heating elements on and to deliver power as necessary to reach a desired annealing temperature or sequence of annealing temperatures) and, if desirable, to terminate or interrupt an anneal operation. The duration of an anneal operation may be fixed in length (e.g., annealing temperature applied for a predetermined time in response to a command to execute an anneal operation), controlled by explicit start-anneal and stop-anneal commands, or programmed into a control register within the annealing circuitry. With regard to register programming, any aspect of an annealing operation susceptible of external control or selection (e.g., anneal temperature, duration, frequency, specification of triggering event, etc.) may be controlled by explicit commands or by programming settings within a register that forms part of the interface or power-control circuitry.

In the case of on-die implementation, dedicated on-die anneal circuitry may be provided and/or additional existing circuit components may be reapplied to support annealing operation. As an example, wordlines or bitlines may double as heating elements as described in PCT Publication WO2008/067494 (Publication of PCT Application No. PCT/US2007/085979).

With in-package implementation, one or more separately-controlled heating elements may be disposed adjacent each integrated-circuit memory die (of which there may be one or many) to enable sequenced (i.e., die-by-die) annealing within the package. Alternatively, an entire set or stack of in-package memory dice may be annealed simultaneously by a single heating element or collectively-powered group of heating elements. In either case, power-control and/or interface circuitry may be integrated with the heating elements or provided separately (e.g., disposed outside the package or provided by another integrated circuit and/or discrete components within the package).

Annealing circuitry implemented partly or entirely separately from the memory device (memory device meaning integrated-circuit memory die or package containing one or more memory die) may be, for example, disposed on a printed circuit board (e.g., a mother board, daughter board, line card, memory module, etc.) beneath the one or more memory devices that form the memory subsystem or in a structure disposed over or enveloping individual memory devices or groups of memory devices. As with in-package annealing circuitry, the power-control and/or interface circuitry may be integrated with the annealing circuitry or provided separately. For example, the power-control circuitry may be provided by the memory controller itself. More generally, regardless of whether implemented on-die, in-package or in-system, the anneal capability of the memory subsystem may be implemented by any practicable run-time controllable circuitry for heating an integrated-circuit memory die to a desired annealing temperature.

Within the run-time annealable memory system 103, memory controller 105 issues memory access commands, addresses and control signals to the memory subsystem 107 via command path 110, and corresponding read or write data is transferred between the memory controller and memory subsystem 107 via data path 108. Control signals such as device identifier (ID) signals or chip-select signals may be output by the memory controller to select all or a subset of the memory devices within the memory subsystem 107, and the controller may additionally output various maintenance commands (e.g., refresh, erase, etc.) and configuration commands to the memory subsystem to manage the devices therein.

Although the anneal-capable memory sub-system 107 may be implemented by any memory technology that exhibits anneal-reversible wear, embodiments described herein are generally assumed to contain flash memory devices (NOR or NAND) in which data is written, read and erased through program, read and erase operations, respectively. In contrast to other types of memory, data is not updated in place in such devices, but rather is rewritten to an alternate location while the originally programmed (and now stale) data is marked as invalid and ready for erasure. Accordingly, a page table 111 may be provided within the memory controller 105 (which may be a flash controller, host controller or other type of memory controller) to track the physical location of valid, empty and invalid "pages" of data and thus to hide the underlying complexity of data access operations from the host processor 101 or other access requester.

Despite the reference to flash memory in a number of embodiments presented below, the various data evacuation techniques described herein may be applied more generally in any memory system populated by virtually any type of memory technology in which it is desirable or beneficial to evacuate the data from one or more memory devices during system operation including, without limitation, any type of volatile or non-volatile random access memory (RAM) such as dynamic RAM (DRAM), static RAM (SRAM), zero-capacitor RAM (Z-RAM), twin-transistor RAM (TTRAM), Flash memory (including non-volatile memory technologies that implement a charge storage layer using polysilicon or other materials as in SONOS (silicon-oxide-nitride-oxide-silicon), SHINOS (silicon Hi-k nitride oxide silicon), etc.), ferroelectric RAM (FeRAM or FRAM), magnetoresistive RAM (MRAM), programmable metallization cells (PMC—also referred to as conductive-bridging RAM or CBRAM), phase-change memory (PCM—also referred to as PrAM, PCRAM, C-RAM, etc.), resistive RAM (RRAM), Racetrack memory, nano-RAM (NRAM) and so forth. Similarly, annealing operations described herein may be applied to any type of memory technology that exhibits degraded performance over time (e.g., in response to program/erase operations or other operational events performed therein) and in which performance may be improved through execution of an annealing operation. Also, implementations of the various embodiments presented herein are occasionally described in terms of instructional logic (i.e., processor or other execution engine executing instructions provided in a machine-readable media (i.e., software, firmware, etc.)) or dedicated hardware circuitry (e.g., logic circuits). In all cases, such embodiments may be implemented exclusively by instructional logic, exclusively by dedicated hardware, or by any combination of instructional logic and dedicated hardware.

As shown, memory controller 105 includes an anneal controller 109 that interacts with the page table 111 and selectively engages the anneal function of the memory subsystem 107. In the particular embodiment shown, the anneal controller 109 issues anneal commands or control signals 112 (e.g., start anneal, terminate anneal and any other commands that may be used to control the anneal operation (e.g., temperature specification, register programming, etc.)) via the same command path 110 used to convey memory commands (e.g., program commands, erase commands and read commands in a flash memory system). In alternative embodiments, a separate anneal-command path formed by one or more additional signal lines may be provided to convey anneal-related commands. Also, the anneal controller may be implemented entirely or partly separately in an alternative embodiment.

The host processor or controller 101 is responsible for the core (or primary) function of the run-time annealable system 100 and may be implemented by one or more special-purpose or general-purpose processors and/or application-specific integrated circuits (ASICs). As an example, the run-time annealable system 100 may form the processing foundation of a general-purpose computer system (e.g., a desktop workstation, or mobile computer), or a special purpose electronics device, such as a cell phone, global-positioning-system device (or similar handheld device), music or video player, set-top box, video display, network appliance or any other device that involves data processing. Further, the run-time annealable system 100 may itself be a component to be employed within a larger system (e.g., a solid-state disk (SSD), a graphics engine (as in a graphics card), a blade (e.g., line card, switching fabric or processor) within a back-plane-interconnected network switching or routing device. In all such embodiments, the host processor or controller 101 may be considered part of the larger system and thus distinct from the run-time annealable system itself. Moreover, the larger system may include any number of additional (and unshown) components for interacting with an operator (e.g., display, audio-related components, keyboard, keypad, pointer-control, etc.), enabling access to mass-storage and/or removable-storage, enabling network access, and so forth.

Foreground and Background Anneal

Still referring to FIG. 1, the sequence of anneal operations directed by the anneal controller 109 may be broadly classified as either background anneal or foreground anneal, depending on whether core system operation continues or is suspended while the anneal operations are carried out. In a generalized background anneal sequence (120) within the memory system of FIG. 1, individual memory ICs (i.e., integrated-circuit memory devices) or groups of memory ICs are selected (121), evacuated (123) and annealed (125), all without substantial interruption of the core system operation (i.e., the user-demanded operation of the system continues to execute or be available for execution throughout the background anneal sequence). By contrast, in a generalized foreground anneal (130), core system operation is suspended when a triggering event (i.e., triggering an anneal operation) is detected (131) and remains suspended while memory IC(s) are evacuated (133), annealed (135) and reloaded. In general, background anneal operations are carried out sequentially, with one memory IC (or one group of memory ICs) after another being selected, evacuated and annealed, while foreground anneal operations may be carried out in parallel, evacuating and annealing the entire memory subsystem as a unit. There are exceptions to these general implementations, however. For example, where core system operation may continue without the annealable memory subsystem (i.e., all data from memory subsystem is available from an alternative or redundant source such as a cache memory or backup memory or otherwise not needed), the entire memory subsystem may be evacuated and annealed at once (in the background), an operation referred to herein as a parallel anneal. Conversely, memory ICs or groups of memory ICs within the memory subsystem may be annealed in sequence in a foreground anneal, particularly where the available backup storage for the annealable memory subsystem is insufficient to back-up the entire contents of the memory subsystem. Further, memory evacuation, transferring data from the anneal target (the memory device to be annealed) to an alternate storage, may be omitted in either the background or foreground anneal if the content of the anneal target is naturally backed up as part of system operation (e.g., content of anneal target copied to cache memory or recoverable/producible from other storage devices as in a RAID (redundant array of inexpensive disks) system).

Background Anneal

Figure 2A:
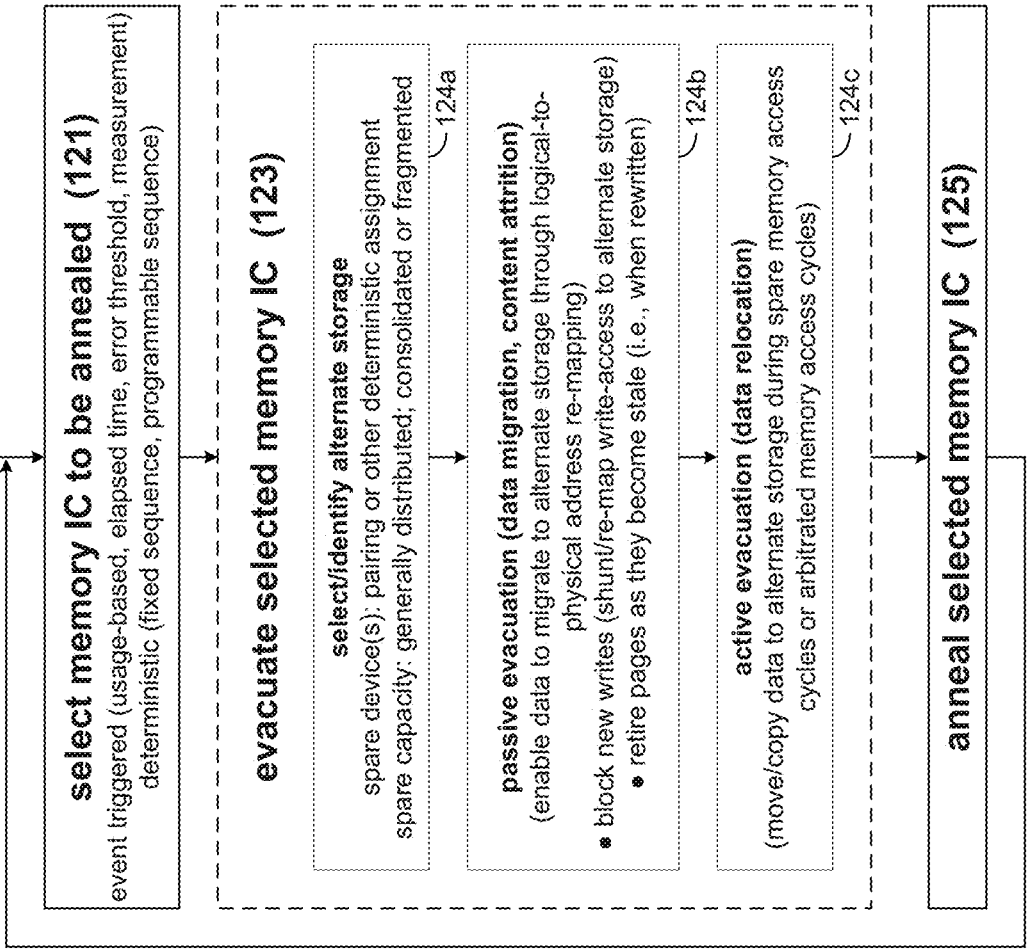
FIG. 2A illustrates the background anneal sequence of FIG. 1 in greater detail.

FIG. 2A illustrates the background anneal sequence 120 of FIG. 1 in greater detail. In the embodiment shown, individual memory devices or groups of memory devices are sequentially annealed starting with selection of the anneal target (the memory IC to be annealed) in block 121, optional evacuation of the selected memory IC in block 123, and finally the anneal operation itself in block 125.

Target Selection

Selection of an individual memory device or group of memory devices to be annealed is referred to herein as selecting the anneal target. Anneal target selection may proceed in a fixed order, for example, stepping through each of the memory devices in the memory subsystem in a predetermined sequence, or may be programmed or even determined dynamically.

A programmable selection sequence may be helpful, for example, where the memory subsystem is logically partitioned into storage regions having different classes of usage (e.g., infrequently-written long-term data storage vs. frequently-written short-term storage). In that case, memory devices allocated to usage classes that involve relatively infrequent writes (e.g., long-term non-volatile data storage) may be annealed less frequently or omitted from the anneal sequence altogether, thereby enabling a higher anneal frequency for the remaining devices in higher usage classes. Similarly, devices allocated to intermediate-use classes may be selected for less frequent annealing than those in higher-use classes. In one implementation, for example, a programmable register is provided within the anneal controller (i.e., element 109 of FIG. 1) and/or individual memory devices to permit definition of logical partitions and specification of a relative or absolute anneal frequency for each storage region. A relative anneal frequency may be specified, for example, by indicating an anneal priority (e.g., maximum, intermediate, low, disabled (no anneal)), or the total number of anneal cycles that are to be completed within the memory subsystem between each anneal directed to the subject storage region (a lower number indicating a more frequent anneal choice). An absolute anneal may be specified, for example, by programming a time interval and/or number of program/erase operations that are to elapse between anneal operations directed to the storage region.

Another circumstance in which programmable selection or anneal frequency may be helpful is where the memory subsystem is populated by memory devices having different wear profiles (i.e., some devices wearing out faster than others for the same usage level). In those cases, the anneal frequency may be specified directly (e.g., anneal once every N program/erase cycles) or indirectly (device type which may be looked up in a basic-input-output-service (BIOS) or other control program to determine appropriate anneal frequency) by information associated with each memory device and used to program the anneal sequence or frequency within the memory controller. For example, information indicating the anneal frequency as a function of elapsed time, program/erase cycles and/or error threshold detection (e.g., detecting threshold number of bad blocks, threshold bit-error rate, threshold number of program/erase failures etc. and/or other error threshold) may be recorded within each memory device or recorded within an associated storage (e.g., as in a serial-presence-detect memory in a memory module) and thus may be read by the memory controller during system startup and used by the memory controller or host processor to program an anneal schedule (or anneal sequence) for each memory device.

A dynamically determined anneal sequence may be helpful in applications where memory usage patterns vary substantially from device to device, but are difficult to predict or control. In those cases, memory devices may be selected dynamically, for example, selecting each device to be annealed in an order and/or time dictated by level of use (e.g., number of program/erase operations directed to the device). As in the programmable embodiment discussed above, the usage metric may be an absolute count of the number of wear-inducing operations or may account for wear characteristics of the memory device. For example, one thousand program/erase cycles in a memory device for which anneal-per two-thousand program/erase cycles is specified (or determined) may be prioritized over fifty thousand program/erase cycles a memory device bearing an anneal-per-hundred thousand program/erase limit.

Just as the device selection order may be fixed, programmable or dynamically determined, the event used to trigger or initiate the anneal operation within each selected IC (i.e., proceeding with evacuation, if necessary, and anneal) may similarly be predetermined, programmed or dynamically determined. Predetermined triggering includes, for example, initiating the anneal sequence for each selected device at regularly scheduled time intervals, initiating the anneal sequence continuously from device to device (e.g., proceeding without delay from the conclusion of an anneal operation for one memory device to the start of an anneal operation in the next memory device) or initiating the anneal sequence within a given device in response to detecting that one or more programmed thresholds (elapsed time, usage (e.g., program erase cycles), error rate or quantity (e.g., bit error rate, programming error rate, bad block quantity, etc.)) have been exceeded. Periodic or occasional (or user/software-triggered) calibration/measurements may also be carried out to ascertain the need for maintenance (e.g., measuring data retention, number of program cycles or time required to program, or any other physical property(ies) of a device that may be used as empirical evidence of the need for anneal or other maintenance). The measured values or test results may be, for example, compared against absolute, dynamic or programmed benchmarks to determine whether an anneal or other maintenance operation is needed. Also, such measurement operations may be carried out by circuitry within the memory device under test (e.g., of the device's own volition or in response to measurement/calibration/test commands from a control device), by circuitry outside the memory device, or by a combination of circuitry and/or instructional logic within and outside the memory device.

As examples of calibration/measurement that can occur, a controller (e.g., implemented by dedicated circuitry, a software-controlled processor or any combination of dedicated circuitry and instruction-controlled logic) can periodically or at specific user instigation test a memory device to benchmark performance or changes in performance; for example, the number of program-verify ("PV") cycles for a memory device (e.g., average, maximum, minimum, or other measures) required for a successful write (program) operation or erase operation may be compared against one or more thresholds as indicating remaining life or excessive wear. Any statistical derivation related to calibration/measurement data may also be used—as non-limiting examples, changes to average PV cycle requirements for a successful write or erase (e.g., for a page or block, or for randomly sampled cells in a memory device) may be used, either alone or with other measures (e.g., changes in standard deviation of PV cycles required for successful write or erase operations). Time required for successful write or erase operations may be measured using units other than PV cycles (e.g., using elapsed time). Many other benchmarks may also be used.

Programmable trigger selection may include register-based selection (e.g., by a host processor executing BIOS or other program code) of the types of events (elapsed time, program/erase count, error detection, calibration/measurement etc.) and/or corresponding threshold levels that are to trigger anneal operations. Anneal operations may be triggered dynamically, for example, in response to detection of a threshold number or frequency of errors in retrieved data, failure to successfully execute program and/or erase operations, bad storage blocks, failure of measured/tested values to meet benchmarks, etc.

Evacuating the Anneal Target

After triggering an anneal operation, contents of the anneal target that are to be retained for later use by the host system and not already present in or reproducible from an alternative source are copied (i.e., backed-up) to an alternative storage, an operation referred to herein as evacuating the anneal target. Referring to block 123 of FIG. 2A, prior to actual data evacuation, an alternate storage device is selected or identified at 124a to establish a destination (repository) for evacuated data. The alternate storage may be one or more other memory devices within the annealable memory subsystem or may be a separate storage such as a scratch memory (i.e., a memory buffer provided for temporary data storage) within the memory controller, or an entirely separate storage within or external to the host system. Also, the alternate storage may be predetermined or selected dynamically. As an example, in a number of embodiments described below, the alternate storage is the most recently annealed memory device (and therefore blank (empty) or presumed to be blank) within the anneal-capable (annealable) memory subsystem. Thus, upon triggering an anneal operation, the anneal target is evacuated via data transfer to the most recently annealed memory device (the prior anneal target) and then, after being annealed, itself becomes the alternate storage for the next anneal target. In a dynamic selection of the alternate storage, other memory devices within the annealable memory subsystem or storage devices elsewhere in the host system may be evaluated with respect to the capacity required to support evacuation of the annealed device, and one or more of the memory devices or other storage devices selected to form the alternate storage. Examples of these embodiments are discussed in greater detail below.

Passive and Active Data Evacuation

Data evacuation operations themselves may be categorized as passive or active depending on whether data is evacuated as part of natural traffic patterns (passive evacuation) and thus without requiring memory access operations merely to relocate the data, or through dedicated retrieval and relocation operations (active evacuation). In a number of embodiments discussed below, evacuation of data from the anneal target becomes progressively more aggressive as the need for anneal becomes more urgent, proceeding from a period of no data evacuation, to passive evacuation to active evacuation. Within the active evacuation phase itself, data evacuation operations may initially be carried out in deference to host requested accesses (e.g., opportunistically performing evacuation operations when no host request is pending), followed by escalation to more aggressive competition with host requests for access to the memory subsystem. Further, with regard to the actively evacuated data, operations may progress from less recently accessed pages to more recently accessed pages, thus actively evacuating the pages deemed less statistically likely to be evacuated as part of natural traffic patterns first. Each of the different types of evacuation operations and various progressions between them are discussed in greater detail below.

Passive Evacuation Operations

As shown at 124*b*, passive evacuation operations are memory access operation (generally requested by a host device) that enable data to migrate to alternate storage through logical-to-physical address re-mapping. Passive evacuation is generally effected through manipulation of page table entries and involves blocking write operations within the anneal target and re-directing those operations to the alternate storage instead, and retiring pages within the anneal target when they become stale. For example, in the case of a write operation seeking to update previously written data (i.e., an update operation), the updated page (i.e., page of write data that is to replace a valid existing page within the anneal target) is written to or programmed within the alternate storage instead of the anneal target and the page table updated to invalidate the stale data page within the anneal target and to reflect the newly written page within the alternate storage. New writes are re-directed from the anneal target to the alternate storage in generally the same manner (writing the new data to the alternate storage), except that no page invalidation occurs with respect to the anneal target. Thus, while blocking new writes within the anneal target generally involves data re-direction or bypass, the blocking operation prevents loading of data within the anneal target and thus may be viewed as part of passive evacuation.

As shown at 124*c*, active evacuation operations involve host-independent (i.e., self-directed by the memory controller) data retrieval and re-write operations; removing (relocating) data from the anneal target to alternate storage.

Active evacuation operations may be further characterized as deferential or competitive according to whether such operations defer to or compete with host-requested accesses to the annealable memory subsystem. In general, if the need for anneal is not urgent (i.e., deadline for executing an anneal is not imminent), active evacuation may be carried out during idle (spare) memory access cycles or, if resources permit, in parallel with host-requested accesses. By contrast, if the need for anneal is more urgent (e.g., number of program/erase cycles is approaching critical threshold, error rate rising to critical level, etc.), the anneal controller may undertake competitive evacuation, arbitrating with host-initiated memory access requests for available memory access cycles. Thus, in some case, the anneal controller may insert anneal-related data read and write operations ahead of host-requested memory accesses to ensure that the anneal target is evacuated prior to data loss or other device failure. In general, even in the competitive evacuation scenario, the anneal controller will defer to host-requested accesses at least to the extent needed to ensure that core system operation may proceed, although at potentially lower performance for brief intervals.

Anneal Event

Still referring to FIG. 2A, after determining that all the entries within the anneal target have been invalidated (i.e., passively rendered stale due to update in alternate storage or actively re-located to alternate storage), the anneal controller may initiate the actual anneal operation (restorative heating) operation with the anneal target as shown at 125. The anneal operation may be triggered immediately upon confirming evacuation, or the anneal controller may await a scheduled time or occurrence of a predetermined event before initiating the anneal operation.

FIG. 2B illustrates a specific instance of the generalized anneal sequence of FIG. 2A. Starting at 140, one of the memory devices within a memory subsystem is taken "off-line" (i.e., removed from the set of memory devices accessed in response to host read/write request) and replaced by an idle (formerly off-line) device. At 141, page table and I/O logic within the memory controller are updated to re-map incoming writes to the new device set (i.e., including the formerly off-line device and excluding the currently off-line device). Pages within the off-line device (the anneal target) are retired as new data is written (142). If the off-line device is determined to be empty at decision block 143, then an anneal (i.e., heating) operation is performed as shown at 145 to complete the sequence of anneal events. Thereafter, at 146, another flash device is selected to be the anneal target (the next "off-line" device) and the anneal event sequence is repeated starting at 140.

Returning to decision block 143, if the off-line device is not empty, and a time limit or other threshold has been reached as determined at 147 (e.g., elapsed time, calendar time, error rate, error count, number of program-erase cycles, etc., has reached a predetermined value), then at 148 "garbage collection" is carried out to move the remaining data from the off-line device to a "scratch" device (e.g., scratch memory or alternate storage). After or as part of the garbage collection/data movement at 148, the page table is updated to reflect the new data locations as shown at 149. With the off-line device fully evacuated, anneal is commenced at 145, followed by selection of a new anneal target at 146 and a repetition of the anneal sequence starting at 140.

Background Anneal Cycle

Figure 3:
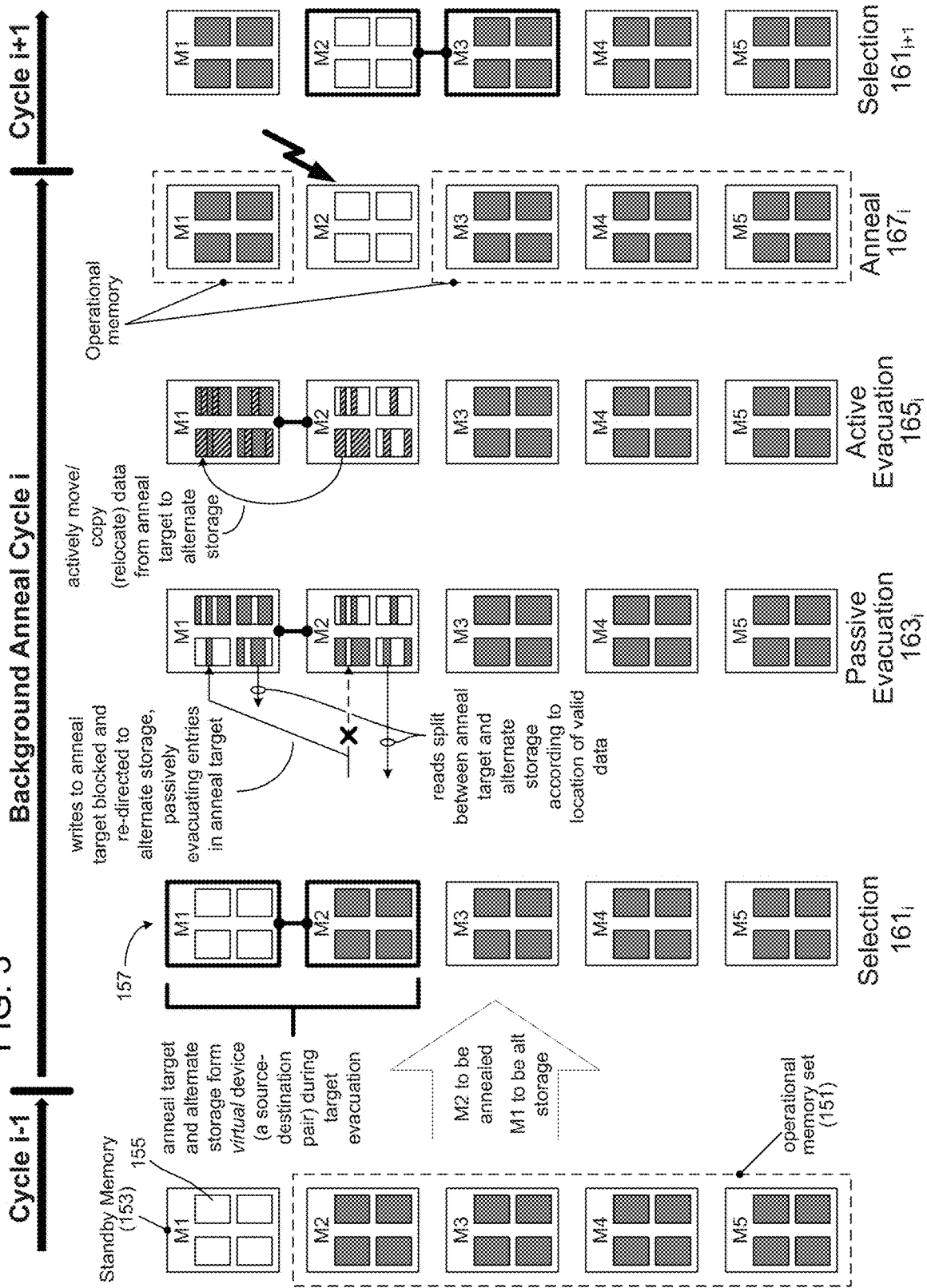
FIG. 3 illustrates an exemplary background anneal cycle in which active selection, passive evacuation, active evacuation and anneal phases are carried out in sequence for each memory device within a memory subsystem having five independently annealable memory devices.

FIG. 3 illustrates an exemplary background anneal cycle in which selection, passive evacuation, active evacuation and anneal phases are carried out in sequence for each memory device within a memory subsystem having five independently annealable memory devices. In addition to embodiments in which selection, passive evacuation, active evacuation and anneal phases are carried out in a sequence for memory devices in a subsystem, it is also possible, using the principles presented herein, to trigger these operations in response to a specifically-detected need, e.g., perceived remaining lifetime for any particular device.

In the embodiment shown, the five memory devices, M1-M5, form a "rank" of memory devices (anneal operations within other memory topologies such as multi-drop and multi-channel topologies, are discussed below). More specifically, a dynamically selected subset of four of the memory devices, referred to herein as the operational memory set (or operational set or device set) are accessed in parallel as a unit, each contributing a one-fourth share of each returned read data value and each storing a one-fourth share of each write data value. The remaining device, referred to as the standby memory (or spare memory), does not participate in memory read and write operations until an anneal target is selected from the operational memory and data evacuation is begun. At the conclusion of background anneal cycle i−1, for example, memory device M1 constitutes the standby memory (153) and memory devices M2-M5 constitute the operational memory set 151. In the particular example shown, each memory device is assumed to have multiple storage banks 155 shaded to show valid content and un-shaded to designate blank or empty status.

Background anneal cycle 'i' begins with selection phase $161_i$. At this point, M2 is selected as the new anneal target and standby memory M1 is selected as the alternate storage. As shown, the alternate storage is paired with the anneal target to form a virtual device (or virtual device pair) for purposes of data storage and retrieval during the upcoming evacuation phases. More specifically, during the passive evacuation phase $163_i$, incoming read requests that map to valid data (marked by shaded storage arrays) within the anneal target continue to be read from the anneal target while write operations (new writes and updates) are re-directed to the alternate storage. As the alternate storage becomes populated (i.e., with entries re-directed away from the anneal target as shown by the shaded portions of the alternate storage (M1) that correspond to invalidated (and thus unshaded) counterpart portions of the anneal target (M2)), read requests are split between the alternate storage and the anneal target according to the location of the valid entry. Thus, from the perspective of the memory controller, the alternate storage and anneal target (M1 and M2) constitute a single virtual device that is responsible for the one-fourth share of a data value (the other three-fourths being provided by M3-M5) that would otherwise be provided by a single device. Accordingly, host-requested memory accesses are carried out without interference (seamlessly) even as the anneal target is evacuated.

Still referring to FIG. 3, passive evacuation (163) continues with entries being invalidated ("staled-out") within the anneal target as part of the normal sequence of write operations and update operations requested by the host system. At some point, as the need for anneal becomes more critical (e.g., reaching a threshold that indicates more urgent need for anneal), the anneal controller transitions (escalates) to the active evacuation phase (165) and begins actively evacuating the anneal target. During the active evacuation phase, the anneal controller (leveraging command and I/O circuitry within the memory controller) issues commands, separate from those requested by the host controller/processor, to retrieve remaining data from the anneal target and write that data to the alternate storage. These "relocation" operations are indicated by the hashed regions within the storage arrays of M2 and M1. As discussed below, the data transfer (or relocation) may take place in a unified read/write operation (i.e., read-from-target/write-to-alternate), or in component operations, first copying the data from the anneal target to a scratch memory within the memory controller (or another temporary storage source) and then later writing to the alternate storage. Also, as mentioned, the active relocation operations may progress from less recently used (colder) pages to more recently used (hotter) pages. This progression is discussed in greater detail below.

Reflecting on the data evacuation phases $163_i$ and $165_i$, it can be seen that, in order to split read operations between memory devices M1 and M2 of the virtual device, the memory controller includes either M1 or M2 in the operational memory set. Further, in one embodiment, the memory controller may exclude all memory devices but the virtual device (M1 and M2) from the relocation transactions (M2 to M1) in the active evacuation phase. Moreover, as the system will, in a general embodiment, select each of the memory devices M1-M5 in turn to be the anneal target, any of the memory devices may need to be included in an exclusive transaction directed to a virtual device, or excluded from a split read. Accordingly, in all such cases, the memory controller dynamically determines which subset of memory devices are to be accessed in a given transaction based on the nature of the operation performed, the location of the data to be accessed and the operational memory set in place. In one embodiment, this ability to dynamically select different memory devices or subsets of memory devices within the same rank (i.e., group of memory devices otherwise accessed as a unit) is achieved through provision of separate chip-select lines from the memory controller to each memory device of the rank, thus enabling the memory controller to include only the desired subset of memory devices (which may be a single device) in any split-read, re-directed write or relocation transaction. As will be discussed in greater detail below, the memory controller may additionally include circuitry to dynamically switch the data lanes coupled to the operational memory set so as to preserve the order of significance of the individual portions of the overall data word written to or read from the operational memory set.

Still referring to FIG. 3, when the anneal controller determines that no valid data remains in the anneal target (i.e., the anneal target is fully evacuated or empty), the alternate storage (M1) and other still-populated memory devices (M3-M5) form the new operational memory set and an anneal operation may be carried out within the anneal target (M2) in anneal phase $167_i$. After annealing the anneal target, the background anneal cycle is complete and the now-empty and annealed memory device (M2) constitutes the new standby memory and may be employed as the alternate storage in the next background anneal cycle, starting with the selection phase $161_{i+1}$. As discussed above (and shown in FIG. 3), the next background anneal cycle (in which M3 is selected as the anneal target and M2 the alternate storage) may be triggered immediately upon completion of the preceding background anneal cycle, on a predetermined or programmed schedule, or in response to pre-selected events (e.g., threshold usage, threshold error rate or number of errors, etc.).

Escalating the Evacuation Effort

A general goal in the background anneal process is to minimize impact on core system operation and thus render the anneal sequence transparent to the system user. Accordingly, as mentioned above, in a number of embodiments the data evacuation effort is maintained as a passive operation for as long as possible, then escalated from passive evacuation to increasingly active evacuation as the deadline for performing an anneal draws closer. Further, during active evacuation, the anneal controller may differentiate between data pages based on access frequency and/or recency. That is, as mentioned above, the anneal controller may relocate less frequently or recently accessed, "cold" pages first in view of the higher statistical likelihood that the more frequently used, "hot" pages may yet be staled-out in an update operation.

Figure 4:
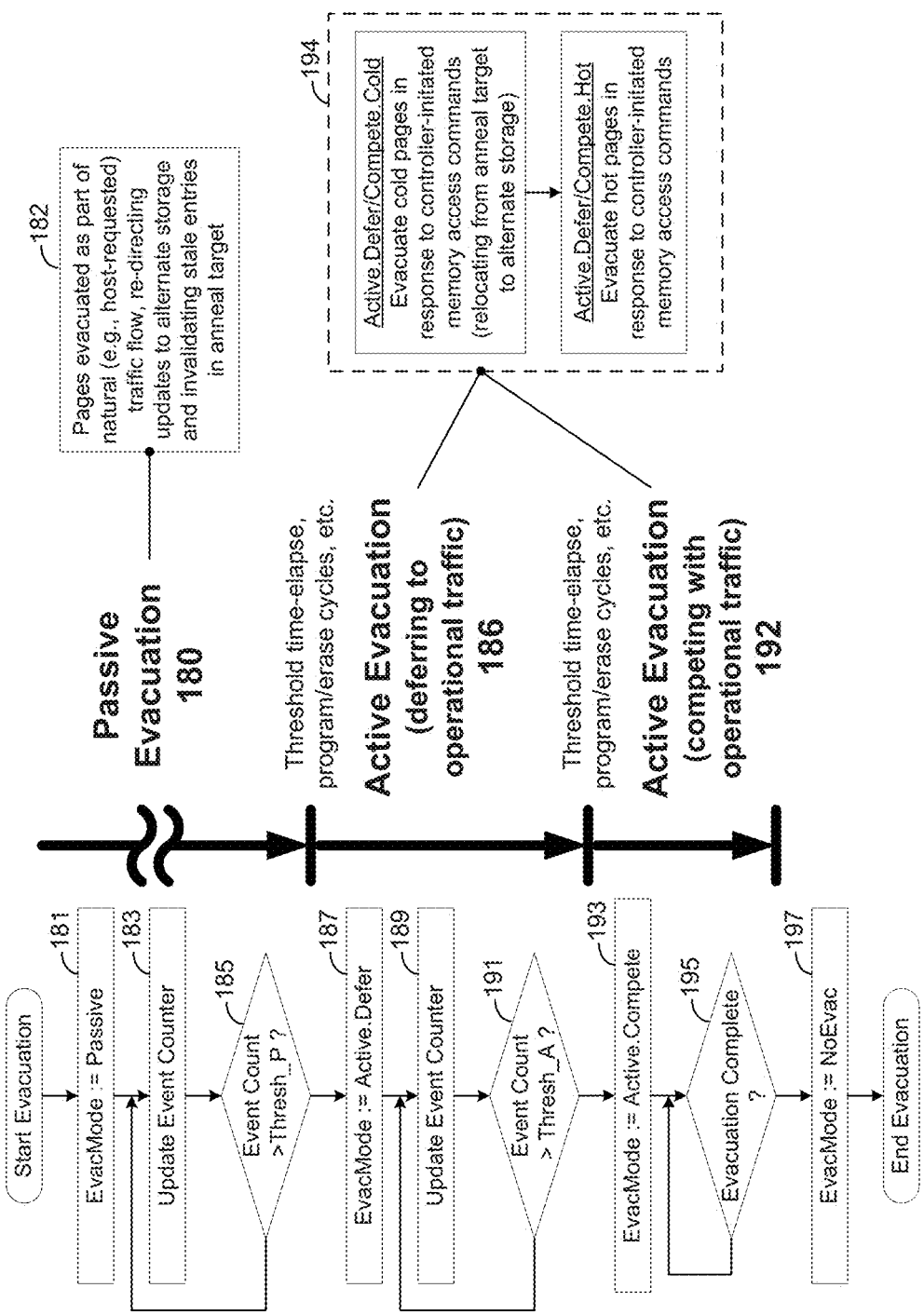
FIG. 4 illustrates an exemplary progression of evacuation states within an anneal controller corresponding to escalating evacuation urgency.

FIG. 4 illustrates an exemplary progression of evacuation states within an anneal controller (e.g., element 109 of FIG. 1) corresponding to escalating evacuation urgency. At the start of the passive evacuation phase 180, the evacuation state (represented by state variable "EvacMode") is set to "Passive" at 181 and remains in that state until an event counter (e.g., an elapsed time counter, error counter, program/erase counter, etc.) updated at block 183 is determined to exceed a passive evacuation threshold at decision block 185. As shown at 182, while in the passive evacuation state, the anneal controller enables pages to be evacuated as part of natural (e.g., host-requested) traffic, re-directing updates to alternate storage and invalidating stale entries in the anneal target.

Upon determining that the event counter has exceeded the passive evacuation threshold at decision block 185, the anneal controller enters an active evacuation phase 186 in which data is actively relocated with deference to host-requested memory accesses. More specifically, at 187, the evacuation mode is set to an active-deferential state (Active.Defer) to enable active but deferential data relocation. Thus, during idle cycles or other times when no or negligible interference with operational traffic (i.e., host requested memory accesses) will result, the anneal controller relocates data from the anneal target to the alternate storage. As with the transition from passive to active-deferential states, when an event counter (updated in block 189) is determined to reach a more urgent threshold (Thresh_A) in block 191, the anneal controller transitions to an active evacuation state 192 in which relocation operations contend with (i.e., compete with) host-requested memory accesses. More specifically, at block 193, the evacuation mode is transitioned from Active.Defer to Active.Compete to specify the active-competitive state. While in the active-competitive state, the anneal controller competes with host requests for access to the annealable memory subsystem, in at least some cases superseding host requests in an effort to ensure complete data evacuation prior to catastrophic data loss (or some event considered to define an evacuation deadline after which catastrophic data loss cannot be reliably avoided). Upon determining that the anneal target is fully evacuated (decision block 195), the anneal controller reverts to a non-evacuation state (NoEvac) at 197 and remains there until data evacuation is initiated within the next memory device to be annealed.

During active data evacuation in either the deferential or competitive states, passive evacuation may continue as operational traffic yields update operations that are redirected from the anneal target to the alternate storage. Also, as discussed briefly above, when actively evacuating data, the anneal controller may differentiate between hot and cold pages (pages being marked as hot or cold (or with even finer usage grades) in the page table, for example) and evacuate the cold pages first. In one embodiment, for example, the anneal controller transitions through two or more sub-states (according to the number of data usage gradations) within each of the active.defer and active.compete states. This operation is shown at 194 for an embodiment having two data usage gradations, "cold" pages and "hot" pages, with cold pages being those less recently (or less frequently) accessed than "hot" pages. Thus, during active-deferential state 186, the anneal controller progresses from an active.defer.cold state in which cold pages are evacuated, to an active.defer.hot state in which hot pages are evacuated. The anneal controller may similarly transition from an active.compete.cold state to an active.compete.hot state during the active-competitive state. Alternatively, the cold/hot sub-states may only be applied within the active-deferential or active-competitive states.

Figure 5:
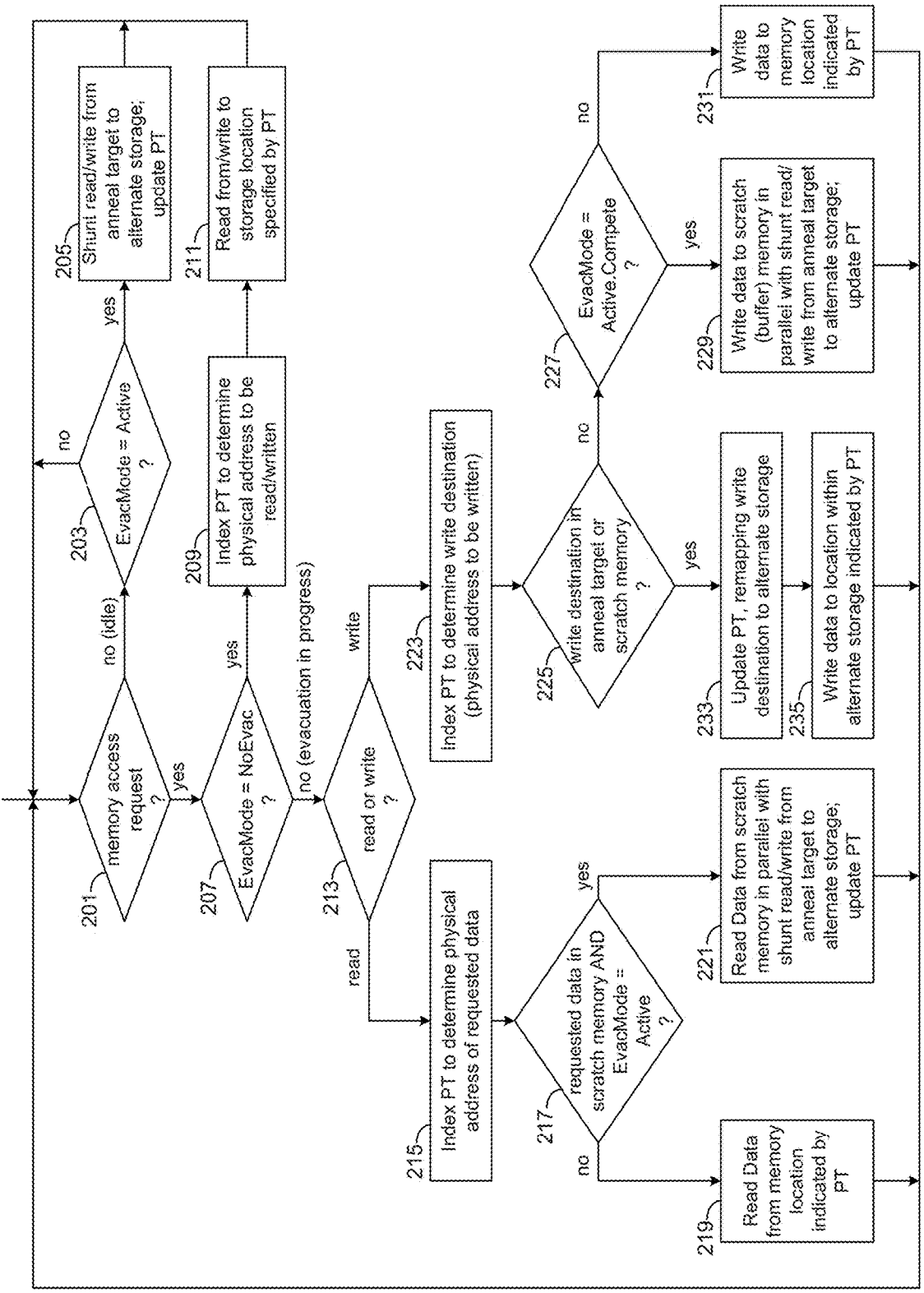
FIG. 5 illustrates an exemplary operation of the anneal controller of FIG. 1 during a memory access interval and in accordance with the evacuation states of FIG. 4.

FIG. 5 illustrates an exemplary operation of the anneal controller of FIG. 1 (and the encompassing memory controller) during a memory access interval and in accordance with the evacuation states of FIG. 4. If no memory access request is pending at the start of the memory access interval (determined at decision block 201), the memory subsystem is deemed idle for that interval and, if the anneal controller is an active evacuation state (Active.Defer or Active.Competitve, both of which yield an affirmative determination in decision block 203), then a data transfer from the anneal target to the alternate storage is carried out at block 205, with corresponding update to the page table to invalidate the data page in the anneal target and record the new entry in the alternate storage. As discussed below, this operation may be effectuated by a switched coupling of the respective data paths to the affected memory devices, thus permitting efficient passage of the data retrieved from the anneal target to the alternate storage. As discussed in greater detail below, such "shunt transfer" operations may be carried out more quickly than disjoint read and write transactions within the source and destination memory devices. Alternatively, individual read and write transactions may be executed, retrieving data to a local buffer or scratch memory within the memory controller and then immediately thereafter, or in a later cycle, writing the retrieved data to the alternate storage.

Still referring to FIG. 5, if a pending memory access request is detected at block 201 and no data evacuation is ongoing (i.e., EvacMode=NoEvac as determined at decision block 207), the memory controller indexes the page table using a logical address provided with the memory access request to determine the physical address to be read or written (209) and then reads data from or writes data to the specified storage location (211). In the case of an update operation within a flash memory subsystem, the memory controller will invalidate page table entries corresponding to the logical address and create new entries to reflect the physical address for the newly written data (recalling that effectuating an overwrite in flash memory generally involves programming the updated data in a new page and flagging the pre-existing and now stale page for eventual erase). As no data evacuation is ongoing, the same memory devices constituting the operational memory for the pre-existing page may be specified in the page table for the updated page.

Still referring to FIG. 5, if an evacuation is determined to be in progress (i.e., negative determination at block 207) then the page table is indexed using the logical address provided in the access request to determine either the physical address of the requested data (215) or the physical address of storage location to be written (223), depending on whether a read or write access is requested (determined in decision block 213). In the case of a memory read, if the requested data is located in a scratch memory (a temporary storage within the memory controller as discussed below)

and active evacuation is ongoing (determined in decision block 217), then at 221 data may be retrieved from the scratch memory and returned to the host concurrently with a shunt read/write from the anneal target to the alternate storage (and corresponding page table update to reflect the relocated page). While not specifically shown in FIG. 5, the memory controller may occasionally suspend execution of a host-requested memory read in favor of a relocation operation. For example, if the evacuation state is active-competitive and the memory controller determines that a predetermined (or programmed) number of host-requested read operations have been executed back-to-back, the memory controller may insert one or more data relocation accesses (reads from anneal target, writes to alternate storage) ahead of a pending host-requested read.

Returning to decision block 217, if the requested data is not in the scratch memory (or other alternative source) or the evacuation mode is passive, then data is retrieved from the memory location (within the annealable memory subsystem or scratch memory) indicated by the page table at block 219 and returned to the requestor.

In a memory write operation, if the write destination is within the anneal target or scratch memory (decision block 225), then the page table is updated to re-map the write destination to the alternate storage at block 233. Thereafter, host-supplied write data is written to the location within the alternate storage indicated by the page table (block 235). If the write destination is not within the anneal target or scratch memory (negative determination at decision block 225) and the evacuation mode is active-competitive, then the write data may be written to the scratch memory in parallel with a relocation operation within the anneal target and alternate storage (e.g., shunt read/write from the anneal target to the alternate storage), including page table update as indicated at 229. If the evacuation mode is passive or active-deferential (negative determination at decision block 227), data is written to the memory location indicated by the page table as shown at block 231.

It should be noted that the specific operations of the memory controller and anneal controller shown in FIG. 5 are generalized with respect to the many different annealable memory topologies and access-prioritization policies that may be supported. The specific operation of the memory controller may differ from that shown to meet the particular demands placed on the memory subsystem by the application at hand.

FIG. 6A illustrates an embodiment of an annealable memory subsystem 270, including a generalized anneal-enabling memory controller 271 and the various annealable memory topologies it may support. The memory controller includes a host interface 275 (i.e., host input/output (I/O)), memory interface 277 (memory I/O), control logic 273 (including anneal controller 274), page table 279, scratch memory 281, read/write data path 287 and host-side and memory-side control paths, 283 and 285. Memory access requests are received within the memory controller 271 via the host interface 275 (by way of path 292) and delivered to the control logic 273 via host-side control path 283. The control logic 273 converts the incoming host access requests into corresponding memory access command, address and control signals, scheduling commands for output to the memory subsystem via memory-side control path 285 and memory interface 277 (and ultimately via memory channel 290). In the case of a host-requested write operation, write data is received via the host interface 275 and forwarded via internal data path 287 (also referred to herein as internal data lanes of the controller) to the memory interface 277 for transfer in association with one or more corresponding memory-write (or memory program) commands. The write data may be buffered or queued within the scratch memory 281 or other data buffer within the memory controller 271 as necessary to establish a desired timing relationship between command and data transmission via the memory channel 290. Similarly, in a host-requested read operation, read data is received from the memory subsystem via the memory interface 277 and may be buffered as necessary in the scratch memory 281 or other data buffer within the memory controller 271 before being returned to the requesting host via host interface 275.

In a general embodiment, read and write requests received via the host interface include (or are associated with) virtual address values that are translated, via control logic and page table operation, into physical addresses that correspond to specific storage regions within the memory subsystem or other storage resources (e.g., the scratch memory 281). This virtual-to-physical address translation enables the control logic to map a given virtual address to physical storage locations as necessary to accommodate particularities of the underlying memory subsystem. The memory controller thus virtualizes the underlying storage arrangement, hiding complexity relating to management of the memory subsystem from the host requestor. In the case of a memory subsystem formed by a combination of different memory technologies, for example, the host requestor may simply issue virtual addresses without regard to the underlying details necessary for management of the various different types of memory to be accessed. More generally, even in a memory subsystem populated by a uniform type of memory, memory access complexity and constraints may be hidden from the access requestor. In the case of a flash memory system, for example, because data cannot generally be updated in place, a sequence of host-requested write operations directed to the same virtual address may be mapped to a sequence of different physical memory addresses, with each successive write operation being effected by allocating a new physical address to hold the new write data while marking the physical address corresponding to the previously written data as invalid and to be eventually reclaimed through an erase operation.

Referring to FIGS. 5 and 6, in the context of passive data evacuation, the redirection of data from anneal target to alternate storage may be effected by mapping (or re-mapping) virtual addresses that would otherwise be directed to the anneal target to a physical address within the alternate storage instead. Similarly, in the case of a virtual device pair, memory read requests may be split between the anneal target and the alternate storage according to the page table entry. Finally, in the case of active data evacuation, data relocation may be effected by copying data from the anneal target to the alternate storage (either in a shunt read/write or through discrete read and write operations) and by updating the page table to invalidate the entry within the anneal target and designate the alternate storage as the repository of the data. In general, all such data evacuation operations, as well as selection of the anneal target and alternate storage and initiation/termination of the anneal event itself are managed by the control logic 273, and more particularly by the anneal controller 274 within the control logic.

As mentioned above, the selection of the anneal target and alternate storage, as well as the movement of data between the target and alternate, may vary significantly according to the topology of the memory system. As a matter of terminology, and referring to the generalized views of different memory subsystem topologies in FIG. 6A, the memory system may be classified as a single-channel system 301 or multi-channel system 330 according to the number of independently controllable memory channels coupled between the memory controller and respective memory subsystems. Thus, a single memory subsystem 302 is coupled to the memory controller in a single-channel system, and multiple memory subsystems (331A, 331B, . . . ) are coupled to the memory controller in a multi-channel system. Refining the topology classification further, the memory devices that constitute a given memory subsystem may be coupled to the memory controller via a multi-drop memory channel (320) or point-to-point memory channel (303), and the memory channel itself may be sliced or unified. More specifically, in a unified-channel topology, all the memory devices within the memory subsystem are coupled in common to the signaling lines that form the memory channel, whereas in the sliced-channel configuration, memory devices or sets of memory devices within the memory subsystem are coupled to respective subsets of the signaling lines that constitute the memory channel. In one embodiment, shown in connection with the sliced point-to-point topology at 305, the command and address (CA) lines of the memory channel (i.e., signaling lines used to convey command and address signals) may be coupled in common to multiple memory devices ($309_1$, $309_2$, . . . , $309_{n/m}$), while a set of n data lines is sliced into subsets of m data lines ($306_1$, $306_2$, . . . , $306_{n/m}$) with each subset being coupled respectively to one of the n/m memory devices 309. Similarly, within the sliced multi-drop system shown at 322, a set of n data lines may be sliced into subsets of m lines ($325_1$, $325_2$, . . . , $325_{n/m}$), with each subset coupled in multi-drop fashion to a respective set of memory devices. By contrast, in the point-to-point unified topology shown at 315, the entire set of n data lines is coupled to a single memory device 317 (i.e., single memory IC), and thus coupled to an n-bit wide data interface (I/O 318) of the memory device to enable access to the memory core 319 therein.

Returning to the sliced point-to-point memory subsystem topology 305, the memory devices coupled to respective m-bit slices of the data path may be operated as a parallel unit by delivering the same memory read and write command to each device (e.g., via a shared command path, not specifically shown). A set of memory devices operated as such a unit (i.e., as a "rank" of memory devices as discussed above) appears to the memory controller to be a unified device, with each memory device receiving a respective m-bit share of an n-bit write data value during a write operation and outputting a respective m-bit share of an n-bit read data value during a read operation. As shown in the sliced multi-drop topology at 322, multiple ranks of memory devices ($323_1$, . . . , $323_R$) may be defined, for example, through an addressing arrangement that enables only the devices of a selected rank ($324_1$, $324_2$, . . . , $324_{n/m}$) to respond to a memory read or write command In one embodiment, for example, respective chip-select lines or groups of chip select lines are coupled to each rank of memory devices 323 to enable a selected rank to respond to a memory access command provided via a command/address path that is coupled to all the memory devices within the memory subsystem.

FIG. 6B illustrates a generalized data processing system 335 in which the annealable memory system 270 of FIG. 6A may be deployed. As shown, the data processing system 335 includes one or more processors 336 (or processor-cores) each of which may have various classes of internal storage (e.g., register file (Reg), level-1 cache (L1), level 2 cache (L2), non-volatile storage (NV), etc.); a main memory 337 formed by address translation circuitry 342 (e.g., implemented by or within a memory controller such as memory controller 271 of FIG. 6A) and one or more memory modules 341; and one or more secondary storage devices 338, such as a solid state disk (SSD), hard-disk drive, removable media (e.g., optical media, magnetic media, etc.). Though not specifically shown, various additional components (e.g., bus bridges, co-processors, graphics controllers, user-interface components, connectivity components, etc.) may additionally be provided within the data processing system. Such additional components may each share the main memory 337 and/or secondary storage devices 338 with processors 336 and each additional component may also or alternatively include dedicated memories that may themselves be implemented by annealable memory systems.

Whatever the specific topology, the various categories or classes of memory within data processing system 335 may be viewed as forming a storage hierarchy with respect to a given data requestor. For example, from the perspective of a processing core within processor 336, the register file, L1 cache, L2 cache, internal NV memory, main memory and secondary storage represent a hierarchy of storage devices, with each tier within the hierarchy generally exhibiting a larger storage capacity but slower access speed than the tier above it. For example, the register file is smaller and faster than the L1 cache which is smaller and faster than the L2 cache which is smaller and faster than the main memory, etc. The tiers of memory may be distinguished by a number of characteristics beyond capacity and access speed. For example, each tier of memory is generally disposed in closer physical proximity to the processing core than the next-larger/slower tier. Also, each tier of memory that is addressed through a virtual addressing scheme (i.e., address is translated by an address translation circuit such as 342 to generate the physical address applied to the memory devices themselves) may employ a shared address translation table that is distinct from the address translation table used by another tier of memory. Thus, the address translation circuitry 342 provided within main memory 337 may be used to generate all physical addresses applied to the memory modules 341 (or other memory components in the event that memory devices are mounted directly to a motherboard or otherwise disposed within the system without provision of removable memory modules) so that the constituent memory devices may be deemed a "flat" tier of memory from the perspective of the processor 336. The secondary storage devices 338 may be viewed as a single tier of memory or as separate tiers of memory, with each such device potentially including its own address translation circuitry.

During system operation, memory access requests and corresponding addresses are output from the processors 336 (or other requestors) to the main memory 337 via request/address path 339. The address translation circuitry 342 translates the incoming "virtual" addresses into physical addresses that are, in turn, output to the memory modules 341 via command/address (C/A) path 343. The address translation circuitry 342 may be associated with more general memory controller circuitry that also translates and/or queues incoming requests for subsequent issuance over the C/A path 343 as well as various control signals, such as chip-select signals, timing signals, etc. Data may be transferred between the processors 336 and main memory 337 via a data path 340 as shown, or time-multiplexed onto the request/address path, thus rendering the latter path as a generalized information signaling path. Although the data path 340 alone is depicted as extending to the secondary storage devices 338, a dedicated or shared command/address path may be coupled to each such device, or the data path 340 may be used to convey more generalized command/data information.

Still referring to FIG. 6B, an annealable memory system 270 may be used to implement any or all of the tiers of memory shown in FIG. 6B, as well as any additional tiers or classes of memory not shown (e.g., graphics memory or additional tiers of memory inserted hierarchically between the main memory tier and secondary storage tier or between any others of the memory tiers). In the case of main memory in particular, all or any subset of the individual integrated-circuit memory devices (M1-Mn) mounted to memory modules 341 may be implemented by flash memory devices or other types of memory devices that are annealed from time to time using the background and/or foreground annealing methods and supporting circuitry described herein. Also, when implemented in a memory module, the individually annealable memory devices may form slices of a rank as discussed in reference to FIG. 6A, with each rank of memory devices being coupled in multi-drop fashion to the sliced data path, or coupled point-to-point to respective sliced data paths. Also, while the data path 340 is depicted as extending directly between the memory modules and the processor, data may pass through and/or be reorganized within a memory controller or other intermediary device. In other tiers of the memory hierarchy, flash memory devices (including NAND-type flash devices, NOR-type flash devices, as well as any other annealable memory devices) may be employed in virtually any topology as discussed in reference to FIG. 6A.

Regardless of the tier (or tiers) at which an annealable memory system is disposed within the data processing system 335, the individual memory device(s) that constitute the annealable memory subsystem may be evacuated to one or more other devices within the same memory tier, or to one or more other tiers of memory devices. Further, the selection or specification of the alternate storage to which data is evacuated may be fixed by design, determined dynamically according to system conditions, or programmatically controlled (e.g., specified by an initial configuration or by an operator when prompted during execution of a utility program or other software program relating to anneal). Also, such data evacuation is not limited to evacuation in preparation for anneal and instead may be carried out generally for maintenance operations or to render a device available for "hot" removal (i.e., removal under power) or for any other reason.

Modifications of the generalized memory system 270 may be appropriate according to the application of the memory system 270 within a given memory tier. For example, address translation circuitry may be omitted from any memory tier that is directly, physically addressed by a processor core (e.g., in an embodiment of the register file). Also, while the various tiers of memory may be implemented as discrete sets of one or more integrated-circuit dice (i.e., "chips") and systems of chips intercoupled by data signaling paths and control signaling paths, one or more tiers of memory may be integrated into a system-on-chip (SOC) or within an integrated circuit package formed by one or more chips.

FIG. 7A illustrates an example of a run-time annealable memory system formed by a flash controller 350 (a specific example of the more generic memory controller 271 shown in FIG. 6A) coupled via respective point to point data links to a set of five flash memory devices (FD0, FD1, FD2, FD3 and FD4). The flash controller generally includes the memory controller components described above and thus contains, for example, control logic 351 (including an anneal controller 352), page table 353, scratch memory 355, command path 359 and memory interface 361.

With regard to the memory subsystem, the constituent flash memory devices are coupled to a common command/address path (not shown in FIG. 7A) and organized into a memory rank (i.e., a set of memory devices that receive and output respective slices of data, but that appear to the flash memory controller as a single unit for the purposes of host-requested read and write access), where the memory rank includes a single standby device and an operational memory set of four flash memory devices. As the total number of memory devices may be generalized to more or fewer than the five shown, the arrangement is referred to herein as an N+1 memory rank (N devices per operational memory set, plus one spare) or N+1 architecture.

Still referring to FIG. 7A, the page table 353 is populated with address translation entries 354 that indicate not only logical to physical address translations, but also the operational memory set (i.e., subset of four memory devices to be accessed; also referred to herein as the "operational set") in which the data specified by a given logic address resides or is to be written. Accordingly, a logical address received in association with a host-requested memory read or write may be applied by the control logic 351 to index the page table 353 and thus retrieve both the operational memory set and the physical address to be accessed therein. In one embodiment, the op-set value (i.e., code indicating the operational set) is returned to the control logic 351 and used therein to assert the chip-select signals necessary to enable access to the specified subset (N) of the N+1 attached memory devices. The physical address retrieved from the page table 353 is output onto the command/address path (not specifically shown in FIG. 7A, but coupled to all N devices) which, due to the op-set-controlled assertion of chip-select lines, is received within the operational set specified by the page table 353, thereby enabling the specified memory read or memory write operation to be carried out at the appropriate location within the appropriate subset of the attached flash memory devices.

FIG. 7B illustrates, within the context of the same flash controller 350 and flash memory subsystem as in FIG. 7A, the pairing of an anneal target (flash device FD1) and an alternate storage (flash device FD0) to form a virtual device for purposes of data evacuation. As described above in reference to FIG. 3 and shown in more detail in FIG. 7C, new writes (i.e., write operations directed a logical address not yet in the page table) and updates (i.e., write operations directed to logical address already recorded in the page table and thus a request to overwrite data existing at that logical address) are blocked from taking place in the anneal target (FD1 in this example) and instead redirected to the alternate storage (FD0). In the case of a new write, a new entry corresponding to the host-supplied logical address is recorded in the page table and populated with the physical address at which data is stored and listing flash devices FD0, FD2, FD3 and FD4 as the operational set. For an update operation, the existing page table entry (i.e., corresponding to the host-supplied logical address) is revised to reflect the physical address at which the updated data is written and to list flash devices FD0, FD2, FD3 and FD4 as the operational set. This revision of the existing page table entry effectively invalidates the pre-existing data entry within the anneal target (i.e., effects a "stale-out" of the data at the table-specified physical address within the anneal target). Note that, in the case of a memory subsystem populated by flash memory devices (or other memory type in which data updates cannot be executed in place, but rather is effected by writing to a new physical location), because the updates directed to flash devices FD2, FD3 and FD4 necessarily involve writing to an unoccupied physical address within those devices, the physical address recorded within the page table prior to the update operation (the pre-update address) will be different from that recorded after the update operation (the post-update address).

In the case of memory read operations, the page table entry corresponding to the host-supplied logical address is referenced to determine the operational set to be accessed (and thus the combination of chip-select lines to be asserted) and the physical address of the data to be retrieved therefrom. Accordingly, as shown in FIG. 7D, data may be read from an operational set that includes flash memory devices FD0, FD2, FD3 and FD4 (i.e., if the data sought has already been relocated to the alternate storage) or from an operational set that includes memory devices FD1, FD2, FD3 and FD4 (i.e., if the data has not yet been relocated within the alternate storage). Also, if data is retrieved from an operational set that includes the anneal target, the data may be copied to scratch memory to facilitate later transfer to the alternate storage. In that case, as shown in FIG. 7D, a flag ("S") may be set within the page table entry to indicate that a copy of the data at the page-table-specified physical address is also in the scratch memory (an address within the scratch memory may also be recorded within the page table), thereby enabling data to be transferred from scratch memory to the alternate storage during an active evacuation operation.

Figure 8:
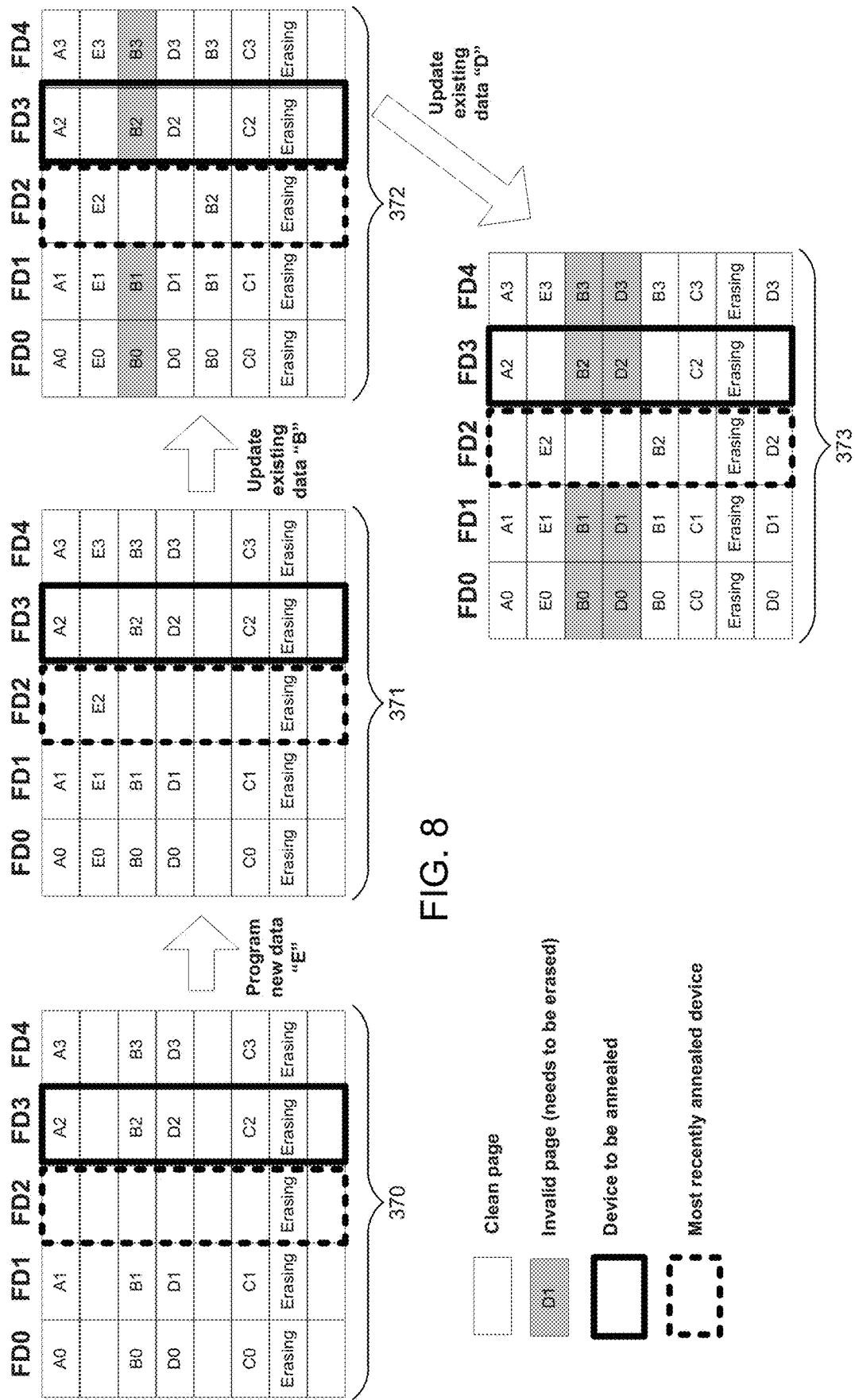
FIG. 8 illustrates exemplary changes in state within the memory subsystem of FIGS. 7A and 7B as new-write operations and update operations are performed.

FIG. 8 illustrates exemplary changes in state within the memory subsystem of FIGS. 7A and 7B as new-write operations and update operations are performed. For purposes of example, the following conditions are assumed at state 370:
  flash device FD2 has recently been annealed and is blank (contains no data);
  flash device FD3 is the current anneal target;
  flash device FD2 is the alternate storage and thus flash devices FD2 and FD3 form a virtual pair for purposes of data evacuation;
  flash devices FD0, FD1, FD3 and FD4 constituted the operational memory set during the anneal of flash device FD2 and are striped with (i.e., contain at same physical addresses) data words A, B, D and C, such that data slices A0, A1, A2 and A3 of data word A are stored within devices FD0, FD1, FD3 and FD4, respectively; data slices B0, B1, B2 and B3 of data word B are stored within devices FD0, FD1, FD3 and FD4 respectively, and so forth; and
  an erase operation is ongoing within a physical address that is striped across all the memory devices, including device FD2.

While in state 370, a programming operation (i.e., writing in the flash memory subset) is initiated to store a new data word 'E' (i.e., a new write) within the memory subsystem. Because flash device FD3 is the anneal target, devices FD0, FD1, FD2 and FD4 are selected as the operational set and the programming operation is carried out to store data slices E0, D1, E2 and E3 in respective unused storage regions of those flash devices. More specifically, the flash controller asserts the chip select signals for the devices that constitute the operational set (FD0, FD1, FD2, FD4) so that the programming command is received only within those flash devices. Also, the flash controller switches the four data slices that form data word 'E' (i.e., E0, E1, E2, E3) onto the data paths coupled to the devices that form the operational set, thereby ensuring that the data slices are delivered to the appropriate devices.

After data word 'E' has been stored within the operational set, the contents of the memory subsystem are as shown in state 371. The nature of the virtual device formed by the anneal target and alternate storage are demonstrated by this state, as slice 2 of the various data words A, B, C, D, E are split between flash devices FD2 and FD3, with slices A2, B2, C2 and D2 being stored within (and awaiting evacuation from) flash device FD3, and slice E2 stored within flash device FD2.

The memory subsystem transitions from state 371 to state 372 in response to an update operation carried out to update existing data word 'B.' In this case, slices B0-B3 of the updated data word are stored within an unused location of the operational set that includes the alternate storage (FD2), while the pre-existing data word is marked as invalid. By this operation, data word 'B' is both updated (note that data word 'B' is stored in a new location within devices FD0, FD1, and FD4 as the data is written to a clean physical location instead of being overwritten in place) and slice D2 effectively transferred from the anneal target to the alternate storage by invalidation of the stale data word.

The memory subsystem transitions from state 372 to state 373 in response to an update to data word 'D.' As in the prior update, slices D0-D3 of the updated data word are stored within an unused location of the operational set that includes the alternate storage (FD2), while the pre-existing and now stale data word is marked as invalid. As with the update to data word 'B,' the update to data word 'D' serves both to write the updated data within the memory subsystem and effectively to transfer slice D2 from the anneal target to the alternate storage.

Upon reaching state 373, only data slices A2 and C2 remain to be evacuated from the anneal target. If not staled-out by update operations by the time the active-evacuation threshold is reached, data slices A2 and C2 may be transferred from the anneal target to the alternate storage via active-evacuation operations, thereby rendering the anneal target fully evacuated and ready for the anneal operation.

FIGS. 9A and 9B illustrate exemplary data transfer operations that may be executed within the memory system of FIG. 7A to actively evacuate data from the anneal target to an alternate storage. FIG. 9A illustrates a two-phase transfer in which data is initially transferred from the anneal target (FD1) to the scratch memory 355 within the flash controller 350 (phase 1), and then later transferred from the scratch memory 355 to the alternate storage, FD0 (phase 2). The first-phase transfer may be carried out as part of a controller-initiated transfer (and thus be an active evacuation) or may be effected during a host-requested memory read operation, and thus be effected passively as part of normal operational traffic.

In the active evacuation case, the flash controller 350 may assert the chip-select line for only the anneal target for purposes of the read operation (i.e., read command received only within the anneal target), thus avoiding unnecessary memory read operations within the other flash memory devices and thereby saving power. Alternatively, the flash controller may access all the memory devices within the operational set (i.e., flash devices FD1-FD4) and either ignore the data retrieved from devices other than the anneal target (i.e., not receive, save and/or forward the data from flash devices FD2-FD4) or save and/or forward the entire retrieved data word (i.e., effecting an internal or upstream caching operation). In either approach, the data slice retrieved from the anneal target may be stored in the scratch memory 355 and the page table 353 updated to indicate that data from the specified address within the anneal target has been copied to the scratch memory 355 and is available for transfer to the alternate storage (e.g., setting the scratch memory flag 's' within the page table entry as shown in FIG. 7D).

In the passive evacuation case, the data slice to be relocated is retrieved from the anneal target as part of a host-requested read from the operational memory set. Accordingly, the entire data word read from the operational memory set, including the slice from the anneal target, is forwarded to the host requestor via the memory I/O 361 and data read/write path 357, and the slice from the anneal target is additionally written to the scratch memory 355. As with active evacuation, the page table 353 is updated to indicate presence of the data from the anneal target within the scratch memory.

Still referring to FIG. 9A, in the second phase of the two-phase evacuation operation, the data is transferred from scratch memory 355 to the alternate storage (FD0 in this example) as part of an active evacuation. In one embodiment, a single-slice write operation is carried out to write data only to the alternate storage. In an alternative embodiment, the entire data word retrieved from the operational set that includes the anneal target (i.e., the "anneal set") is rewritten within the operational set that includes the alternate storage (the "alternate set"). Such "multi-slice" operations are similar to the update operations described in reference to FIG. 8, but are initiated by the flash controller rather than the host device.

FIG. 9B illustrates an exemplary single-phase data transfer between the anneal target and the alternate storage executed as part of an active evacuation. This operation is also referred to herein as a shunt read/write, as the flash controller 350 issues single-slice read instruction to the anneal target, FD1 (i.e., chip-select raised for the anneal target only and not other devices of the N+1 rank), followed by a single-slice write to the alternate storage, FD0. In one embodiment, the data slice received from the anneal target is (i.e., the data being relocated) is looped (shunted) within the memory I/O circuit 361 from the receiver for the anneal-target data path (i.e., the data lines coupled to the anneal target) to the output driver for the alternate-storage data path, thereby effecting a low-overhead data relocation from anneal target to alternate storage. That is, data is transferred between the anneal target and alternate storage without the delay or power consumption incurred in the transfer from memory I/O interface 361 to the internal read/write data path 357 and scratch memory 355 (i.e., without transfer to the memory controller core) as in the two-phase transfer of FIG. 9A.

Sequencing the Anneal Target

Referring briefly FIG. 6A, the m-bit data slices that form an n-bit data word within a sliced memory architecture 305 generally have a meaningful order with respect to one another. In a conventional memory system, assignment of data slices to memory devices, referred to herein as "slice assignment," is static and established by the dedicated hardware connection between each internal data lane (i.e., slice conveying circuitry within the read/write path) of the memory controller and its corresponding external data path and memory device. In the context of an annealable memory subsystem having a spare device per rank, however, correspondence between data slices and memory devices is dynamic, varying according to the operational memory set selected for a given memory access. This dynamic slice assignment presents a number of implementation challenges and options in terms of reallocating the slice assignment as each new anneal target is selected, and more generally in terms of the anneal-target progression itself (i.e., sequence of memory devices selected as anneal target). For example, in one embodiment, a round-robin anneal target progression is implemented (i.e., stepping from memory device 1 to 2 to 3 to . . . N, in order, and then repeating the sequence starting again with memory device 0) together with fixed slice assignment for each different anneal target. As discussed below, this approach provides the advantage of relatively low-overhead anneal-progression and slice-assignment logic, but at the cost of a substantial data relocation effort at the conclusion of each progression through the N+ memory rank (note the designation "N+" is used herein to refer to a memory rank having one or more spare devices beyond the N devices needed to form an operational memory set matching the width of read and write data words). In an alternative embodiment, an oscillating progression reduces the data relocation effort relative to the round-robin/fixed-slice-assignment approach, but yields an uneven number of anneal operations per progression cycle. In yet another embodiment, round-robin anneal target progression is employed, but with multiple possible slice assignments per anneal target (and thus increased complexity to determine and track the appropriate slice assignment) to reduce the data relocation volume.

Figure 10A:
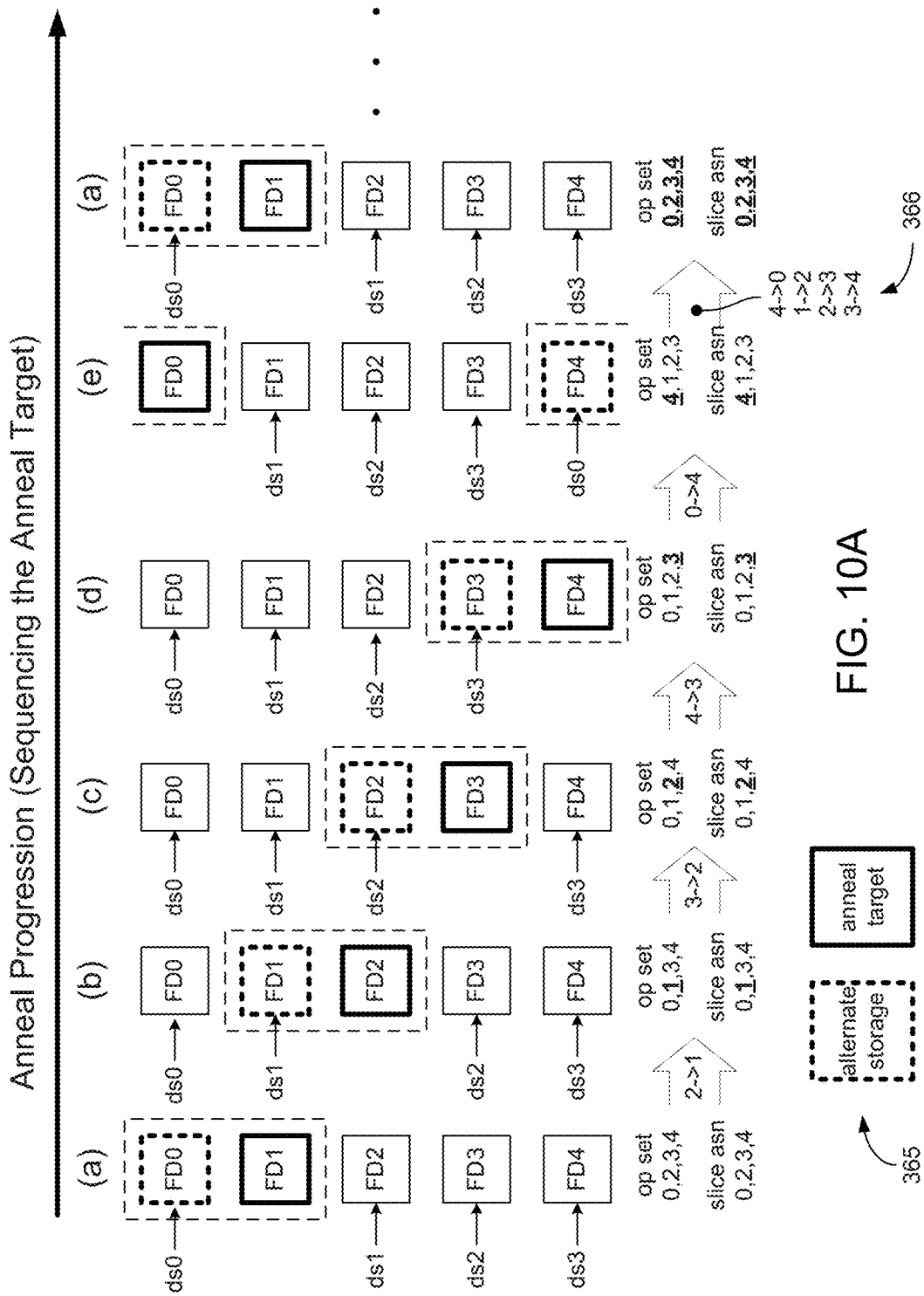
FIG. 10A illustrates an anneal progression and slice assignment according to a round-robin-progression, fixed-slice-assignment embodiment.

FIG. 10A illustrates an anneal progression and slice assignment according to the round-robin/fixed-slice-assignment embodiment mentioned above. The example shown assumes a N+1 architecture having four devices (and thus four slices) per operational memory set and a single spare device) formed by flash memory devices FD0, FD1, FD2, FD3 and FD5. The state by state progression of the anneal target selection is shown from left to right, starting with anneal target=FD1 in selection state 'a', and then proceeding to anneal target=FD2 in selection state 'b,' anneal target=FD3 in selection state 'c,' anneal target=FD4 in selection state 'd,' and anneal target=FD0 in selection state 'e.' Thereafter, the sequence is repeated in a new anneal cycle starting with selection state 'a' (i.e., anneal target=FD1). The operational memory set for each target selection state is shown below the memory rank as "op set" (i.e., the flash memory devices of the rank less the anneal target) and the virtual device pair for each selection state is encompassed in dashed outline (with the anneal target and alternate storage being marked by bold and dashed device perimeters as shown in the legend at 365). Also, the data slice assignment for each selection state is shown by arrows from each of the four data slices (ds0, ds1, ds2, ds3) to the memory devices that form the operational set in that selection state. Thus, within selection state a, alternate storage FD0 and anneal target FD1 form the virtual device pair, flash devices FD0, FD2, FD3 and FD4 form the operational set for new writes and update operations (read operations are alternately directed to the alternate storage FD0 or the anneal target FD1 according to the data evacuation state indicated by the page table), and the slice assignments are ds0/FD0, ds1/FD2, ds2/FD3 and ds3/FD4.

Still referring to FIG. 10A, the slice assignment is repeated below the memory rank under the designation "slice asn" to explicate the data relocation effort required in the transition from one selection state to the next (note that the data slice is implicit in the notation shown so that a slice assignment of "0,2,3,4" means that data slice 0 is assigned to FD0, data slice 1 is assigned to FD2, data slice 2 is assigned to FD3 and data slice 3 is assigned to FD4). For example, in the progression from selection state 'a' to selection state 'b,' device FD1 replaces FD2 in the operational set (i.e., as FD2 becomes the new anneal target) as demonstrated by the arrow 2→1, and data slice ds1 is reassigned from FD2 to FD1. Accordingly, the device newly added to the operational set in the progression to selection state 'b' (i.e., FD1) is marked by underline ('1' for FD1) under the "op set" designation, and the reassignment of data slice ds1 to device FD1 is likewise marked by underline ('1' for FD1) under the "slice asn" designation. As the general approach is to reassign the data slice for each newly selected anneal target to the alternate storage, it can be seen that only one data slice reassignment occurs in each state progression from selection state 'a' to 'b' to 'c' to 'd' to 'e,' but that the consequence of this approach is to shift all four data slice assignments by one in the net progression from selection state 'a' to selection state 'e.' That is, ds1 is reassigned from FD2 to FD1, ds2 is reassigned from FD3 to FD2, ds3 is reassigned from FD4 to FD3, and ds0 is reassigned from FD0 to FD4. Accordingly, to reset the slice assignments to their initial state upon progressing from selection state 'e' to selection state 'a' (i.e., in preparation for the new anneal cycle), all four of the data slices are reassigned as shown at 366. As each data slice reassignment generally involves relocation of the data from the device to which the slice was previously assigned to the newly assigned device, the reassignment of all four data slices in the single progression from state 'e' to state 'a' involves four times as much data relocation as the four previous selection state progressions. Thus, while relatively low-overhead (i e, small footprint) control circuitry may be provided to implement the round-robin target selection and fixed slice assignment, such low overhead control circuitry comes at the price of a relatively burdensome data relocation effort once per cycle of the selection state progression (i.e., once per anneal cycle).

Figure 10B:
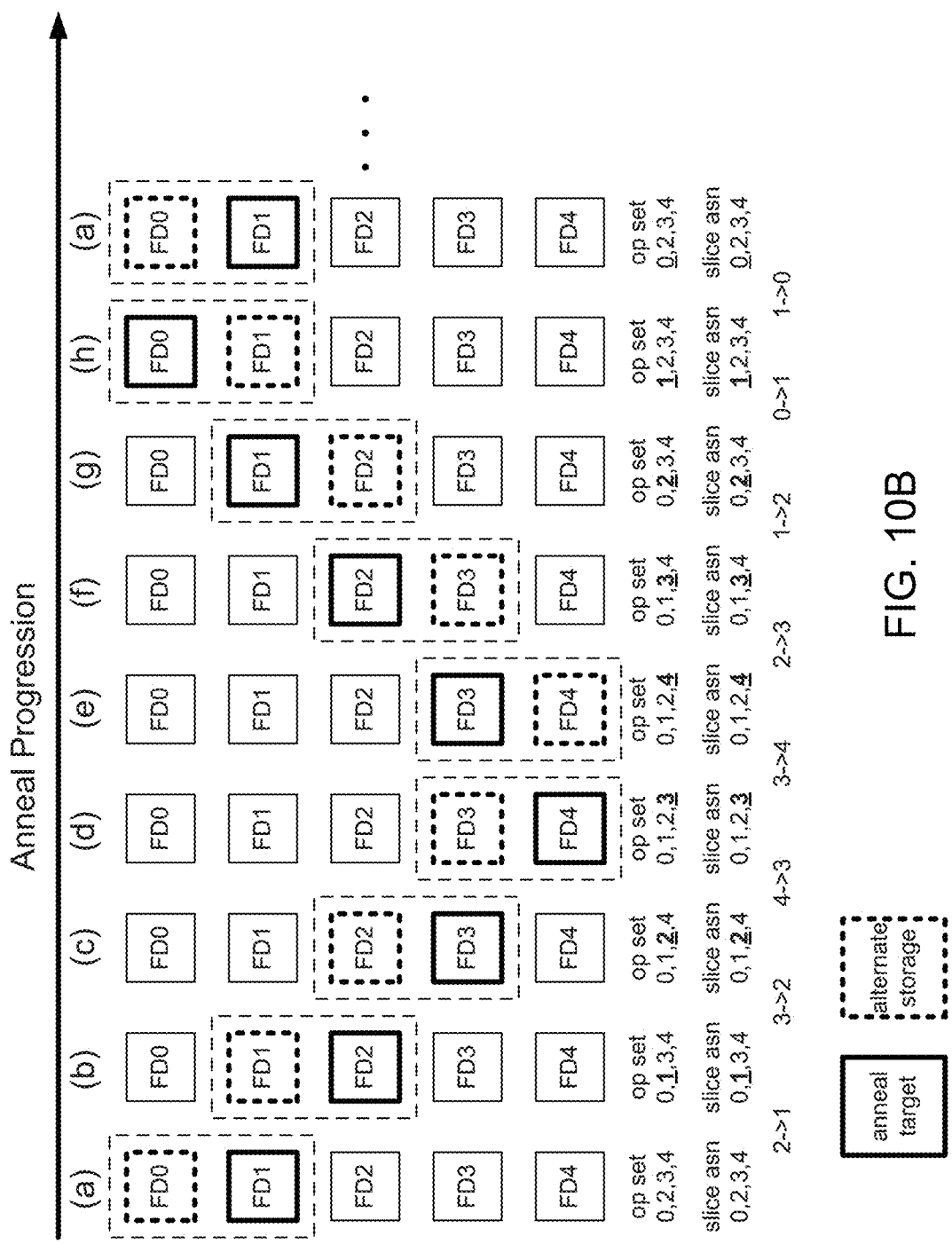
FIG. 10B illustrates an anneal progression and slice assignment according to an oscillating-progression, fixed-slice-assignment embodiment.

FIG. 10B illustrates an embodiment of the oscillating-progression, fixed-slice-assignment approach mentioned above. As with the round-robin/fixed-slice approach, the memory subsystem progresses through a predetermined sequence of anneal targets marked by selection states 'a' through 'h,' and having a fixed slice assignment for each selection state. In contrast to the round-robin approach, however, instead of repeating the progression sequence after annealing all N+1 memory devices in the rank, the direction of the progression sequence is reversed so that any incremental displacement of the slice assignment resulting from the initial-direction progression is reversed by the return-direction progression. In the specific progression sequence of FIG. 10B, for example, after initially progressing downward from device FDi to FDi+1 and reaching final device FD4 in selection state 'd,' the progression direction is reversed to progress upward from device FDi to device FDi−1. As shown by the slice assignments marked in FIG. 10B, the displacement of the slice assignment resulting from the downward progression is reversed by the upward progression sequence so that only one slice assignment is changed per selection state progression. That is, after completing the anneal operation in the final selection state 'h' (i.e., in FD0, the final device of overall progression sequence shown) and reversing the progression direction to return to the initial selection state (a), only data slice ds0 need be reassigned (from FD0 to FD1). Thus, by reversing the direction of the selection progression after annealing the end-of-rank devices FD0 and FD4 (and thereby effecting an oscillating progression sequence), the multi-slice reassignment and corresponding data relocation burden of the round-robin/fixed-slice-assignment approach is avoided.

Note that the end-of-rank devices may be determined based on physical disposition (e.g., end-of-rank devices are those physically disposed at the end of a row of memory devices as shown in FIG. 10B) or logically assigned without regard to physical location. So long as the progression direction is reversed once for every N devices annealed, the reverse-direction (counter-direction) progression through the sequence of anneal targets will restore the slice-assignment displacement that occurred in the initial progression direction. In the context of physical designation, the oscillating progression sequence may be viewed as a manner of ensuring that each new anneal target is always paired with a physically adjacent device to form the virtual device pair. Thus, upon reaching the device at either end of the rank, the anneal progression is reversed to ensure that the device next selected for anneal is disposed adjacent the end-of-rank device.

Still referring to FIG. 10B, it can be seen that the number of anneal operations per device in each complete anneal cycle (i.e., each complete oscillation from selection state a to selection state h) is not uniform. More specifically, the end-of-rank devices are annealed only once per anneal cycle (i.e., complete progression through selections state 'a' to 'h'), while the devices sandwiched between the end-of-rank devices (the "interior" memory devices) are annealed twice per anneal cycle. One consequence of this phenomenon is that the half-rate of anneal for the end-of-rank devices should be taken into account in determining the overall anneal cycle rate; designing (or programming) the time allotted for each device selection state according to required anneal frequency of a given device on the assumption that each device is annealed only once per complete progression through all the device selection states. Because adverse effects of the anneal operation are negligible in most cases, the resulting double-frequency annealing of the interior memory devices is generally of no consequence. So long as the target anneal frequency for the end-of-rank memory devices is met, the system may generally be operated with background anneal indefinitely.

Figure 10C:
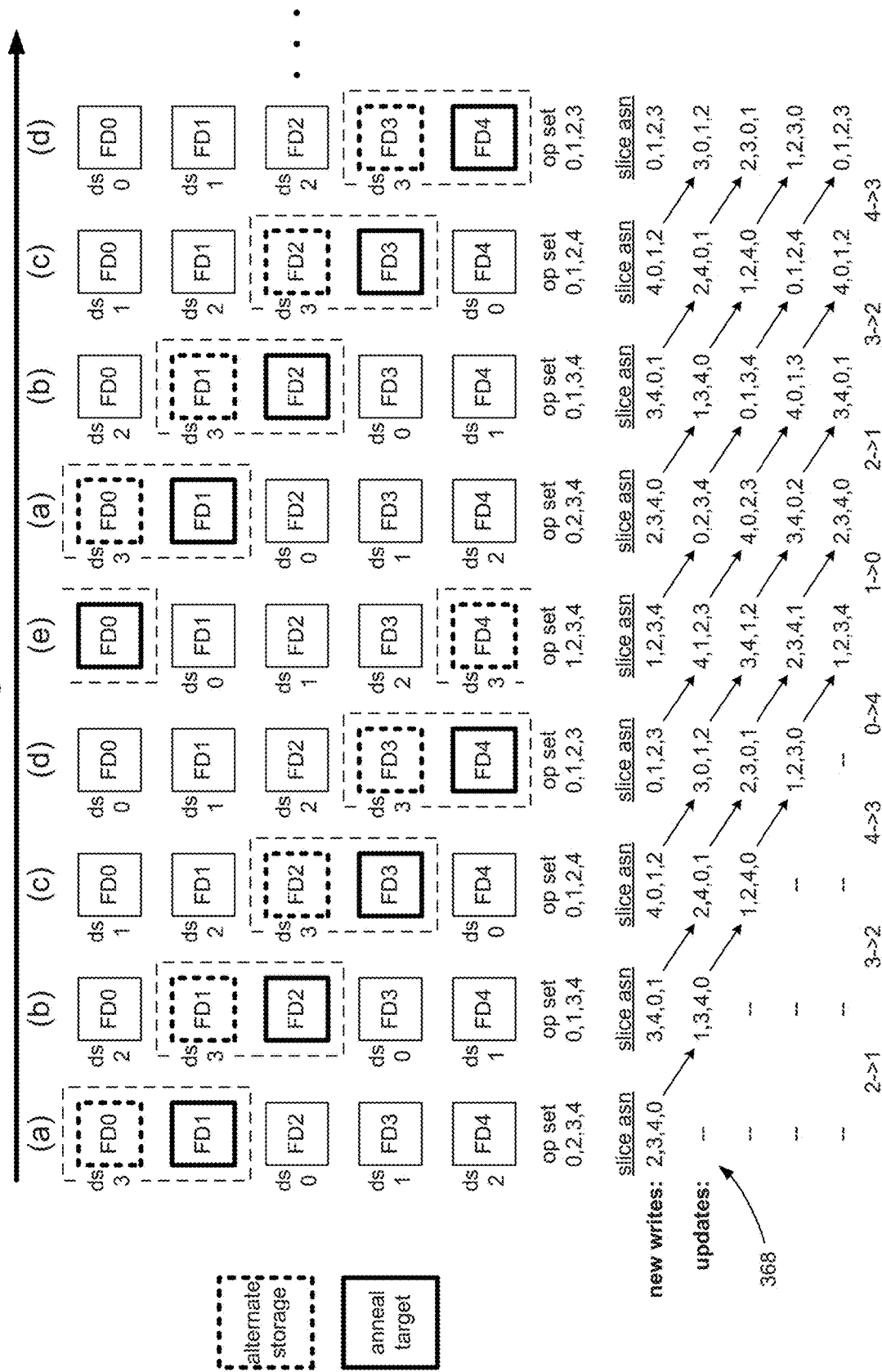
FIG. 10C illustrates an anneal progression and slice assignment according to a round-robin-progression, variable-slice-assignment embodiment.

FIG. 10C illustrates an embodiment of the round-robin-progression, slice-assignment-lookup approach mentioned briefly above. In this embodiment, the same round-robin target-selection sequence is used as in the round-robin/fixed-slice-assignment approach of FIG. 10A (thus, five device selection states, 'a' through 'e', for the 4+1 architecture shown), but a variable slice assignment is applied to avoid the once-per-cycle multi-slice data relocation effort. More specifically, the slice assignment for any data write is dynamically determined (e.g., through look-up or algorithmic generation) according to whether the write operation involves a new-data write, or a revision to the location and/or data content of previously written data. New data writes (i.e., those not directed to a logical address having a pre-existing page table entry) are assigned a fixed slice assignment according to the selection state, thereby providing determinism in the new-write slice assignment. In the embodiment shown, for example, data slices are assigned in device-ascending order such that the least significant slice of the write data is stored in the next device to be annealed and each subsequent slice is stored in sequentially higher numbered devices, rolling over from device N to device 0 as necessary. Thus, in selection state 'a' in which device FD1 is the anneal target, slice assignment 2, 3, 4, 0 is applied for any new data write (i.e., ds0 in FD2, ds1 in FD3, ds2 in FD4 and ds3 in FD0). In selection state 'b' (anneal target=FD2), slice assignment 3, 4, 0, 1 is applied for any new data write; in selection state 'c' slice assignment 4,0,1,2 is applied and so forth. Expressed analytically, data slices 0 to n−1 are stored in flash devices FDx to FDx+n−1, respectively, where index x=index of anneal target+1, and wherein all index computations are modulo N (i.e., equal to the remainder of the computation result after integer division by N, where N=4 in the exemplary embodiment of FIG. 10C).

In contrast to new write operations, host-requested update operations or controller-directed data relocations (i.e., updates or relocations, collectively referred to as revisions) are effected by retrieving the previously recorded slice assignment from the page table and then reassigning any data slice assigned to the anneal target for the current selection state (i.e., the "current anneal target") to the alternate storage to produce a revised slice assignment. Thereafter, updates are completed by writing the entire updated data word to the operational memory set indicated by the revised slice assignment, while relocations may be effected by writing only the reassigned data slice in accordance with the revised slice assignment (i.e., reassigned data slice is retrieved from the anneal target (or scratch memory) and written to the alternate storage without rewriting the other slices of the subject data word).

Reflecting on the approach of FIG. 10C, it may be observed that, by the time an anneal target for a given selection state is fully evacuated, each data word within the operational memory set may have one of multiple possible slice assignments depending on whether the data word was rewritten (i.e., updated or relocated) or newly written during the selection state. More specifically, any data word rewritten within a given selection state may be stored with any one of the N revised slice assignments possible when slices are assigned in a device-ascending order. To appreciate this, consider the operation of an empty memory subsystem in selection state 'a' (as shown at 368). In this case, all data storage operations will be new writes and thus slice assignments are recorded in device-ascending order; assigning data slice ds0 to flash device 2 (the next device to be annealed) and data slices ds1, ds2 and ds3 to flash devices 3, 4, and 0, respectively. Hence the new-write slice assignment shown: 2, 3, 4, 0.

Thereafter, upon progressing to selection state 'b,' new data writes will be written with slice assignment 3, 4, 0, 1 (i.e., ds0 to FD3, ds1 to FD4, ds2 to FD0 and ds3 to FD1—device ascending order starting with flash device 3), and revisions (updates and relocations) will be carried out by retrieving the new-write slice assignment recorded in selection state 'a' (i.e., "2, 3, 4, 0" as only new data writes occurred in that state) and reassigning the slice assigned to the anneal target, FD2, to the alternate storage, FD1 (i.e., "2→1" as shown in the transition from selection state 'a' to 'b'). Thus, the overall slice assignment recorded in selection state 'a' is changed from "2, 3, 4, 0" to "1, 3, 4, 0," the underscore indicating the reassigned data slice. Note that after all data has been evacuated from the anneal target FD2, no data having the slice assignment recorded in selection state 'a' remains. That is, all entries within anneal target FD2 have been staled-out through host-requested update operations or controller-directed relocation operations. Accordingly, all entries in the page table will reflect one of the two slice assignments shown for selection state 'b.'

After progressing from selection state 'b' to selection state 'c', new writes are stored with slice assignment 4, 0, 1, 2 (device-ascending order starting with flash device 4) and data rewrites (updates/relocations) may occur starting from either of the two slice assignments recorded in selection state 'b.' Thus, reassigning the slice assigned to FD3, the new anneal target, to the alternate storage FD2, yields slice assignment 2,4,0,1 instead of 3,4,0,1 for the data newly written in selection state 'b,' and slice assignment 1,2,4,0 instead of 1,3,4,0 for data originally written in selection state 'a' then rewritten in selection state 'b'. As in selection state 'b', after data evacuation is complete in selection state 'c', all entries within anneal target FD3 have been staled-out through host-requested update or controller-directed relocation. Accordingly, all entries in the page table will reflect one of the three slice assignments shown for selection state 'c.'

After progressing to selection state 'd,' new writes are stored with slice assignment 0,1,2,3 and revisions may occur starting from any of the three slice assignments recorded in selection state 'c'. Thus, reassigning the slice assigned to FD4, the new anneal target, to the alternate storage FD3, yields slice assignment 3,0,1,2 instead of 4,0,1,2 for the data newly written in selection state 'c,' and slice assignment 2,3,0,1 instead of 2,4,0,1 for data originally written in selection state 'b' then rewritten in selection state 'c'; and slice assignment 1,2,3,0 instead of 1,2,4,0 for data originally written in selection state 'a' then rewritten in selection state 'b' and rewritten again in selection state 'c' (i.e., twice-rewritten data). As with the other selection states, after data evacuation is complete in selection state 'd', all entries in the page table will reflect one of the four slice assignments shown for selection state 'd' (i.e., all entries within anneal target FD4 have been staled-out through host-requested update or controller-directed relocation).

Finally, after progressing to selection state 'e', new writes are stored with slice assignment 1,2,3,4 and revisions may occur starting from any of the four slice assignments recorded in selection state 'c'. Thus, reassigning the slice assigned to FD0, the new anneal target, to the alternate storage FD4, yields slice assignment 4,1,2,3 instead of 0,1,2,3 for the data newly written in selection state d, and slice assignment 3,4,1,2 instead of 3,0,1,2 for data originally written in selection state 'c' then rewritten in selection state 'd' (once-rewritten data); slice assignment 2,3,4,1 instead of 2,3,0,1 for data originally written in selection state 'b' then rewritten in selection state 'c' and rewritten again in selection state 'd' (twice-rewritten data); and finally, slice assignment 1,2,3,4 instead of 1,2,3,0 for data originally written in selection state 'a' then rewritten in selection state 'b', again in selection state 'c' and again in selection state 'd' (thrice-rewritten data). After data evacuation is complete, all entries in the page table will reflect one of the five slice assignments shown for selection state 'e' (i.e., all entries within anneal target FD0 have been staled-out through host-requested update or through controller-directed relocation).

Observing the slice assignment patterns thus far described, there are exactly N possible device-ascending slice assignment patterns in any given selection state. Further, in the embodiment of FIG. 10C, each different slice assignment within a given selection state corresponds to rotation (i.e., modulo N shift) of the new-write slice assignment, with the assignment for each data slice being rotated by the number of selection state progressions (and thus the number of state-to-state rewrites) since the original data write. Thus, looking at the slice reassignments for selection state 'e', if one selection state progression has occurred (i.e., data newly written in selection state 'd'), then the new-write slice assignment for selection state 'e' is rotated by one to yield the revised slice assignment (i.e., 1,2,3,4 is rotated to 4,1,2,3). If three progressions have occurred (i.e., data newly written in selection state 'b'), then the new-write assignment for selection state 'e' is rotated by three to yield the revised slice assignment (i.e., 1,2,3,4 is rotated to 2,3,4,1). Further, because there are 4 possible slice assignments (i.e., N=4 in this example), any four selection state progressions will yield the same slice assignment pattern as the new-data write for that selection state (i.e., 1,2,3,4 rotated by 4 yields 1,2,3,4) and thus no rotation need occur. Stated another way, the rotation itself is modulo N, so that N unique slice assignment patterns exist for each of the N+1 selection states, thus representing a total of N*N+1 slice assignment patterns (4*5=20 slice assignment patterns in the example of FIG. 10C). In terms of determining the slice assignment within the anneal controller (or elsewhere in the memory controller), the new-write and revised slice assignments for a given selection state may either be looked up in a table or generated algorithmically (e.g., generated by logic circuitry within the anneal controller). In either case, a round-robin selection state sequence may be applied (thus ensuring a uniform number of anneal operations per device in each complete anneal cycle) without need for burdensome, multi-device data relocations in any single progression of the anneal-target selection state. Instead, data relocation in each selection state requires data transfer from anneal target to alternate storage only.

Figure 11A:
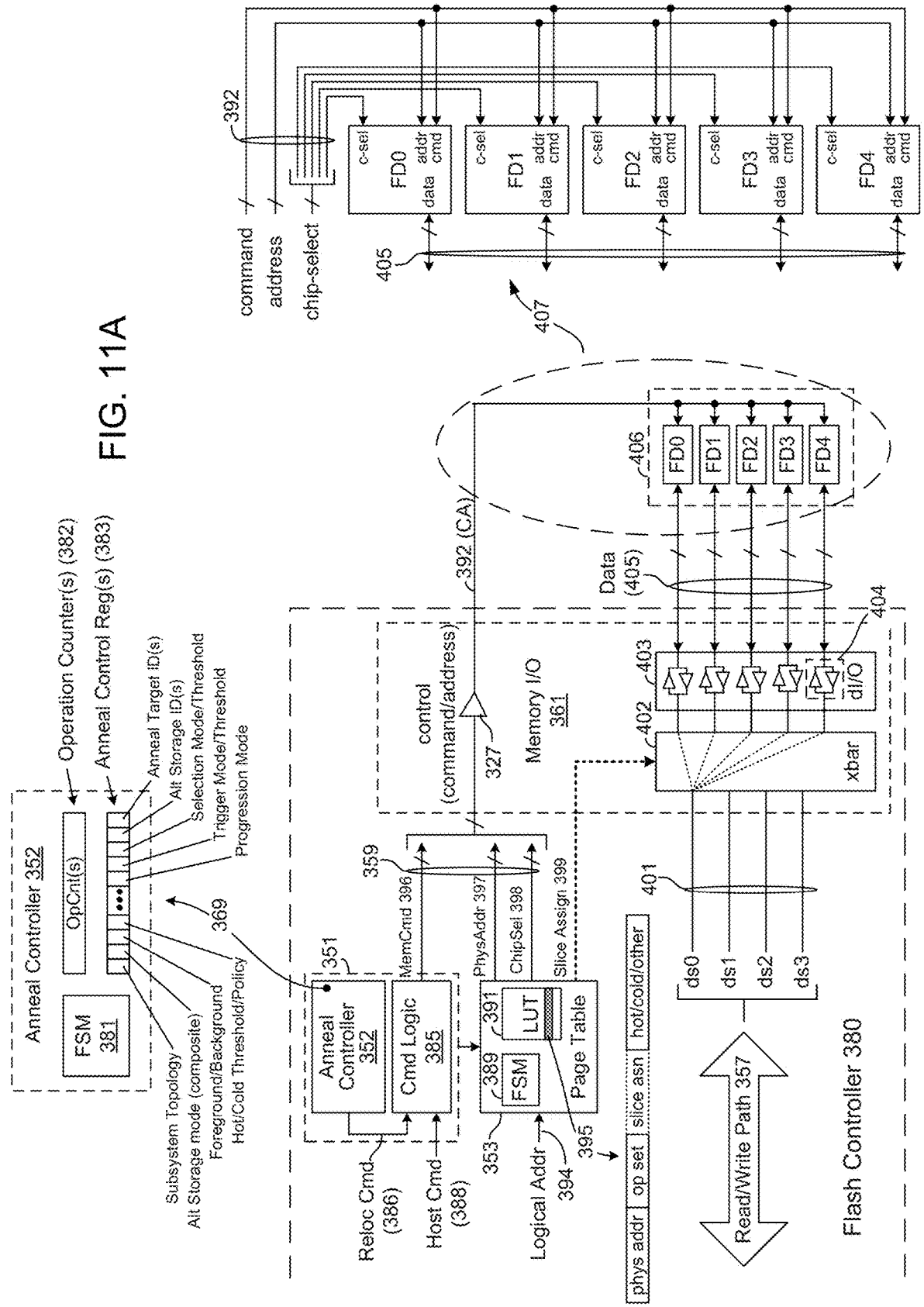
FIG. 11A illustrates a more detailed embodiment of a flash controller capable of managing the run-time-varying operational sets and corresponding slice assignments described in reference to FIGS. 10A-10C.

FIG. 11A illustrates a more detailed embodiment of a flash controller 380 capable of managing the run-time-varying operational sets and corresponding slice assignments described in reference to FIGS. 10A-10C. As shown, the control logic 351 includes a command logic circuit 385 that receives memory access commands 388 from the host (i.e., host-supplied access commands, "Host Cmd") as well as self-generated relocation commands 386 ("Reloc Cmd") from the anneal controller 352. Whether host-supplied or self-generated, each memory access command includes or is accompanied by a logical address 394 that is input to the page table 353 to enable retrieval of a corresponding page table entry 395, if any. The page table itself includes a page-table controller 389 (e.g., formed by a state machine (FSM) or other control logic) together with a lookup table 391 (LUT). The page-table controller 389 responds to the input logical address 394 by indexing the lookup table 391 to determine whether a corresponding entry has been recorded. If the command logic 385 indicates that a memory write is to be executed, and the lookup table 389 contains no entry corresponding to the logical address associated with the write command, the page-table controller 389 deems the write command to be a new data write and issues physical address, chip-select and slice-assignment signals accordingly. In one embodiment, for example, the page-table controller 389 receives a selection-state value from the control logic 351 (i.e., indicating the current anneal-target selection state) and applies that information to determine the operational memory set and a free physical address therein. Thereafter, the page-table controller 389 outputs the physical address 397 (e.g., at a desired time with respect output of the corresponding memory command 396 by the control logic 351) via a control path 359 and activates the subset of chip-select signals 398 (conveyed via chip-select lines that may be deemed part of control path 359) associated with the operational memory set to enable the appropriate subset of memory devices FD0-FD5 to receive the physical address and corresponding memory command. In one embodiment, output drivers 327 within the memory interface 361 are provided to output the memory command 396, physical address 397 and chip select signals 398 onto respective sets of signal lines that form external control path 392. Referring to detail view 407, the command and address signal lines of control path 392 are coupled in common to command ("cmd") and address ("addr") inputs of each of the flash memory devices (FD0-FD4) of an N+1 memory rank, while the chip-select lines are coupled to chip-select inputs ("c-sel") of respective flash memory devices to enable their independent selection. In alternative embodiments, the command and address signal lines may also be coupled to respective memory devices (i.e., dedicated command/address bus per flash memory device as opposed to having multiple flash memory devices coupled in common to the same command/address bus), and either the command, address, and/or chip-select lines may be eliminated and the signals otherwise conveyed thereon time-multiplexed onto another of the sets of signal lines.

Still referring to FIG. 11A, the page-table controller 389 also determines a slice assignment value 399 corresponding to the new-data write for the specified selection state, and outputs the slice assignment value to a slice-steering circuit 402 (e.g., implemented by a cross-bar switch, "xbar," in the embodiment of FIG. 11A) provided within memory interface 361. As shown, the slice-steering circuit 402 is coupled between internal data lanes 401 (part of internal read/write data path 357) and data receiver/output-driver circuits 404 within data I/O circuitry 403. By this arrangement, the N internal data lanes 401, each corresponding to a respective data slice (ds0-ds3), are output onto the appropriate subset of the N+1 data path slices (i.e., slices of external data path 405) coupled respectively to the N+1 memory devices of memory rank 406. In the particular embodiment of FIG. 11A, for instance, the exemplary five-device architecture described in the preceding figures is carried forward; thus five flash memory devices (FD0-FD4) are organized in an N+1 topology in which four flash memory devices constitute the operational memory set for a given memory access and the remaining flash memory device constitutes the anneal target (in the case of write operations) or alternate storage (in the case of a read that maps to the anneal target). Each of the memory devices in this topology are said to be connected in a point-to-point arrangement, that is, such that data lanes of each memory device are dedicated only to that memory device and are not connected with other devices. Further, four internal data lanes 401 are provided to convey data slices ds0-ds3 and are switchably coupled, via slice-steering circuit 402, to a respective subset of five data I/O circuits 404 according to the slice assignment value 399 provided from the page table 353. By this arrangement, the four flash memory devices that constitute the operational memory set will be selected (via assertion of corresponding chip-select signals 398) to receive the memory write command and corresponding physical address, and the four outgoing data slices will be routed to the selected operational set in an order controlled by the slice assignment value 399. Referring to FIGS. 10A-10C, for example, if the anneal controller specifies selection state 'a,' the page-table controller will apply that information to determine (by lookup or algorithmic generation) an operational set formed by devices 0,2,3,4 and slice assignment 0,2,3,4 (i.e., ds0 assigned to FD0, ds1 assigned to FD2, ds2 assigned to FD3 and ds3 assigned to FD4) in the case of the anneal progressions for FIGS. 10A and 10B, or slice assignment 2,3,4,0 in the case of the FIG. 10C anneal progression. To conclude the new data write, the page-table controller 389 inserts a new entry corresponding to the input logical address 394 into the lookup table 391 to specify the physical address, operational set and slice assignment of the newly written data. Note that the page table entry may be created and inserted into the lookup table 391 prior to, concurrently with, or after the data write operation itself.

Continuing with FIG. 11A, if the page-table controller 389 determines that the incoming logical address 394 does match an existing page-table entry and a host-directed memory-write command is indicated, then an update operation is to be carried out with respect to the specified logical address. In that case, the page-table controller 389 may operate differently according to whether the slice assignment per selection state is fixed or variable. In the case of the fixed slice-assignment approaches (i.e., as discussed in reference to FIGS. 10A and 10B), the page-controller 389 determines (e.g., by table lookup and/or algorithmic generation) the operational set and corresponding slice assignment for the current selection state, as well as an available physical address within the operational set. Thereafter, the page-table controller 389 outputs the physical address 397 via the control path 359 and raises the chip-select signals 398 associated with the operational memory set, and provides the slice-assignment value 399 to the slice-steering circuitry 402. In the case of a dynamic (variable) slice-assignment embodiment, the page-table controller 389 effects a data update operation by generating the new slice assignment in accordance with the last-recorded operational set and slice assignment. Thus, if the last-recorded operational set matches the operational set for the current selection state (i.e., the selection state has not progressed since the last data write operation for the specified logical address), the same slice assignment is applied, but at a different physical address (as data is not updated in place, at least in the case of the exemplary flash memory subsystem of FIG. 11A). If the last-recorded operational set does not match the operational set for the current selection state (i.e., the selection state has progressed), then the slice assignment recorded for the last selection state is applied to lookup or generate a new slice assignment to be applied in the update operation. Following the approach shown in FIG. 10C, for instance, the first digit of the last-recorded slice assignment and the current selection state may be used to index a lookup table and thus retrieve the current slice assignment. For example, if the current selection state='b,' then the four possible indices from prior selection state 'a' will yield new slice assignments as follows: 2–>1,3,4,0; 0–>0,1,3,4; 4–>4,0,1,3; 3–>3,4,0,1. Alternatively, the new slice assignment may be generated by rotating the new-write slice assignment by the progression count (i.e., number of anneal progressions since the data was originally written); a value determined in turn by, for example, the offset between last digit of the new-write slice assignment for the current selection state and the last digit of the previously recorded slice assignment. Thus, if in selection state 'c' and the last digit of the previously recorded slice assignment was 0,1,3,4 (last digit=4), then the new-write slice assignment=4,0,1,2 is rotated by the offset between 2 and 4 (using modulo arithmetic such that 2−1=1; 2−0=2; 2−4=3; and 2−3=4) thus generating the desired slice assignment value: 0,1,2,4. Various alternative approaches to slice assignment generation may be used, including alternatives that produce different slice assignment progressions than those shown in FIG. 10C.

Still referring to FIG. 11A, if logical address 394 is provided in connection with a relocation command 386, then a controller-directed relocation operation is carried out with respect to the specified logical address. In that case, as with update operations, the page-table controller 389 may operate differently according to whether the slice assignment per selection state is fixed or variable. In the case of the fixed slice-assignment approaches (i.e., as discussed in reference to FIGS. 10A and 10B), the page-table controller 389 determines (by lookup and/or algorithmic generation) the operational set and corresponding slice assignment for the current selection state, as well as an available physical address within the operational set. Thereafter, the flash controller 380 outputs the physical address together with a memory read command and the chip-select signal(s) corresponding to the memory device(s) to be accessed in the relocation operation. Data to be relocated is thus read from one or more selected memory devices and returned to the flash controller 380 for a shunt write to the alternate storage or to be stored for later write back to the alternate storage. In the shunt read/write case, upon receiving the data being relocated from the anneal target (and other devices if multiple slices of data are being relocated), the flash controller 380 asserts the chip-select signal(s) associated with the memory device(s) to which data is being relocated, and asserts a write command and physical address to be written to enable data write in the selected devices. Thus, in the embodiments of FIGS. 10B and 10C, and single-slice relocation operations in the embodiment of FIG. 10A (i.e., for all selection state progressions shown in FIG. 10A except from 'e' to 'a'), a memory read is carried out at the anneal target to retrieve the slice being relocated, and then a memory write is carried out at the alternate storage to complete the relocation operation. In the case of a shunt read/write, the read and write operations may be carried out back-to-back (i.e., without intervening operations over the data path 405) and thus the page table may be updated upon completion of the operation by revising the page table entry to include the alternate storage in the slice assignment in place of the anneal target, but without requiring change to the physical address. In the case of a two-phase relocation operation (i.e., temporarily storing retrieved data in scratch memory and then later writing back to alternate storage), the page table 353 may be updated following the data retrieval phase to reflect storage in a scratch memory (indicating the storage address within the scratch memory, although a FIFO or stack architecture may be used to avoid explicit scratch memory addressing requirements), and then updated again following the data write phase to reflect the completed relocation operation. Note that, in the multi-slice relocation operation shown in the state 'e' to 'a' progression in FIG. 10A, a new physical address may be required to effect the data relocation (e.g., as in the case of a flash memory subsystem of FIG. 11A or other memory technology that does not permit data to be rewritten in place.)

Still referring to FIG. 11A, detail view 369 illustrates a general embodiment of an anneal controller having a finite state machine 381 (or processor sequencer or other control circuitry), one or more operation counters 382 and one or more anneal control registers 383. The state machine 381 transitions between states to manage the event sequence within a given anneal operation as well as the progression through different anneal target selection states in an anneal cycle. The operation counters are used to track various operations and events within the memory subsystem (e.g., memory accesses, program/erase operations, bad-block or other error/failure detections, etc.) and thus may be evaluated by the state machine 381 in progressing through the evacuation phases of an anneal operation, performing device selection, triggering anneal, etc. For example, by counting program/erase cycles during each target selection state, separate program/erase counts may be tracked for each memory device and used to trigger an anneal in that device, and/or manage the progression from passive to active evacuation modes. The operation counter may also include multiple counters used to track operations in respective memory devices. For example, in one embodiment, the operation counters 382 include a program/erase counter and error counter for each memory device, as well as a global access counter used to track the net number of memory write operations (and/or a combination of memory read and write operations) within the memory subsystem. The device-specific program/erase counts may then be incremented for the program/erase operations performed in the corresponding memory device, and the error counters used to count error detections in the corresponding memory devices (e.g., program/erase failure, bit errors as indicated by error-correction-codes or other error information, bad-block detections, etc.). The global access counter may be used, for example, to enable the anneal controller to distinguish between hot and cold pages within the memory subsystem (e.g., even read operations have a bearing on whether a page is hot or cold). In one embodiment, for instance, the global access count value is stored within the page table entry whenever a memory page is updated, thus enabling determination of the recency of the data storage (e.g., by comparing the stored access count value with the current access count value) and thus a determination of whether the page is hot or cold (e.g., by comparing with a recency threshold).

The anneal control registers 383 may be used to store host-programmed (or operator-programmed) values as well as variables or other state information for controlling operation of the anneal controller. In the embodiment shown, for example, the anneal control registers (which may be a single register or group of registers having multiple fields) are used to store an identifier (ID) of the anneal target and the alternate storage, as well as a value that indicates the device selection mode (fixed or programmable selection sequence and any thresholds used for device selection), the anneal trigger mode (e.g., elapsed or calendar time, error rate, error count, program/erase count, etc.), the anneal progression mode (e.g., round-robin progression with fixed slice-assignment, oscillating progression, round-robin progression with variable slice-assignment, etc.), the subsystem topology (e.g., sliced, multi-drop, multi-channel, etc.), the nature of the alternate storage (composite or unified), whether anneal operations are to be carried out in the foreground or background, whether to enable burst and/or compressed anneal (both discussed below), hot/cold (or other data usage grade) thresholds and/or policy (e.g., whether recency of access, frequency of access and/or other criteria are to be used to distinguish between usage grades), or any other programmatically or dynamically defined behavior of the run-time annealable system. It should be noted that while anneal control registers 383 are shown within anneal controller 352 (and within flash controller 380), such registers or any subset thereof may alternatively or additionally be disposed within one or more (or all) of the memory devices within the annealable memory subsystem, or in a separate integrated circuit device, remote from the anneal controller (and flash controller) and memory devices.

Figure 11B:
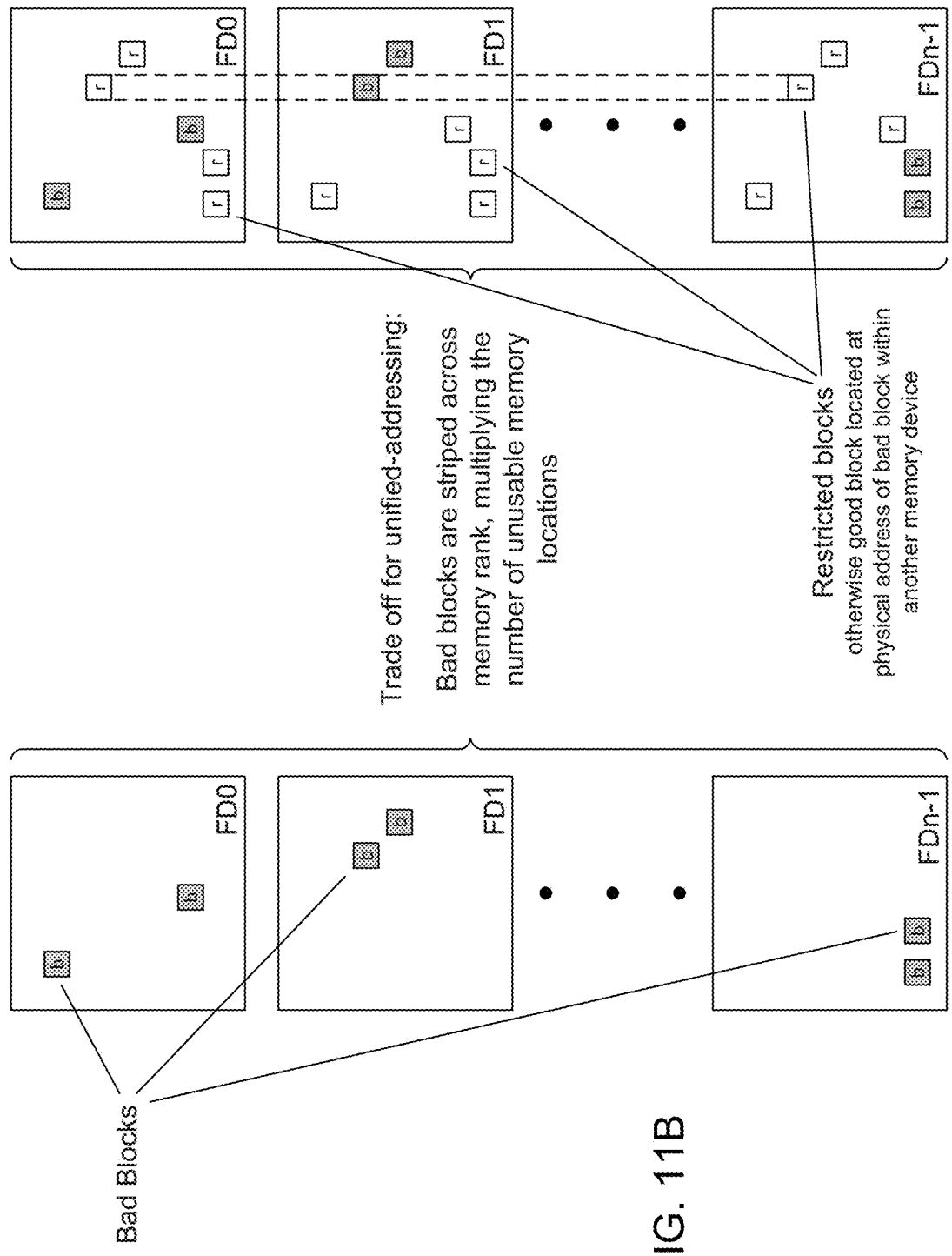
FIG. 11B illustrates a consequence of the shared-command/address architecture of FIG. 11A.

FIG. 11B illustrates a consequence of the shared-command/address architecture of FIG. 11A. That is, in a memory subsystem populated by one or more ranks of devices that exhibit localized regions of defective or unreliable storage, the defective regions in one memory device restrict access to otherwise functional regions in other devices of the same rank due to their common physical address. For example, if it is desired to stripe data across plural flash memory devices by effectively striping data across all devices at physically-corresponding locations, bad blocks within a flash memory device (see FIG. 11B) could render corresponding good blocks within other flash memory devices unavailable. That is to say, in such an implementation, access to the otherwise functional blocks is restricted as the bad block would be effectively striped across all the flash devices of the memory rank, multiplying the amount of unavailable storage by the number of memory devices of the rank.

Figure 11C:
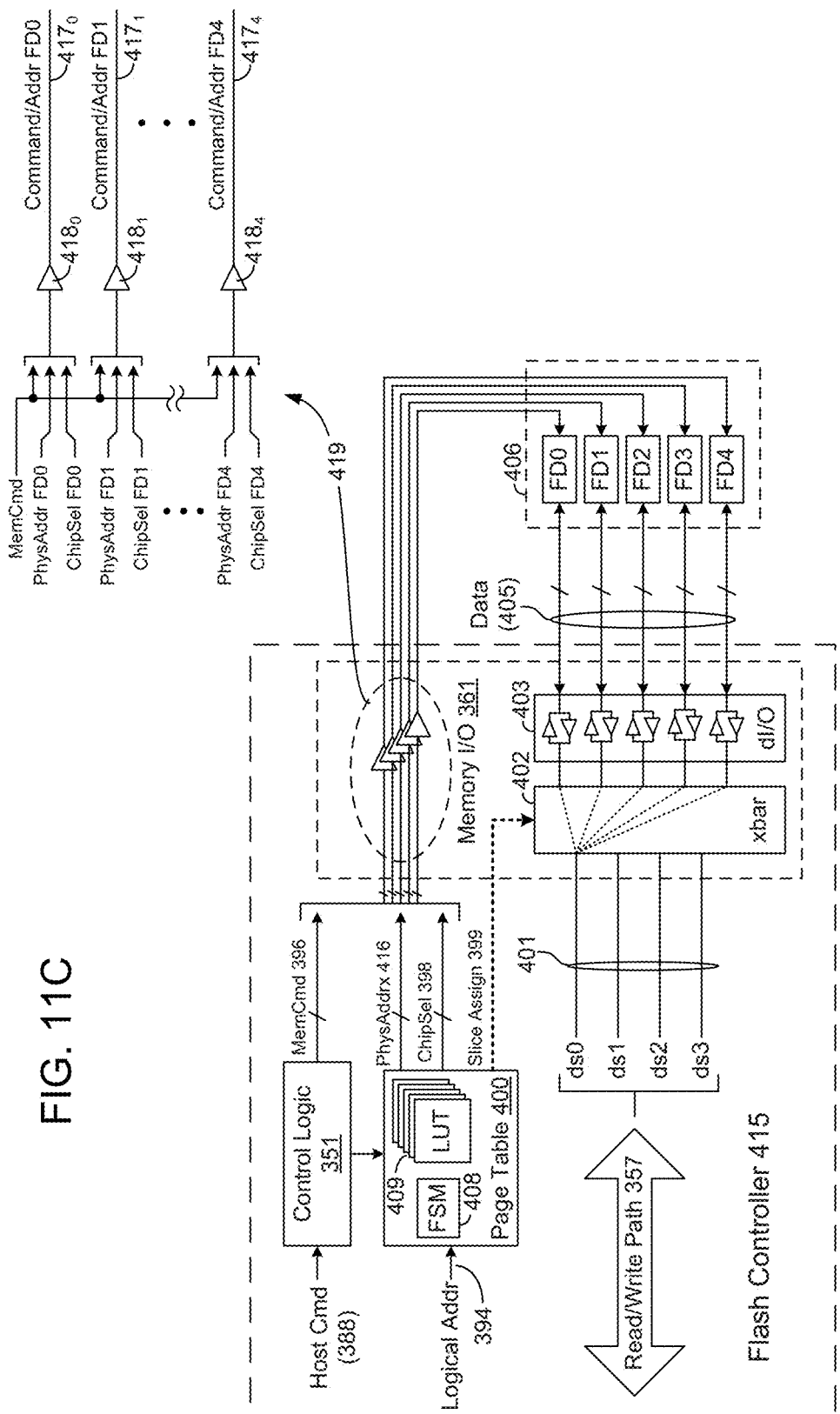
FIG. 11C illustrates an alternative rank-based memory architecture in which a flash controller is coupled to each flash memory device of a memory rank by a dedicated command/address path.

FIG. 11C illustrates an alternative rank-based memory architecture in which a flash controller 415 is coupled to each flash memory device FD0-FD4 of a memory rank 406 by a dedicated command/address path $417_0$-$417_4$. Further, the page table 400 within the flash controller 415 is provided (along with state machine 408) with multiple address lookup tables (LUTs) 409 to enable each incoming logical address 394 to be independently (and therefore individually and differently) mapped to a physical address within a corresponding flash memory device. In this implementation, bad block information for each memory device can be separately managed, as an alternative to striping. For example, an incoming or self-generated (i.e., by the anneal controller) virtual address 394 may be used to index each of the address lookup tables 409 simultaneously, thus providing multiple physical addresses that are output via respective address paths 416 to corresponding flash devices. More specifically, as shown in detail view 419, a single (shared) memory command 396 may be output to each of the flash memory devices in conjunction with a respective physical address (e.g., PhysAddr FD0, PhysAddr FD1, . . . PhysAddr FD4) and chip select signal (ChipSel FD0-ChipSel FD4, determined according to the slice assignment 399). As shown, the command/address information for each memory device is driven onto a corresponding one of the dedicated command/address paths $417_0$-$417_4$ by a respective one of command/address output drivers $418_0$-$418_4$. By this arrangement, bad-block addresses for each of the flash memory devices may be omitted from the virtual-to-physical address mapping for that memory device only, thus avoiding the need to stripe the bad-block address across the entire memory rank. The freedom to apply different physical addresses to respective memory devices during a given memory access operation also permits different wear-leveling progressions to be applied within the different memory devices (e.g., to account for access differences within the different memory devices due to dynamic slice assignment or other effects). Other circuit blocks and signals shown in FIG. 11C (e.g., control logic 351, cross-bar 402, data I/O circuit 403, read/write path 357, etc.), correspond to and may generally be implemented in the same manner as like-numbered circuit blocks and signals described in reference to FIG. 11A.

It should be noted that independent control over the flash memory devices of a memory rank may also be achieved using the shared command/address, dedicated chip-select topology of FIG. 11A. For example, memory access commands and/or memory addresses may be time-multiplexed onto the shared command/address path (i.e., sent one after another), with the dedicated chip-select lines being used to control which of the memory devices is enabled to receive a given command/address. Although additional latency may be incurred in issuing commands and addresses to the individual devices under such a topology, the accesses to the individual memory devices may be pipelined so that throughput (i.e., memory bandwidth) will remain unaffected.

FIG. 11D illustrates an embodiment of a parallel-lookup page table 425 that may be used to implement page table 400 of FIG. 11C and thus enable dedicated command/address paths to respective memory devices within a memory rank. As shown, an incoming logical address is compared with the contents of a logical address table 428 for the page table entries, yielding a hit/miss signal 437 (indicating whether a matching logical address has been detected) and an index 436 of the matching logical address, if any. Assuming a hit within the logical address table 428 (which may be implemented, for example, by a content addressable memory or other parallel-compare circuitry), the index 436 is applied to address each of a set of lookup tables that correspond to respective flash memory devices, FD0-FD4. By this operation, the index 436 is used to simultaneously read out multiple physical addresses that correspond to respective memory devices (as well as any other device-specific data). As shown, the index is also provided to a unified lookup table to obtain the operational memory set, slice assignment, hot/cold page information and any other device-independent data (i.e., data that defines the overall memory access and thus need not be stored in multiple instances in the devices-specific lookup table). In a memory read operation, the slice assignment retrieved from the table ("Read SA") is selected via multiplexer 434 to be the slice assignment 399 for the memory access. By contrast, in a memory write (or update) operation, the write slice assignment ("Write SA") may be supplied by the control logic (e.g., according to the target selection state and progression policy) via control port 432 and selected (in response to a read/write specifier, "Rd/Wr," also supplied via control port 432) by multiplexer 434 as the slice assignment 399 for the memory access.

In one embodiment, hot/cold information is recorded for each virtual address by storing an access count value within the corresponding entry of table 430. More specifically, the access count value (i e, maintained by a counter within the anneal controller as described in reference to FIG. 11A) is stored within lookup table 430 as part of each memory read or write (or alternatively only for a memory write access) to the corresponding virtual address. By this operation, the control logic (or anneal controller therein) may supply the current access count to the page table along with a virtual address and thus enable retrieval of the stored access count value and determination of a difference between the stored access count value and the current access count value within recency logic 433. In one embodiment, recency logic 433 receives a hot/cold threshold (e.g., from an anneal control register as described in reference to FIG. 11A) and compares the difference between the stored and current access count values with the threshold. By this operation, recency logic 433 may generate a hot/cold signal 439 that indicates whether the difference between the stored and current access count exceeds the threshold and, accordingly, whether the page is hot (difference less than threshold) or cold (difference greater than threshold). Various alternative hot/cold determinations (e.g., based on access frequency rather than or in addition to access recency), and alternative memory usage gradations may be determined and signaled by logic within the page table or elsewhere within the flash controller in alternative embodiments.

Figure 12:
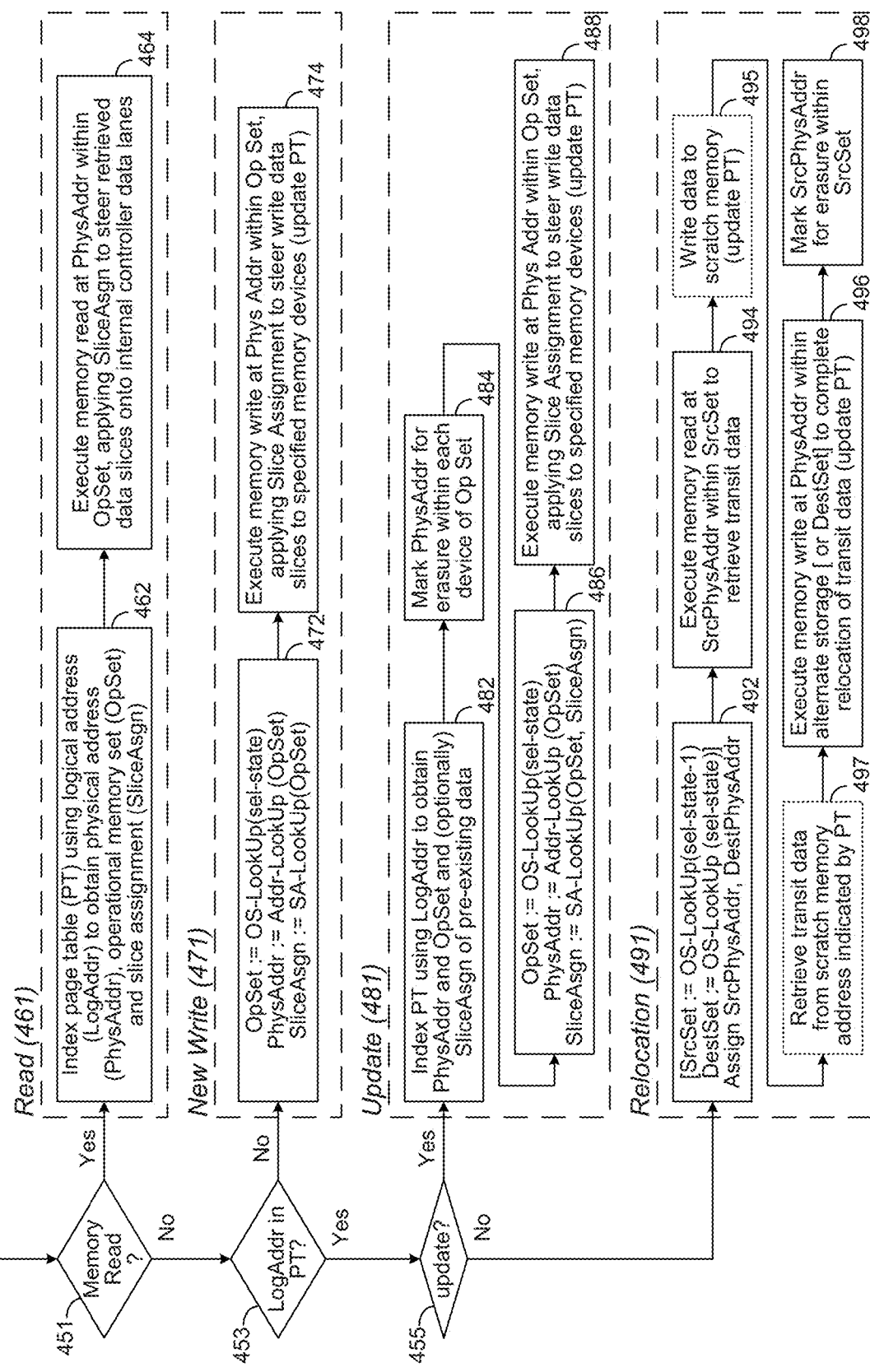
FIG. 12 is a flow diagram illustrating an exemplary sequence of operations that may be carried out by the flash controller of FIGS. 7A-7B (and FIG. 11) in response to host-requested or self-generated memory access commands.

FIG. 12 is a flow diagram illustrating an exemplary sequence of operations that may be carried out by the flash controller of FIGS. 7A-7B (and FIGS. 11A, 11C) in response to host-requested or self-generated memory access commands. If the memory access command is a memory read (determined in decision block 451), the flash controller executes the operational sequence shown at 461. More specifically, at 462, the flash controller indexes the page table using the logical address supplied in the memory access command and thereby obtains the physical address, operational memory set and slice assignment for the requested data. Thereafter, at 464, the flash controller executes the memory read at the physical address within the operational memory set, steering the retrieved data slices on the internal controller data lines according to the slice assignment.

If the commanded access is not a memory read, the flash controller determines whether the supplied logical address (i.e., supplied as part of or in association with the memory access command) is in the page table at decision block 453. Otherwise, the flash controller deems the memory access to be either an update operation or a relocation operation according to, for example, a flag indicating whether the supplied address is a logical address (update operation) or physical address (relocation operation) and/or a flag indicating whether the command and/or logical address was self-generated or host-requested.

In the case of a new-write, the flash controller executes the operational sequence shown at 471. More specifically, at 472, the flash controller determines the operational set according to the current selection state and then determines the physical address and slice assignment of the data write operation according to the operational set. In the embodiment shown, the operational set, physical address and slice assignment are determined by respective lookup operations; for example, indexing a operational-set lookup table (OS-LookUp) using the current selection state, indexing a next-free-address lookup table (Addr-LookUp) using the operational set, and indexing a slice assignment table (SA-LookUp) using the operational set. In alternative embodiments, the flash controller may determine the operational memory set, physical address and/or slice assignment algorithmically. As a specific example of algorithmic assignment, the slice assignment may match (or otherwise be derived from) the operational memory set itself. In any case, the flash controller executes a memory write operation as shown at 474, writing to the physical address within the operational memory set and steering the write data slices from the internal data lanes of the flash controller to respective memory devices of the operational set in the order specified by the slice assignment. The page table is updated during or at the conclusion of the write operation to reflect the address translation (logical-to-physical), operational memory set and slice assignment. Note that the slice assignment need not be recorded in the page table if fixed according to the operational memory set or otherwise determinable.

The flash controller responds to an update command (i.e., a memory write command for which the logical address is found to match a pre-existing entry within the page table) by executing the operational sequence shown at 481. Starting at 482, the flash controller indexes the page table using the logical address to obtain the physical address, operational memory set and, if necessary to determine the new slice assignment, the slice assignment of the pre-existing data. Because the updated data value (i.e., the data to be written and supplied in association with the logical address) will be written at a new physical address within a potentially new operational set, the flash controller marks the physical address for erasure for each device of the operational set at 484. Thereafter, at 486, the flash controller determines the operational set for the current selection state, then determines the next free physical address and the slice assignment for that operational set. Note that the slice assignment for the write operation may be determined without regard to the past slice assignment in a fixed-slice-assignment embodiment (e.g., as in FIG. 10B or 10C), while the past slice assignment is referenced to determine the next slice assignment in a variable-slice-assignment embodiment (e.g., as in FIG. 10A). After determining the operational memory set, physical address and slice assignment, the flash controller executes a memory write at 488, writing the updated data at the physical address within the operational memory set, and steering slices of the updated data from the internal data lanes to respective memory devices of the operational set in an order indicated by the slice assignment. After or during the update operation, the page table is updated to indicate the new physical address as well as the operational set and slice assignment (either of which may be derived from the other and thus implicitly indicated by the page-table entry) of the updated data.

In the case of a relocation command, the flash controller executes the generalized operational sequence shown at 491, starting at 492 by determining source and destination memory sets (SrcSet, DestSet) and assigning corresponding source and destination addresses (SrcPhysAddr, DestPhysAddr) for the relocation operation. The source memory set is a set of one or more memory devices from which the data to be relocated (the "transit data") is to be retrieved using the source address, and the destination memory set is a counterpart set of one or more devices to which the transit data is to be relocated (i.e., written) at the destination address. In the case of single-slice relocation operations (i.e., data slice relocated from anneal target to alternate storage while leaving other slices of same data word in place), the source and destination memory sets reduce to the anneal target and alternate storage, respectively, and the source and destination addresses may be the same physical address (i.e., the physical address supplied with the relocation command) By contrast, in a multi-slice relocation (i.e., multiple slices of the same data word being relocated), the destination memory set includes all (or at least a plural subset) of the devices of the operational memory set for the current selection state, and the source memory set includes all (or at least a plural subset) of the devices of the operational memory set for the preceding selection state. Further, in any multi-slice relocation in which the same memory device is included in both the source memory set and the destination memory set, and in which data is not being or cannot be rewritten in place, the command-supplied physical address constitutes the source address, but a new destination address is determined and applied (as the physical storage addresses within the memory device being both read and written requires erasure before re-use). As an example, in the progression from selection state 'a' to selection state 'e' in the approach of FIG. 10A, a multi-slice relocation is carried out in which data slices are retrieved from flash devices FD1-FD4 (i.e., source set=operational memory set of selection state 'e') and written to flash devices FD0, FD2-FD4 (i.e., destination set=operational memory set of selection state 'a'). Because memory devices FD2-FD4 appear in both the source and destination sets (i.e., data slices are read from those devices and different data slices are relocated within those devices), the physical address from which the data is retrieved within the source memory set is different from the physical address to which the data is written within the destination memory set. Thus, within the generalized relocation sequence of FIG. 12, at 494 the flash controller executes a memory read at the source address (SrcPhysAddr) within the source memory set (SrcSet) to retrieve the transit data (i.e., data being relocated). Where the source memory set reduces to the anneal target (e.g., embodiments of FIGS. 10B, 10C and all selection state progressions within embodiment of FIG. 10A except from state 'e' to 'a'), only the anneal target is accessed (i.e., asserting the chip-select line for the anneal target, but not the other memory devices of the rank) to effect a single slice retrieval. Where the source memory set includes multiple devices, each of those devices is accessed to retrieve a multi-slice transit data value, applying the slice assignment value for the source memory set (e.g., the slice assignment for selection state 'e' in the approach of FIG. 10A) to route the individual data slices in ascending order onto the internal data lanes of the flash controller (i.e. ds0 onto internal lane 0, ds1 onto internal lane 1, etc.).

Continuing with the relocation sequence 491, in the case of a two-phase relocation operation, the transit data retrieved from the source memory set is written to the scratch memory at 495 and the page table updated to reflect the new storage location. Thereafter, at 497, the flash controller retrieves the transit data from the scratch memory address indicated by the page table, and proceeds to execute a memory write at 496. In a single-phase relocation operation, the scratch memory write and read operations at 495 and 497 are skipped (hence their presentation in dashed outline within FIG. 12), and the flash controller proceeds directly from data retrieval at 494 to the data write at 496.

In the data write operation at 496, the transit data is written to the destination address (DestPhysAddr) within the destination memory set (DestSet), applying any slice reassignment as necessary. For a single-slice relocation, writing to the destination address is a single-slice write to the alternate storage. By contrast, in a multi-slice relocation, multiple slices are written to the destination memory set, with slices being routed from the internal data lanes of the flash controller to respective memory devices according to the slice assignment for the destination memory set (e.g., applying the slice assignment value for selection state 'a' in the approach of FIG. 10A). Finally, upon completing the data write operation (or concurrently therewith), the source address within the source memory set (i.e., the anneal target in the case of a single-slice relocation, or multiple memory devices in the case of a multi-slice relocation) is marked for immediate or eventual erasure at 498.

Anneal Operations within a Multi-Drop Topology

Figure 13:
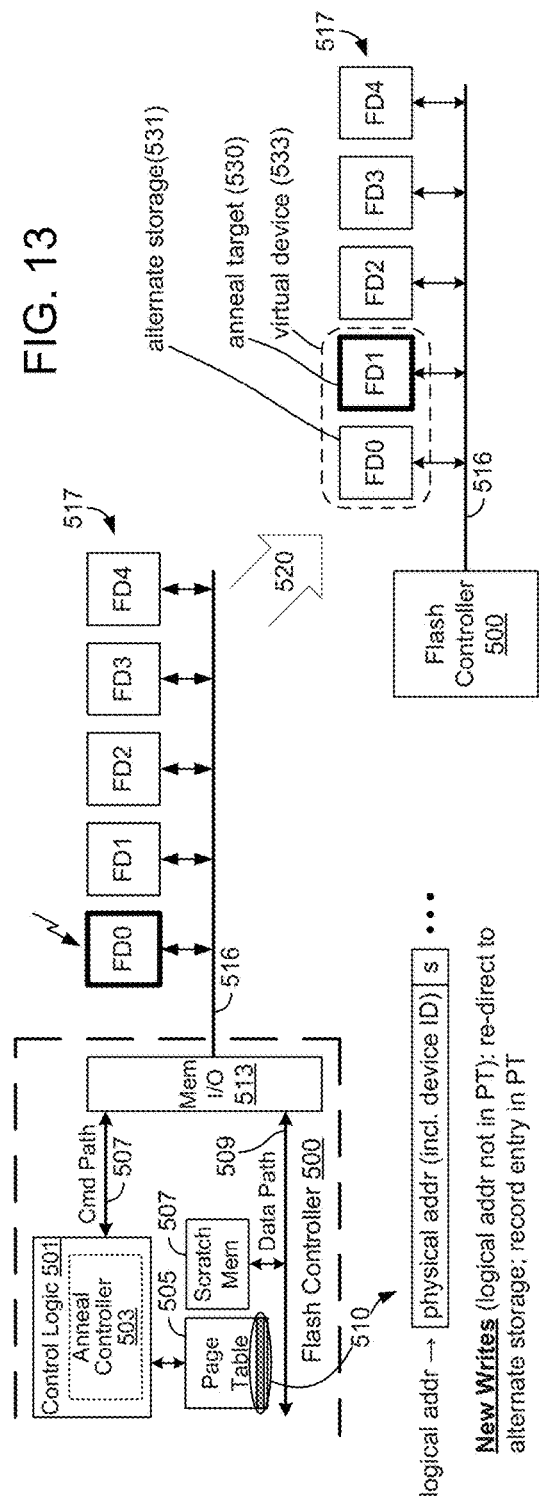
FIG. 13 illustrates an embodiment of an annealable multi-drop memory system.

Anneal operations may be carried out within a multi-drop topology in generally the same sequence as in a sliced topology, with the memory controller progressing to a new anneal target and alternate storage for each of a sequence of target selection states. FIG. 13 illustrates this operation, showing a flash memory controller having the same general structure described above (i.e., including control logic 501 with integral anneal controller 503, page-table 505, scratch memory 507, internal data path 509, control path 511, host I/O (not shown) and memory I/O 513), but coupled to a set of flash memory devices 517 (FD0-FD4) via multi-drop data path 516 instead of respective slices of a sliced data path. In an embodiment where each of the flash memory devices 517 is part of a respective rank of memory devices (i.e., data path 516 is but one slice of a sliced data path as shown, for example, at 322 of FIG. 6A) and each memory rank includes one or more spare memory devices, then the rank-based anneal management described above may be applied to anneal each memory device in each rank. More specifically, the spare device within a given rank may be used as the alternate storage and thus paired with the anneal target for the selected rank to form a virtual device for memory read, write and relocation purposes. In such an embodiment, the anneal target may be sequenced either by progressing through the memory devices of each rank before proceeding to the next rank, or by progressing through the memory devices coupled to a given slice of the data path (i.e., progressing through the "slice" of memory devices) before proceeding to the next slice.

If a given flash memory device coupled to multi-drop data path 516 is not part of an N+ memory rank (i.e., a memory rank having one or more spare memory devices), then the alternate storage for that device may be formed by one or more other flash memory devices within the same slice of devices. Referring to view 520 of FIG. 13, for example, flash devices FD1 and FD0 constitute the anneal target 530 and alternate storage 531, respectively, of a virtual device 533. As shown, and as with anneal operations in the N+1 rank architecture described above, anneal operations within such an N+ slice architecture (i.e., one or more spare memory device per slice of N devices) may be carried out by re-directing new writes and updates from the anneal target 530 to the alternate storage 531, and directing memory reads to either the alternate storage 531 or the anneal target 530 according to the device specified in the page table 505 for the address of interest. Also, if data is retrieved from the anneal target as part of a memory read, the data may be copied to the scratch memory 507, setting a flag in the corresponding page-table entry (and recording the scratch memory location in the page table entry or an associated location) to enable subsequent transfer from scratch memory 507 to alternate storage 531. As shown at 510, entries within page table 505 may follow generally the same format as the page table entries for the N+1 rank architecture, except that the physical address includes not only the internal memory address of the stored data, but also a device identifier or number (i.e., device address) to identify the physical storage device within the slice of devices. As with update and write operations within the N+1 rank architecture, the page table may be updated after each write or update operation to show the alternate storage 531 as the repository of the updated or newly written data and, if an update, to invalidate (or mark for erasure) the corresponding entry within the anneal target 530. If data is captured in the scratch memory 507 following a read from the anneal target 530, the source location within the anneal target may optionally be invalidated or marked for erasure (i.e. via page table update), thus leaving the scratch memory as the only valid source of the retrieved data. Alternatively, the source location within the anneal target 530 may not be invalidated/marked-for-erasure until after the data is written to the alternate storage 531 to complete the relocation operation.

Figure 14:
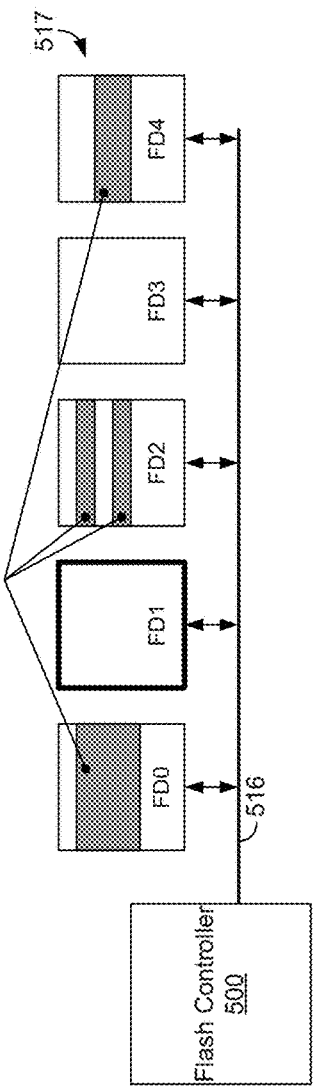
FIG. 14 illustrates an exemplary operation of the annealable multi-drop memory system of FIG. 13 in which composite storage is used to store data evacuated from the device to be annealed.
Figure 16:
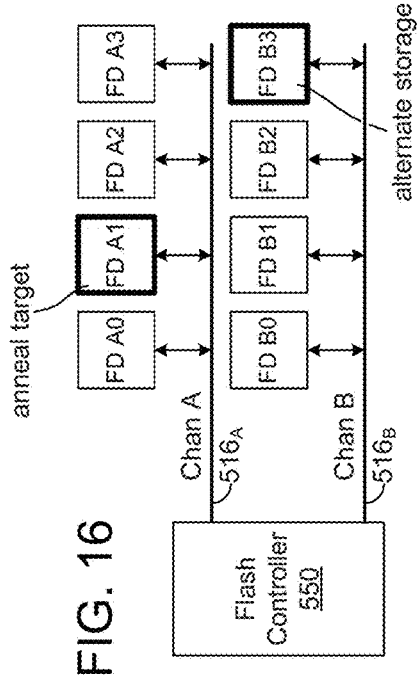
FIG. 16 illustrates an alternate approach to pairing devices within an annealable multi-channel memory system.

In contrast to memory devices of a rank, the memory devices of a given slice are generally not simultaneously accessed and thus need not be constrained by slice-ordering considerations. Accordingly, any of the memory devices of the slice may be used as alternate storage 531 for a given anneal target 530, and the alternate storage selection may change from one anneal cycle to the next. More generally, as shown in FIG. 14, the alternate storage need not be a single memory device, and instead may be a composite storage 540 that includes available storage regions in two or more other devices of the slice. In that case, the composite alternate storage need only have sufficient capacity to hold the valid content of the anneal target and thus may constitute a substantially smaller storage area than the total capacity of the anneal target. Accordingly, data relocated from anneal target to the composite storage may coexist with other data originally written within the memory devices that contribute the composite storage). Also, as shown by the shaded regions that denote the component regions of the composite storage, two or more non-contiguous regions may be contributed by one memory device, and different amounts of storage may be contributed to the composite alternate storage by each participating device.

Anneal Operations within a Multi-Channel Memory Topology

Figure 15:
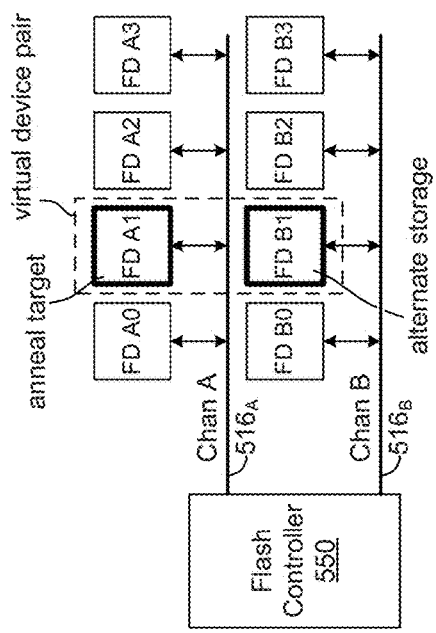
FIG. 15 illustrates an embodiment of an annealable multi-channel memory system and an exemplary pairing of devices therein.

FIGS. 15-19 illustrate anneal operations carried out within a multi-channel run-time annealable memory system. In contrast to memory devices coupled to respective slices of a data path, memory devices coupled to the memory controller via respective channels are generally independently controlled. In one embodiment, for example, separate command/address paths are provided to the devices of each channel (i.e., each set of same-channel devices share a command/address path that is separate from the command/address path coupled to another set of same-channel devices) so that entirely different memory transactions may be carried out concurrently (i.e., at least partly overlapping in time) within the different channels. Thus, referring to FIG. 15, a memory read at address X within flash device 3 of channel A (i.e., device FD A3, coupled to flash controller 550 via memory channel $516_A$) may be carried out concurrently with a memory write to flash device 0 of channel B (FD B0, coupled to flash controller 550 via memory channel $516_B$). Thus, in an embodiment in which the virtual device pair is drawn from devices of the same channel (noting that the channel itself may be sliced, multi-drop or both), passive and active data evacuation operations may be carried out in that channel concurrently with live memory accesses (and/or passive and active data evacuations) in another channel. Alternatively (or additionally), the virtual device pair may be formed by devices from respective channels. In one embodiment, shown for example in FIG. 15, devices from the same slice position (0, 1, 2 or 3) but respective memory channels (516A, 516B) are selected to form a sequence of virtual device pairs, annealing each of the devices of a given memory channel in turn before reversing the anneal target/alternate storage selection to progress through the devices of the other channel. In the embodiment of FIG. 15, for example, the progression may be: FDA0/FDB0, FDA1/FDB1, . . . , FDAn−1/FDBn−1, FDB0/FDA0, FDB1/FDA1, . . . , FDBn−1/FDAn−1, where the first device in the format FDi/FDj is the anneal target and the second is the alternate storage, and 'n' is the number of devices within each channel. Alternatively, the progression may alternate ("ping-pong") between the two memory channels as in FDA0/FDB0, FDB0/FDA0, FDA1/FDB1, . . . .

Instead of pairing like-positioned devices from the two channels in each virtual device pair, one or more virtual device pairs in each progression (or all the virtual device pairs) may be formed without regard to device position. For example, in the embodiment of FIG. 16, devices FDA1 and FDB3 are paired. This embodiment may be useful, for example, where one channel exhibits spare capacity. For example, to the extent that FDB3 is otherwise vacant, that device may be used as the alternate storage of not only the devices of channel A (e.g., evacuating from a given device within channel A into FDB3, and then reloading the evacuated device after it has been annealed so that FDB3 is free to receive the data of the next device in the progression), but also the other devices of channel B. The positionally-independent device pairing shown in FIG. 16 may also be useful where one channel includes more devices than the other, so that one or more devices in the more populated channel is necessarily paired with a device of different position in the same or different channel.

Figure 17:
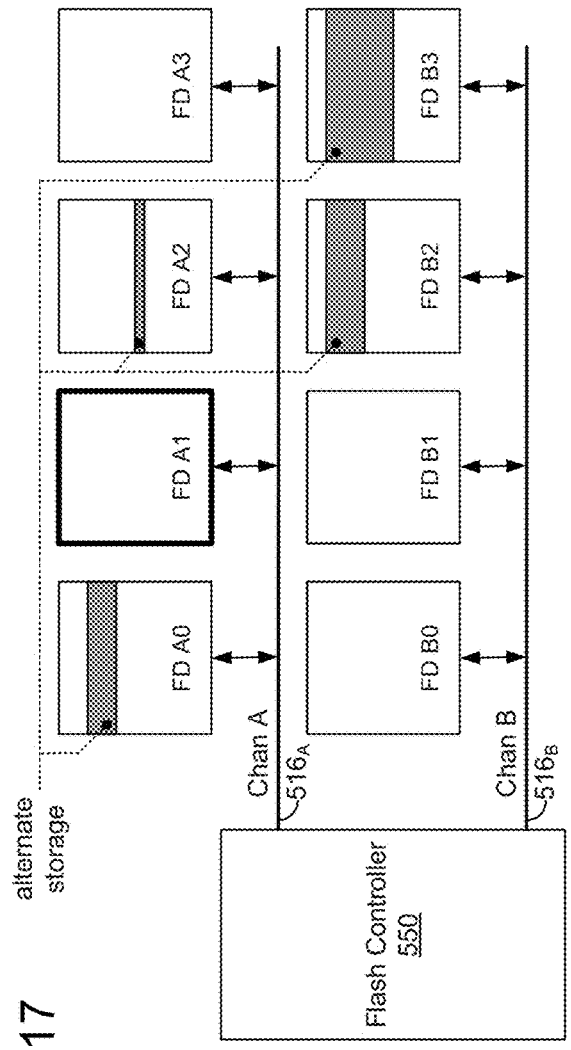
FIG. 17 illustrates an exemplary operation of the annealable multi-channel memory system of FIG. 15 in which composite storage is used to store data evacuated from the device to be annealed.

As in the multi-drop topology, the alternate storage within a multi-channel topology need not be a single memory device, and instead may be a composite storage that includes available storage regions in two or more other devices of the same and/or different channel. Referring to FIG. 17, for example, the alternate storage is formed by storage regions within two same-channel flash devices (FD A0 and FD A2), and two different-channel flash devices (FDB2, FDB3). As in the multi-drop case discussed above, the composite storage need only have sufficient capacity to hold the valid content of the anneal target and thus may constitute a substantially smaller storage area than the total capacity of the anneal target. Also, different amounts of storage may be "contributed" to the composite alternate storage by each participating device.

Figure 18:
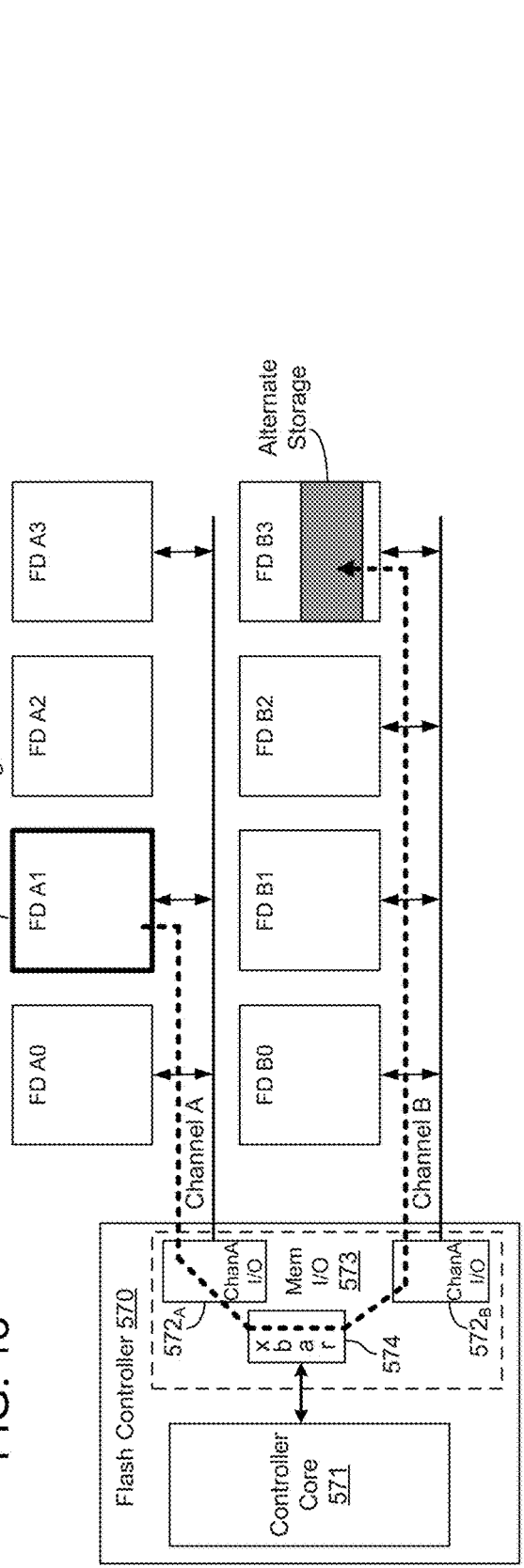
FIG. 18 illustrates an embodiment of a multi-channel memory controller having switched memory I/O circuitry to facilitate channel-to-channel data transfer and thus speed data relocation operations.

FIG. 18 illustrates an embodiment of a multi-channel memory controller 570 (a flash controller in this example) having switched memory I/O circuitry 573 to facilitate channel-to-channel data transfer and thus speed data relocation operations. In the example shown, data is read from the anneal target (FD A1) via the channel-A I/O circuitry $572_A$, then routed via a cross-bar switch 574 (though other switching technologies may be used) to the I/O circuitry $572_B$ for channel B to provide write data for a write into an alternate storage (FD B3) on that channel. Thus, a relocation from an anneal target in channel A to an alternate storage in channel B is effected without requiring the data to be transferred to the controller core 571. If an additional memory channel were present, for example, unfettered memory access transactions may be carried out with respect to that additional memory channel concurrently with relocation of data between an anneal target and alternate storage coupled to memory channels A and B.

Figure 19:
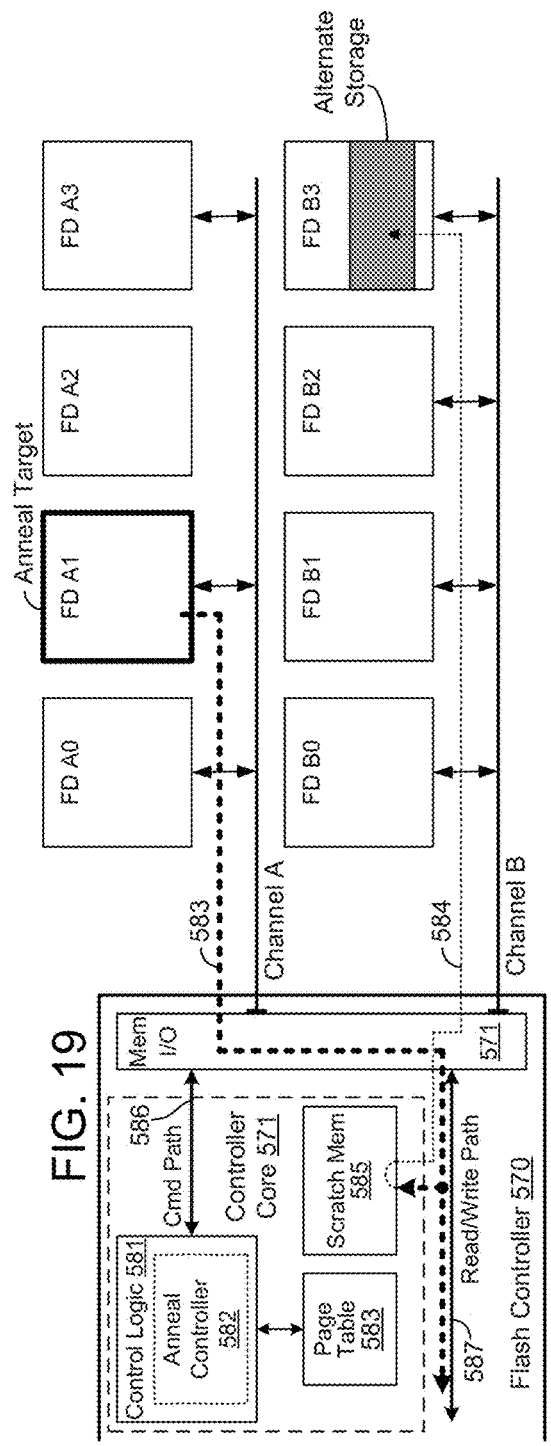
FIG. 19 illustrates an alternative channel-to-channel data relocation operation within the multi-channel memory controller of FIG. 18 in which data read from an anneal target on one memory channel is stored temporarily within the controller core and then later written to an alternate storage on another memory channel.

FIG. 19 illustrates an alternative channel-to-channel data relocation operation within the multi-channel memory controller 570 in which data is read from the anneal target (FD A1) on channel A, stored in a scratch memory 585 within controller core 571 (and optionally returned to a host requestor via data read/write path 587) and then later written to an alternate storage (FD B3) on channel B. The data retrieval flow is shown by 583 (bold dashed path) and the data write flow as by 585 In this example, data operations within the two channels may be carried out concurrently such that another memory write or memory read is carried out (at least in part) in channel B while transit data (i.e., the data being relocated) is read from the anneal target in channel A, and then another memory write or memory read is carried out (at least in part) in channel A while the transit data is written to the alternate storage in channel B. That is, the host can be configured to access data (reading or writing) over only one of the memory channels at a time, thus freeing up the other channel for anneal-related data evacuation operations without interfering with host-initiated traffic. The scratch memory 585 may serve as a temporary holding location for data being migrated (i.e., transit data) from a device on one channel to one or more devices on the other channel. The scratch memory 585 may similarly be useful for temporarily storing transit data to be written back to an alternate storage on the same memory channel as the anneal target. In both cases, the page table 583 may be updated to reflect the temporary location of the transit data so that any requests to read the transit data prior to relocation in alternate storage may effect data retrieval from the scratch memory 585 instead of requiring access to the anneal target. Regardless of whether transit data is temporarily buffered in the scratch memory 580, the page table is updated following completion of the data relocation operation to show the channel-B alternate storage as the new repository of the data.

Anneal Operations in a Multi-Spare Topology

FIGS. 20A-20E illustrate anneal operations within a N+2 memory architecture. That is, each rank or slice of devices includes two spare devices, thus permitting one spare device to be annealed (i.e., heated) simultaneously with data evacuation into the other spare device.

FIG. 20A illustrates an embodiment of a sliced N+2 memory architecture having four memory devices per operational set (N=4), but two spare devices such that each N+2 memory rank 615 includes six memory devices. The memory controller 600 (a flash controller in this example, as the memory rank is populated by flash memory devices FD0-FD5) includes control logic 601 (with integral anneal controller 602), page table 603, scratch memory 605, command path 611, data read/write path 607, memory I/O circuitry 609 and controller I/O circuitry (not shown), all of which operate generally as described above. Respective slices of external data path 614 are coupled between the memory I/O circuitry 609 and each of the flash memory devices FD0-FD5, and a command/address path (not shown) is coupled in common to all the devices of the rank, except that individually controllable chip-select lines are coupled in dedicated fashion to each memory device to enable their independent selection as discussed in reference to FIG. 11. As discussed above, in an alternative embodiment, each memory device may be coupled to a respective (i.e., separate, dedicated) address path and/or a respective command path, instead of being coupled to a common command/address path. Such an arrangement would allow each memory device to receive a different physical address within a given memory access and thus enable tolerance for bad blocks at different physical locations within the memory devices and provide support for device-specific wear-leveling.

Still referring to FIG. 20A, the provision of two spare devices enables the memory controller 600 to execute an anneal operation (i.e., heating) within one spare memory device, referred to herein as the "anneal device", while evacuating the device next to be annealed (the "evacuation device") into the other spare memory device. Thus, evacuation operations and anneal operations may be pipelined as shown in FIG. 20B, with stepwise progression of the evacuation device (ev), anneal device (xx) and alternate storage (as) from selection state to selection state (progressing from state 'a' through state 'f' in each anneal cycle) as shown in FIG. 20C. The same general approach of evacuating the next device to be annealed into the most-recently-annealed spare (blank or empty) device while anneal is ongoing in another device may be carried out in a sliced architecture as shown in FIG. 20D. In the exemplary state shown, flash device 0 (Flash Dev 0) and flash device 2 constitute the alternate storage and evacuation device, respectively, of a virtual device, while flash device 1 is annealed.

FIG. 20E illustrates another advantageous characteristic of a system having two spare devices. That is, after an anneal operation is complete within a given memory device, that device together with the new anneal target may be omitted from the set of devices accessed during a given memory access cycle (e.g., during memory writes) and thus available for a concurrent data evacuation operation. In FIG. 20E, for example, a data relocation operation is carried out with respect to just-annealed device FD0 and the new anneal target FD1, concurrently with a host-requested memory access within one or more of memory devices FD2-FD5. In the particular embodiment shown, a shunt transfer from FD1 to FD0 is effected through the memory I/O circuitry, thus enabling collision-free communication between the two devices concurrently with the host-requested traffic. By this operation, effectively hiding the active data evacuation under host-requested memory accesses, data evacuation may be completed more quickly than in embodiments that require serialization between host and data relocation operations.

Figure 21D:
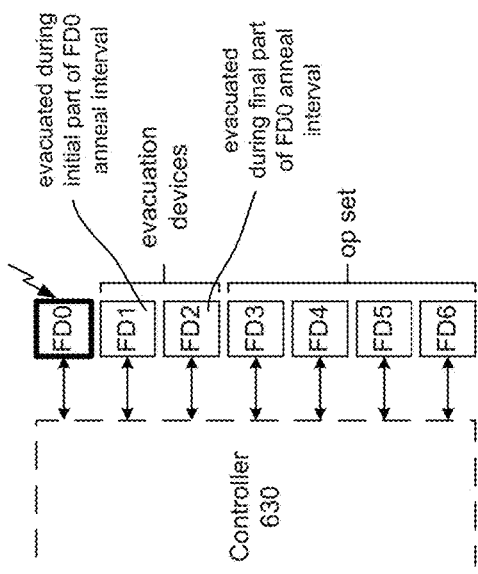
FIGS. 21A-21E illustrate anneal operations within a memory architecture that permits two spare devices to be annealed concurrently with data evacuation into a third spare device, or two spare devices to be evacuated concurrently with an anneal operation within a third spare device.
Figure 21E:
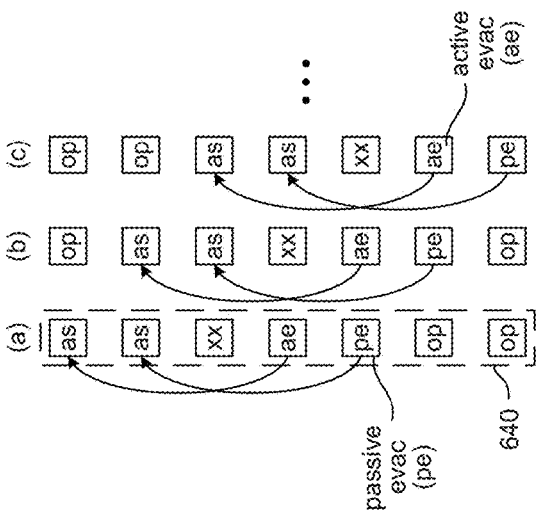
Figure 21A:
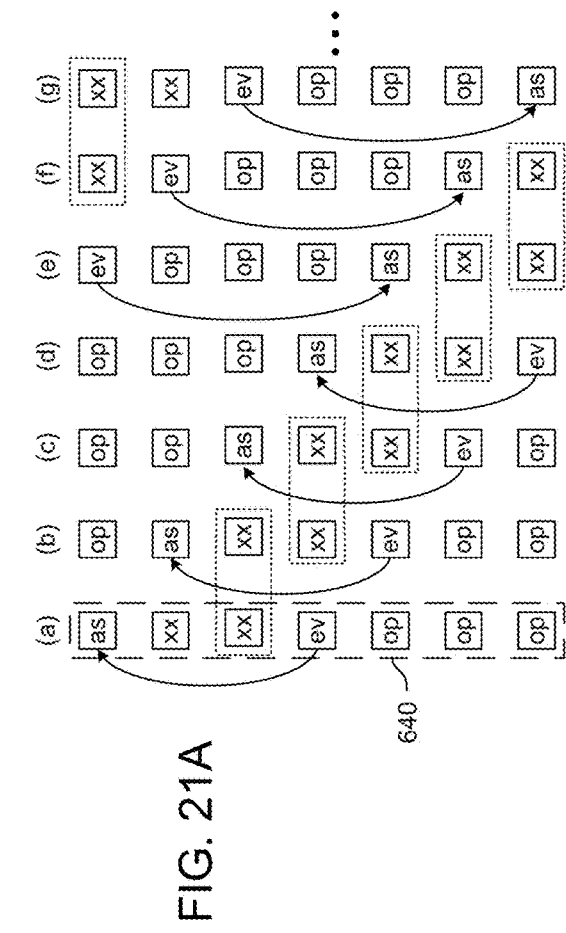
Figure 21B:
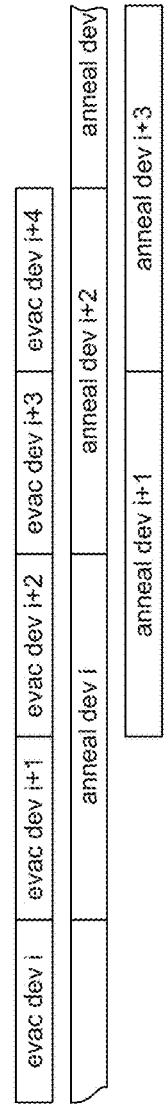

FIGS. 21A-21D illustrate an anneal progression, and alternative anneal pipelines that may be employed in an N+3 sliced or multi-drop architecture. In the progression of FIG. 21A it can be seen that the anneal operation applied to a given device within memory rank 640 extends over two successive selection states in an anneal progression and that two devices are concurrently annealed in each selection state. More specifically, within a given selection state, the anneal of a first device (the leading device) is continued from the prior selection state and concluded in the current selection state, while anneal of the second device (the trailing device) is initiated in the current selection state and thus is to be concluded in a subsequent selection state (where the current-state trailing device becomes the next-state leading device and the current-state leading device becomes the next-state anneal target). FIG. 21B illustrates an anneal pipeline corresponding to the selection-state progression of FIG. 21A, demonstrating the staggered, but concurrent anneal of multiple memory devices within the same rank or slice.

Figure 21C:
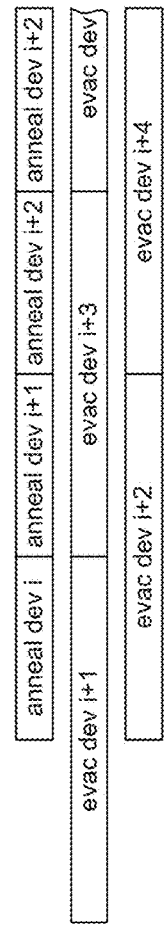

The anneal progression and pipeline of FIGS. 21A and 21B is particularly applicable where the anneal operation is expected to take longer (at least on occasion) than device evacuation operation and where a higher anneal frequency is desired. That is, on average (N+3)*2 devices are annealed per execution of each complete anneal cycle (i.e., progression through all selection states). By contrast, in embodiments in which the evacuation operation is expected to take longer (at least occasionally) than the anneal operation, it may be desirable to evacuate two memory devices concurrently during the anneal of another. The anneal pipeline for such an embodiment is shown in FIG. 21C, showing that, for each selection state, one device is annealed (the anneal device), while the evacuation of another device (the leading evacuee device) is concluded and the evacuation of a third device (the trailing evacuee) is initiated. FIG. 21D illustrates this approach in the context of an N+3 memory system that includes controller 630 and an anneal-capable memory subsystem populated by seven memory devices, FD0-FD6. As shown, over the interval in which FD0 is being annealed (i.e., heated to an annealing temperature), FD1 is evacuated and then FD2 is evacuated, while devices FD3-FD6 form the operational memory set.

FIG. 21E illustrates yet another evacuation methodology that may applied within an N+3 memory system. In this case, two memory devices within rank 640 are evacuated concurrently while annealing a third memory device. More specifically, in the embodiment shown, the memory device next to be annealed is actively evacuated (as indicated by "ae") into a first alternate storage (as) during an interval in which another of the memory devices is passively evacuated into a second alternate storage (as). The device being heated during the passive and active evacuation of the evacuee devices is marked by "xx." Thus, in the progression from selection state 'a' to 'b', the memory device actively evacuated in selection state 'a' becomes the anneal device (xx), the memory device passively evacuated in selection state 'a' becomes the actively-evacuated device (ae), and the device annealed in selection state 'a' becomes the alternate storage (as) for a device newly selected for passive evacuation (pe). As in the embodiments discussed above, the evacuation devices and their respective alternate storage devices constitute virtual device pairs that form part of the operational memory set. Thus, in the embodiment of FIG. 21E, the operational memory set consists of two individual memory devices ("op") and two virtual device pairs (ae/as and pe/as). Different numbers of memory devices may be included within the memory rank in alternative embodiments and the number of concurrently evacuated devices (and thus the number of virtual device pairs included in the operational memory set) may be extended to any practicable number. More generally, progression arrangements, operational pipelines and architectures other than those shown in FIGS. 21A-21E may be employed, and the concepts demonstrated in the N+3 sliced or multi-drop architecture may be extended to architectures having device counts of N+4, N+5, etc.

Foreground Anneal

Figure 22:
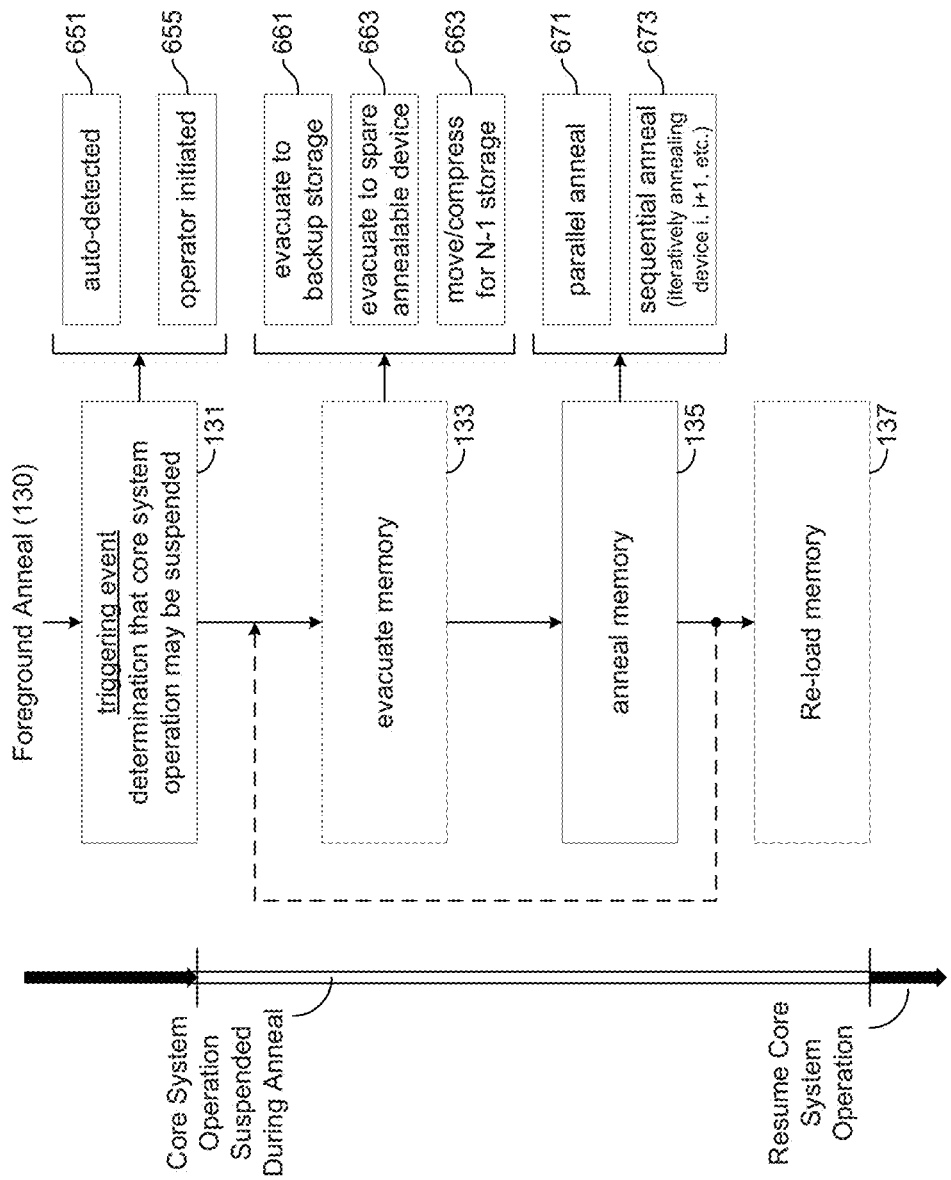
FIG. 22 illustrates a generalized sequence of operations that may be carried out in a foreground anneal 130.

FIG. 22 illustrates a generalized sequence of operations that may be carried out in a foreground anneal 130; a run-time anneal operation in which the core operation of the system is suspended while the annealable memory subsystem (or subsystems) is annealed and then resumed when the anneal is complete. As shown at 131, a foreground anneal sequence begins in response to occurrence of a triggering event. The triggering event may be an automatically determined/detected condition or set of conditions 651 or operator-initiated 655. In the case of automatic detection, the triggering event may be deterministic (e.g., detecting that a predetermined or programmed amount of time has elapsed since the last anneal operation, or that a particular point in time has been reached (i.e., scheduled)) or non-deterministic (e.g., system idle for predetermined/programmed period of time, threshold number of program/erase operations since last anneal, threshold number/rate of errors, etc.) or any combination thereof. In the case of an operator-initiated foreground anneal, a human or artificial operator of the system may specifically instruct anneal operation, for example, through use of an operating system utility or other user-interface selection, thus affirmatively choosing to place the system in a suspended state pending completion or termination of the anneal operation. As a specific example, if the annealable memory subsystem constitutes part or all of the main memory (or otherwise frequently accessed memory) of a computer system or consumer electronic appliance, a human operator may determine (through indicators or otherwise) that the system performance may be improved by annealing the memory subsystem and choose a control panel utility or other maintenance control interface in which to launch an anneal operation. The user interface may be used to track the progress of the anneal, showing the device or devices currently under anneal, the time remaining on the current anneal operation, the device or devices remaining to be annealed (and an estimated time for all or each) as well as the device or devices already annealed. Any problematic memory (e.g., bad or unreliable sector, cluster device, rank, etc.) may likewise by noted and the operator prompted to make decisions regarding memory avoidance (e.g., marking the problematic memory as unreliable and not to be used) and or replacement.

However triggered, the foreground anneal operation proceeds in generally the same manner in each case: evacuating data from the memory to be annealed to a backup storage or spare annealable device(s) 133, executing the anneal (i.e., device heating) operation 135, and then re-loading the annealed memory with any evacuated data 137.

The data evacuation and re-load operations are shown in dashed outline within FIG. 22 to emphasize their optional nature. That is, in an application in which the data is already backed up or otherwise recoverable from other storage (memory contents cached or recoverable via redundant storage as in a redundant array of inexpensive disks (RAID) system), data evacuation need not be performed and device heating may be commenced immediately in response to the triggering event. Similarly, data need not be reloaded into the annealed memory subsystem before resuming core system operation in some cases and instead the annealed memory may be re-populated as part of the normal course of system operation (e.g., write back or write through to cache, storage as part of write or update to RAID contents, etc.)

If data evacuation is to be performed prior to anneal at 135, then data may be evacuated to a backup storage that is distinct from the annealable memory subsystem as shown at 661 (i.e., into another storage within or separate from the host system containing the annealable memory subsystem), or may be evacuated into spare storage of the annealable memory subsystem itself as shown in 663. The various approaches employed for evacuating an anneal target for purposes of background anneal may likewise be employed to evacuate anneal targets as part of a foreground anneal sequence.

With regard to the anneal operation itself, the constituent memory devices of the annealable memory subsystem may either be annealed all at once (referred to herein as a "parallel" anneal) as shown at 671, or sequentially by device or group of devices as shown at 673. In the case of sequential anneal, any data evacuation may be carried out with respect to the anneal target and one or more alternate storage devices as described above in the context of background anneal. Also, the selection between parallel anneal and sequential anneal may be fixed according to the application, or programmatically established. In either case, a number of factors may be taken into account and/or programmatically specified as impacting the selection between parallel and sequential anneal. For example, in the case of a portable device, parallel anneal may be enabled only when the device is docked or otherwise powered by line power (i.e., not battery powered). Conversely, if line power is available, then the provision of limited device functionality (or concurrent execution of other maintenance operations) may be weighed against the urgency of the anneal operation in selecting between parallel and sequential anneal.

As discussed above, the memory re-loading operation at 137 is optional and, if desired or necessary, may be explicitly executed (e.g., transferring evacuated data back into annealable memory subsystem) and/or effected through a data migration that occurs as normal operational traffic. In either case, after any required memory re-load has been completed, the core operation of the host system may be resumed.

FIGS. 23A-23C illustrate a type of foreground anneal referred to herein as a "burst anneal." The general sequence of a burst anneal is shown in the exemplary flow diagram of FIG. 23A. That is, the memory subsystem or appliance containing the memory subsystem is taken off-line at 701. Then, at 703, anneals are executed according to the background anneal methodology described above except that, (i) the anneal controller proceeds directly to active evacuation, evacuating a memory device concurrently with annealing (heating) of another memory device, (ii) migrations are performed through shunt transfer (e.g., transfer through cross-bar or other switching fabric within the input/output circuitry of the memory controller) and thus without temporary storage in scratch memory, and/or (iii) multiple anneals and/or data evacuations are performed in parallel in respective threads of an anneal sequence. After anneal operations have been completed within all targeted memory devices in 703, the memory subsystem or appliance is placed back online at 705, enabling memory access operations to resume.

FIG. 23B illustrates a burst-anneal within a flash memory system having a flash controller 720, and set of flash devices ("Flash"). The flash controller itself includes a cross-bar I/O circuit 726, scratch memory 721, page table 723 and read/write data path ("Read/Write Path"), each of which function generally as described above. As shown, after taking the flash memory system off-line, data is actively evacuated from one flash device to the most recently annealed flash device concurrently (i.e., at least partly overlapping in time) with an annealing (heating) operation within a third flash device. After fully evacuating the next-to-be-annealed device and completing the anneal operation within the prior anneal target (now the most-recently-annealed flash device), the fully-evacuated flash is annealed (heated) concurrently with active evacuation of another flash device into the most recently annealed device, as shown at 727. FIG. 23C illustrates an alternate burst anneal sequence within the same flash memory system as FIG. 23B, but with multiple anneal (heating) operations and multiple data evacuations carried out simultaneously. Such multiple simultaneous anneal/evacuation operations are referred to herein as anneal threads, as each operation may be carried out as an instance of the single-threaded burst anneal operation described in reference to FIG. 23B. Both the singular and multi-threaded anneal operation leverage concurrency in the component operations of the individual anneal threads (and the multi-threaded operation further leverages concurrency between two or more such individual anneal threads) to accelerate annealing of the overall memory rank, enabling the entire memory rank to be more quickly annealed and returned to service.

Figure 24:
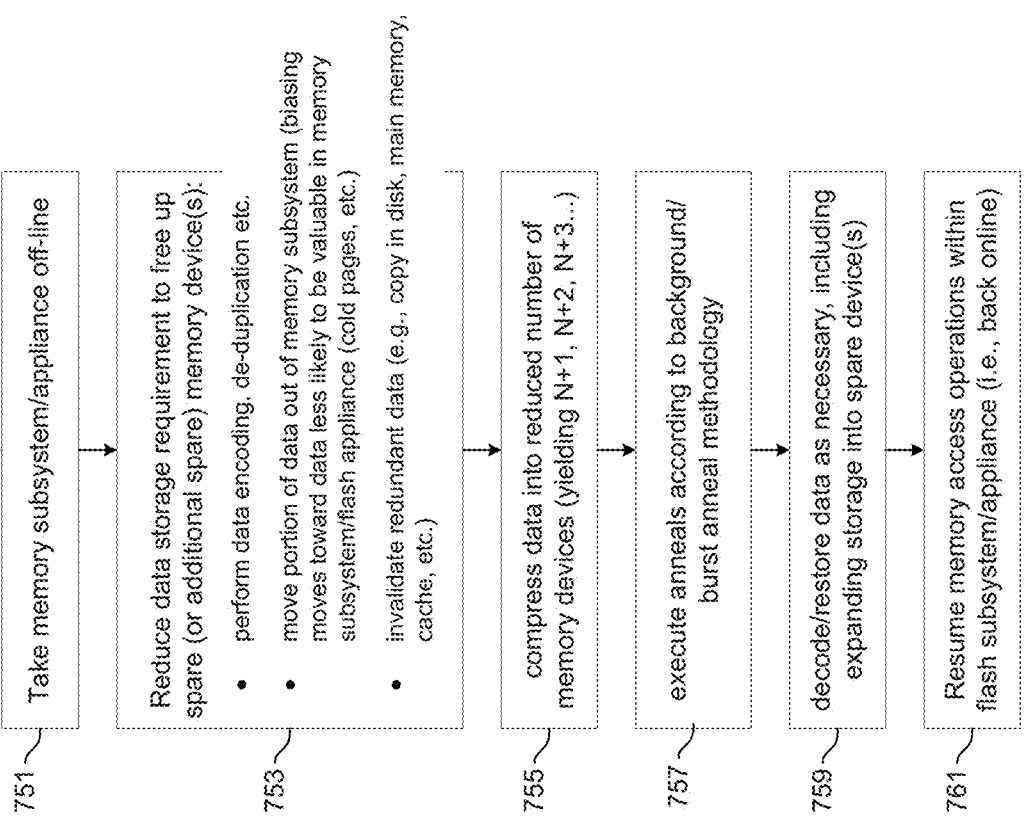
FIG. 24 illustrates an illustrates an exemplary compressed anneal operation that may be carried out to provide a spare memory device within a memory subsystem otherwise having no spare device, or to provide additional spare memory devices for purposes of leveraging the multiple-spare anneal methodology.

FIG. 24 illustrates an exemplary compressed anneal operation that may be carried out to provide a spare memory device within a memory subsystem otherwise having no spare device, or to provide additional spare memory devices for purposes of leveraging the multiple-spare techniques described above (e.g., N+2, N+3, etc. as well as the off-line burst anneal techniques described in reference to FIGS. 23A-23C). Starting at 751, the run-time annealable memory system or appliance including same is taken off-line. Thereafter, at 753, the data storage requirement is reduced to free up one or more spare (or additional spare) memory devices. As shown, a number of different techniques may be carried out individually or in combination to reduce the net data storage requirement of the data stored within the memory system (i.e., the data volume) including encoding all or part of the data volume, for example, using vector quantization, data de-duplication or other lossless or lossy techniques; moving a portion of the data out of the memory system; and/or invalidating data confirmed or known to be redundantly stored in other storage systems, such as disk, main memory, cache, etc (e.g., merging two or more semiconductor-based RAID-5 memory subsystems such that a memory device (or devices) used to maintain parity data for one of the subsystems is at least temporarily not needed for that purpose and thus available as a spare memory device). In the case of data moved or transferred out of the memory subsystem, in one embodiment the data selected for transfer may be identified according to a predetermined or programmatically-selected policy (e.g., stored within an anneal control register as discussed in FIG. 11A) that is biased toward transference of data less likely to be valuable (needed) within the memory subsystem (or host flash appliance), such as cold pages instead of hot pages. In any case, after reducing the net storage requirement of the original data volume, the now-smaller data volume is compressed into a reduced number of memory devices at 755, yielding one or more spare or additional spare memory devices as in the N+ architectures described above (i.e., N+1, N+2, N+3, etc.). Accordingly, anneal operations may be executed at 757 according to the background anneal methodology and burst anneal methodology described above even if the original storage arrangement included no spare devices. After the all the memory devices of the memory subsystem (or targeted subset of the devices) have been annealed, data may be decoded or transferred back into the memory subsystem as necessary (as shown at 759) to enable resumed operation when the memory subsystem or host flash appliance is placed back online at 761.

Figure 25A:
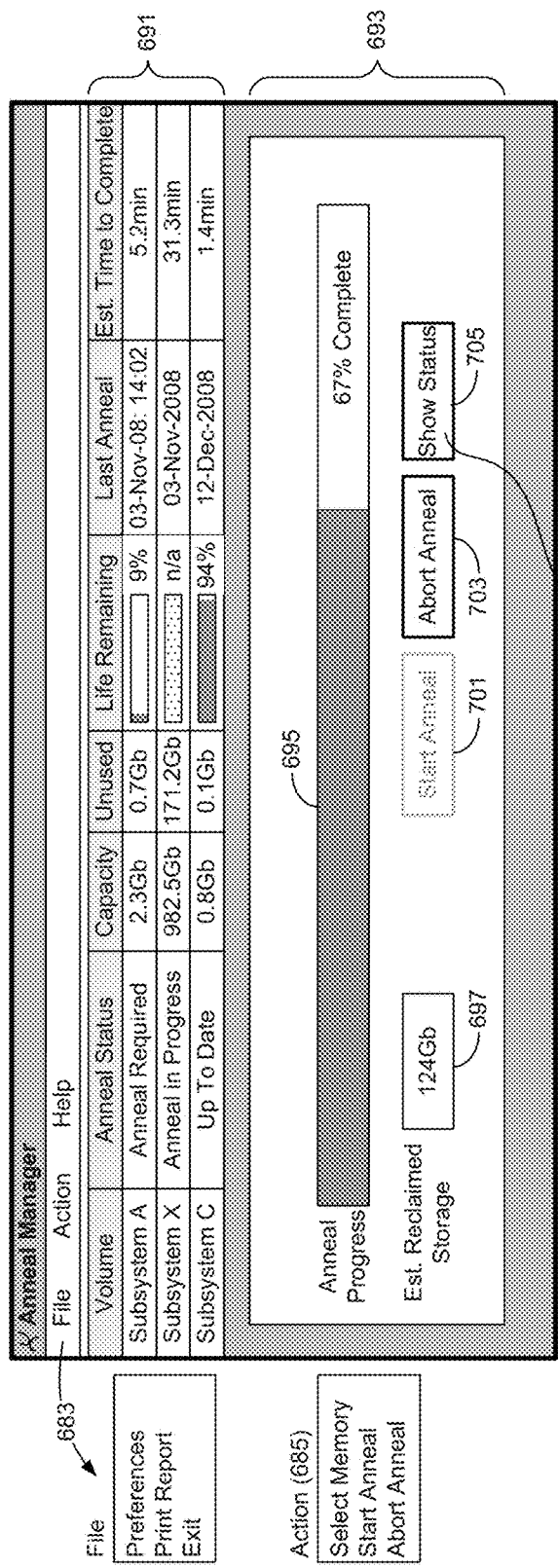
FIG. 25A exemplary user interface that may be presented to a human operator of a run-time annealable system in connection with foreground and/or background anneal operations.

FIG. 25A illustrates an exemplary user interface 680 that may be presented to a human operator of a run-time annealable system in connection with foreground and/or background anneal operations. More specifically, upon launching an "Anneal Manager" program (i.e., instructing the system processor(s) to execute a sequence of instructions that display user interface 680 on an operator-viewable display, and that carries out the anneal operation in accordance with operator input), the system may gather status information relating to the anneal (e.g., time elapsed since last anneal, number of program/erase operations since last anneal, programming and/or bit error rate, historical profile of number of program cycles required to effect device programming, etc.) and present that information to the user to enable the user to make an informed decision as to whether an anneal is required, whether to anneal all or a subset of the devices (and which devices specifically to anneal), an estimated time required to evacuate, anneal and re-load the targeted memory devices and so forth.

Referring to the specific example shown, the Anneal Manager user-interface 680 includes exemplary pull-down menus captioned "File," "Action," and "Help." The File menu provides user-selectable menu items including "Preferences," "Print Report" and "Exit" as shown at 683, while the Action menu provides menu items "Select Target(s)," "Start Anneal," "Abort Anneal," and "Exit" as shown at 685. Menu items for the Help menu are not shown, but may include various help and status items to enable the user to gather information about the anneal operation and the various options available via the pull-down menus and general user interface.

With regard to file menu items, "Preferences" may be selected to obtain a preferences window for operator entry of various options and preferences (parameters) relating to the anneal. For example, the operator may be prompted to select/enable: whether to enable background anneal, whether to perform parallel anneal or sequential anneal; various visible/audible warnings that the system may issue to indicate the need for anneal; thresholds relating to passive and active evacuation stages; triggering event criteria/policy, device selection criteria/policy (i.e., how system will select anneal target and/or alternate storage, including programmable selection sequences), page table management options, topology-specific choices/options, anneal progression methodology, scratch memory usage policy, and so forth. More generally, any of the optional and variable anneal-related parameters (and/or selections, operations, etc.) described herein may be presented to the user via the preferences window (or other user-interface display available in connection with the Anneal Manager program).

The "Print Report" menu item may be selected to print various reports relating to past or ongoing anneal operations, and the "Exit" menu item may be selected to terminate execution of the Anneal Manager program (utility). With regard to the Action menu, menu item "Select Memory" may be used to specify specific memory subsystems and/or specific memory devices within a given memory subsystem to be annealed. The start anneal and abort anneal menu items may be selected to initiate and abort, respectively, anneal of the selected memory devices (or targets captured by the preferences settings). Additional/different menu items and/or pull-down menus may be provided within the anneal manager program according to application needs.

Still referring to the exemplary user-interface 680, a volume window 691 is provide to list each of the annealable memory subsystems present in the system and to show the anneal status (e.g., anneal required, anneal in progress, up to date), storage capacity, unused storage, life remaining (e.g., a gauge showing lifetime left in a non-volatile memory device), date/time of last anneal operation and estimated time to complete an anneal operation (e.g., time remaining if anneal in progress, or total time required if anneal not in progress) of each volume. With regard to the life-remaining gauge estimated time to complete anneal, such values may be dead-reckoned based on stored parameters, determined based upon periodic measurements. Such determinations and measurements may also be used to initiate maintenance events (i.e., software-initiated maintenance events involving data migration). Also, a user may be prompted to optionally initiate an anneal when a predetermined (e.g., programmed) amount of life left within a given device or volume, and/or anneal may be automatically triggered when the life remaining has reached a critical threshold (e.g., 5% or 3%—again, a predetermined or programmed threshold). In the particular example shown in FIG. 25A, three annealable memory subsystems are present, with an anneal required in subsystem A, no anneal required in subsystem C and an anneal operation in progress in subsystem X. Hence, the life-remaining gauge for subsystem X is shown as "n/a" as the device is undergoing anneal.

An anneal progress window 693 is also presented to show the status of any anneal in progress. In the example shown, the anneal operation in progress within subsystem X is 67% complete and, to this point, has reclaimed (i.e., recovered from a previously unusable state) 124 gigabits (Gb) of storage capacity as shown at 697. User-selectable control buttons (i.e., display images that may be activated or "clicked" through user operation of a mouse or other pointer device) are presented to enable the operator to start a foreground anneal operation (control button 701), abort an ongoing anneal operation (control button 703) or to display an anneal status window (control button 705). The control buttons 701, 703, 705 may be modally available or unavailable to the operator according to the state of the system. In the exemplary state shown, for example, the "start anneal" button 701 is unavailable (as shown by it's shadowed outline) as an anneal is already ongoing (note that multiple subsystems may be annealed concurrently in the background and/or foreground, if system resources permit).

An exemplary anneal status window 711 is shown at 710, and includes an image 715 of the memory subsystem undergoing anneal (subsystem X in this case), showing the constituent devices for which the anneal is complete, those for which anneal is ongoing and those not yet annealed. The storage volume to which the status display pertains and the estimated time remaining are repeated in the example shown. Numerous other status values and detail may be presented, including test results following anneal, memory devices that remain suspect or known to be fully or partly inoperable, and so forth. Also, the anneal status window 711 corresponds to a foreground anneal operation in which numerous memory devices (but not all) are annealed concurrently. The anneal status window may also present status with regard to any ongoing background anneal operations.

Figure 25B:
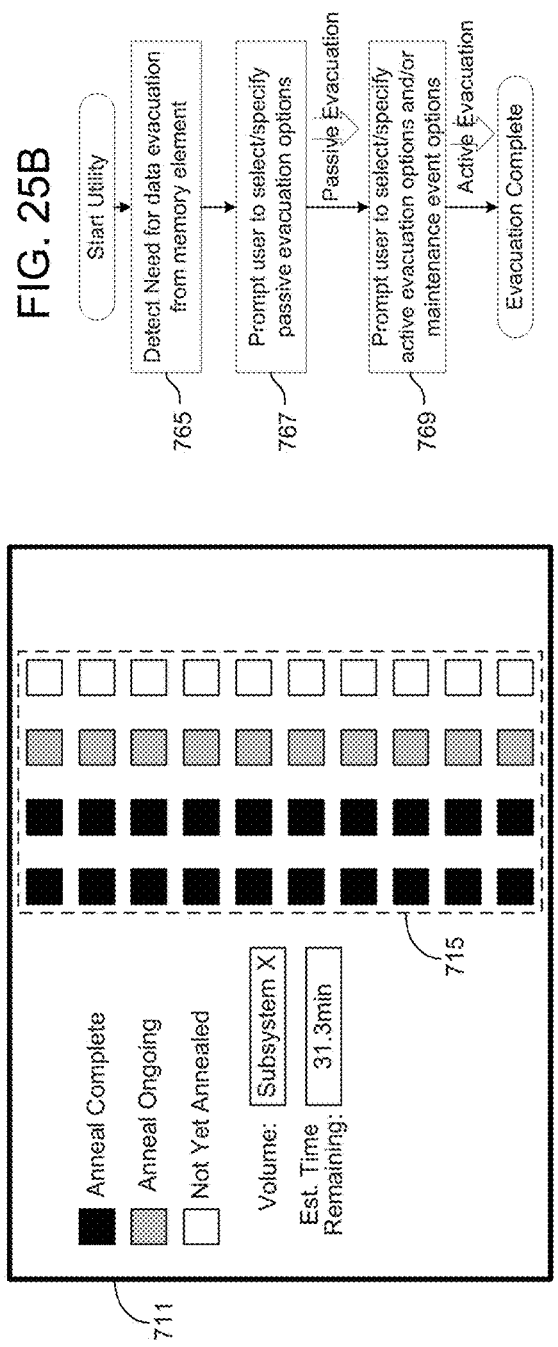
FIG. 25B illustrates a generalized flow diagram of a software utility program that may be executed to render the user-interface of FIG. 25A and to prompt an operator to select or specify options in connection with data evacuation and/or maintenance operations.

The user-interface of FIG. 25A may be presented through execution of an operating-system utility (e.g., a Microsoft Windows ("Microsoft" and "Windows" may be protected by one or more trademarks of Microsoft Corporation) control panel application or like software-implemented utility. As shown generally by the flow diagram of FIG. 25B, such software-implemented utility may, when executed, monitor the need for a memory maintenance event, where the memory is a element (or component) of a multiple element storage system and interact with a user regarding selection of data evacuation options. For example, upon detecting the need for a maintenance event (or device replacement or any other reason/motivation for data evacuation) at 765, the software utility may initially prompt a user with a set of one or more options for rerouting data from the memory at 767 and, in response to user selections/specifications, passively evacuate the memory during run-time of the host system. Thereafter, the software utility may prompt the user a second time at 769 (e.g., after a predetermined condition relating to evacuation has been satisfied) with a set of one or more additional options including, for example and without limitation, (i) performing system-supervised performance of the maintenance event and/or performing active evacuation of the memory, in which contents of the memory are moved and remapped to another of the elements of the storage system. As discussed below, the above-described user-interface and related functions may be implemented by computer/processor execution of a software program (i.e., executable instructions that may be stored on a machine readable media). For example, the anneal manager may be part of a configuration/management tool provided in connection with an operating system. In at least one embodiment, the anneal manager may permit a user to periodically assess estimated remaining device lifetime and/or implement a user-directed anneal without awaiting automated detection of the need for a maintenance event.

Anneal Circuitry

Figure 26:
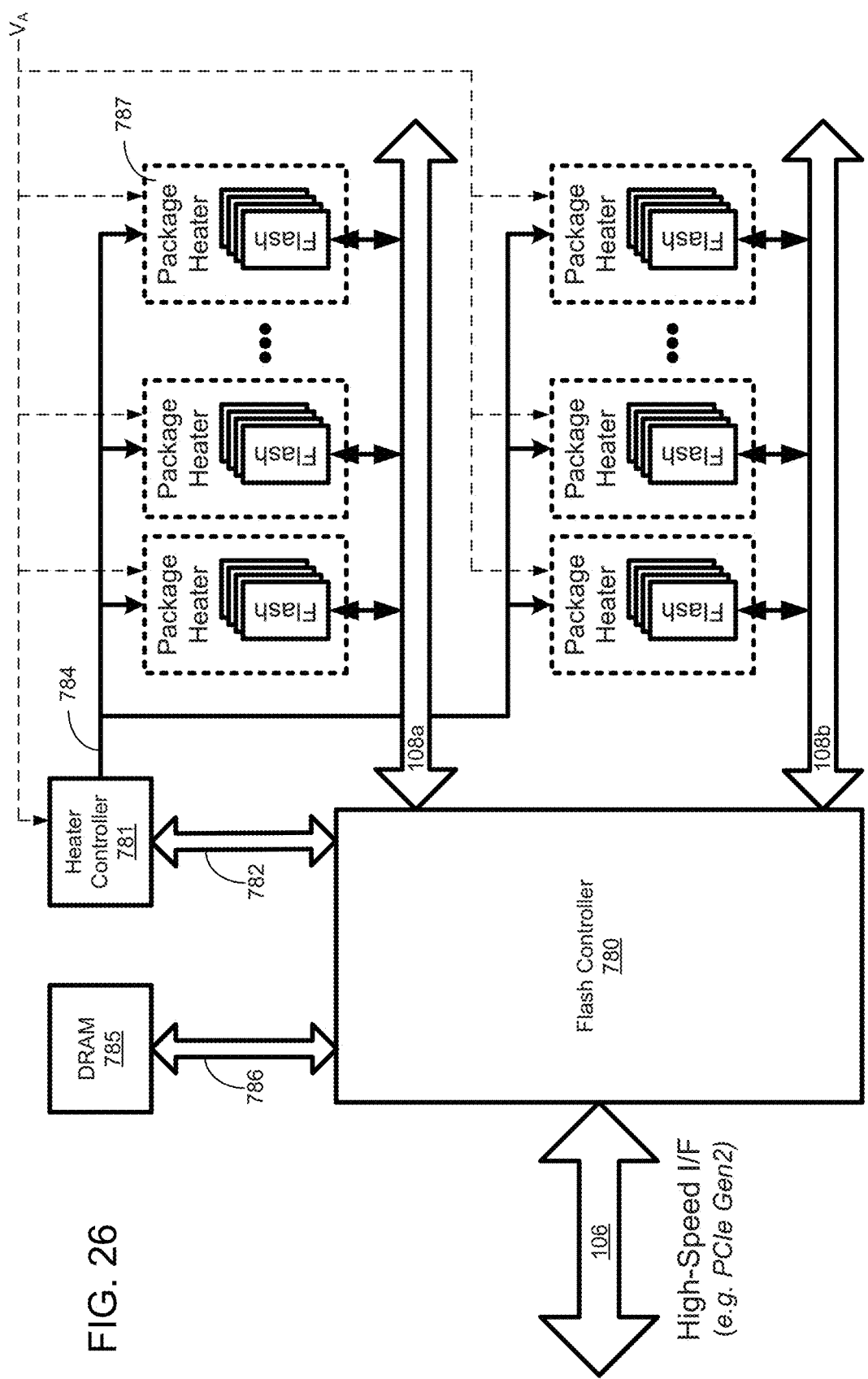
FIG. 26 illustrates an embodiment of a flash memory system having a combination of in-system and in-package anneal circuitry.

As discussed above in reference to FIG. 1, the anneal circuitry used to heat selected integrated-circuit devices to annealing temperatures may be implemented on-die, in-package or in-system. FIG. 26 illustrates an embodiment of a flash memory system, for example, having a combination in-system and in-package anneal circuitry. More specifically, a flash controller 780 is provided with an anneal-control interface 782 to a heater/controller device 781 (e.g., itself an integrated circuit) that provides heating control and/or power to a set of in-package heaters 787 via control path 784, with each in-package heater being used to heat one or more flash memory devices ("Flash") within the package sequentially or simultaneously. The heater/controller and/or in-package heaters may be powered by higher voltages ($V_A$) than those used to power logic-level integrated-circuits (or at least by dedicated or isolated supplies and/or by supplies capable of powering heater loads), and thus specially equipped to deliver the power necessary for annealing operations.

As shown, a dynamic random access memory (DRAM) 785 or any other type of memory may be coupled to the flash controller via interface 786 to provide a scratch memory (the scratch memory may alternatively be included within the flash controller), and one or more high-speed interfaces (for example and without limitation, a second generation, extended peripheral component interconnect bus (PCIe Gen2)) 106 may be provided to enable one or more host devices to access the flash controller and thus the flash memory system. Command, address and data paths 108a may be coupled between the flash memory devices and flash controller 780 according to any topology appropriate to the system application.

Figure 27:
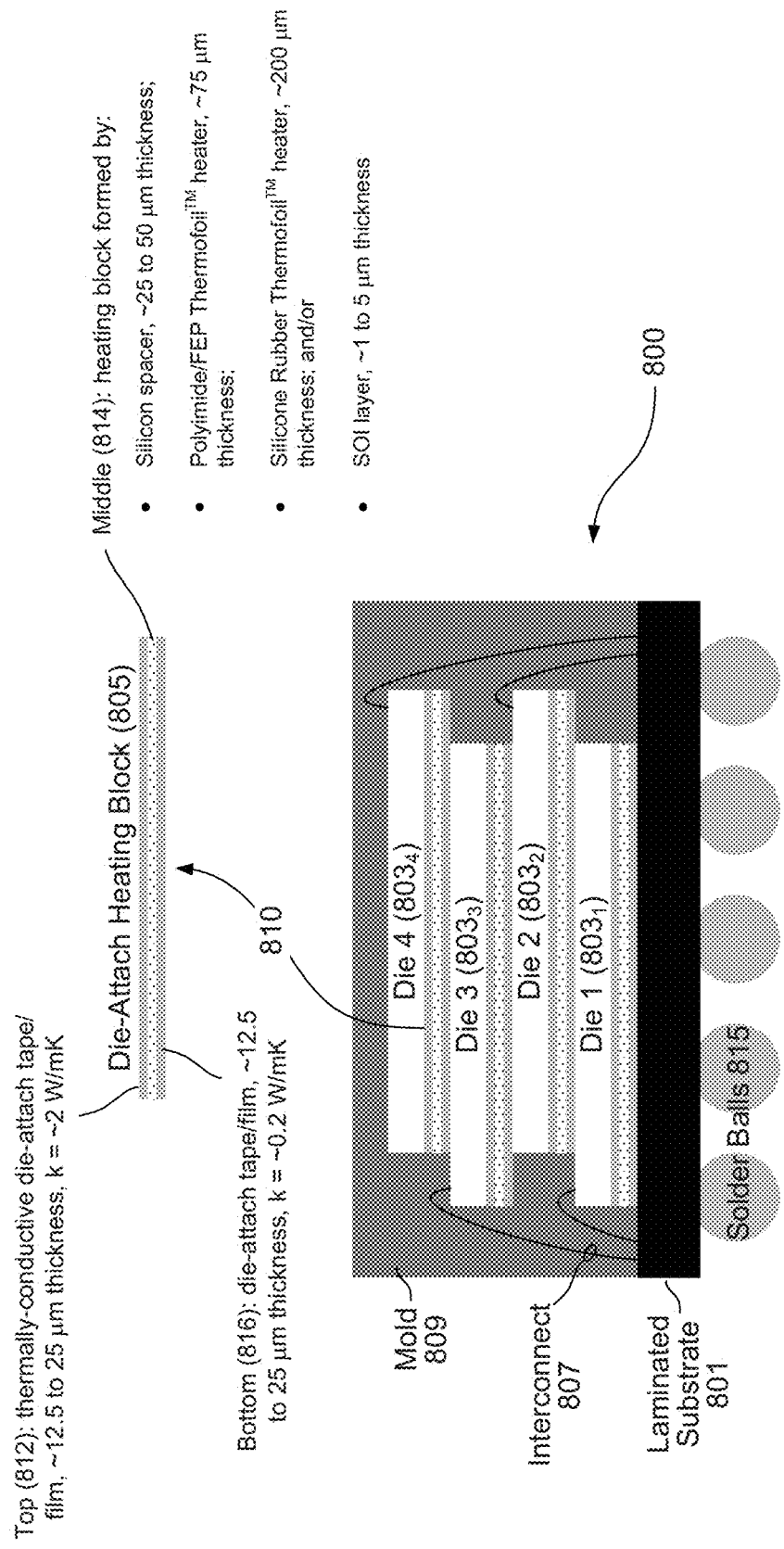
FIG. 27 illustrates an embodiment of a multi-die flash memory package having in-package heating structures.

FIG. 27 illustrates an embodiment of a multi-die flash memory package 800 having in-package heating structures and that may be used within the flash memory system of FIG. 26. As shown, the flash memory package includes a set of four flash memory dice $803_1$-$803_4$ (more or fewer dice may be provided) stacked on a multi-layer (laminated) substrate 801 and attached via respective die-attach heating blocks 805. The multi-layer substrate includes conductive distribution structures to couple die-interconnect pads at an exposed surface of the substrate to solder balls 815 or other circuit-board interconnect structures on the underside of the substrate, with wire-bonds 807 or other die-interconnect structures coupling the die-interconnect pads to counterpart pads on the memory dice themselves. The stacked dice 803 and die-interconnect structures 807 may be encapsulated by a molding 809 or other housing.

In one embodiment, each die attach heating block 805 may be implemented as shown at detail view 810. That is, a top layer 812 may be formed by a thermally-conductive die-attach tape or film approximately 12.5 to 25 microns thick and having a thermal conductivity constant ("k") of approximately 2 watts per meter*degree Kelvin (W/mK). As shown, a heating block or element itself forms the middle layer 814 and may be implemented by any one (or combination) of a silicon spacer (e.g., forming a heat-producing resistive element) approximately 25 to 50 microns thick; a polyimide/FEP Thermofoil™ heater (approximately 75 microns thick) or a silicon-on-insulator (SOI) layer approximately 1 to 5 microns thick. Note that "Polyimide/FEP Thermofoil" and "Silicone Rubber Thermofoil" may be protected by one or more trademarks of Minco Corporation of Minneapolis, Minnesota, and examples of silicon-on-insulator layers include those manufactured by Silicon Genesis Corporation of San Jose, California A bottom layer 816 may be formed by a thermally-insulative die-attach film or tape having a thickness in the range of 12.5 o 25 microns and a thermal conductivity constant of approximately 0.2 W/mK. Note that the thicknesses, thermal conductivity constants, quantity and implementing material/structures of the layers of each die attach heating block are provided as examples only and may be varied in alternative embodiments without departing from the intended scope of the disclosure herein. More generally, the stacked-die package shown in FIG. 27 is but one example of an in-package heating arrangement that may be used within the system of FIG. 26 (or any others of the memory systems disclosed herein). Other heating arrangements, including in-system and on-die heating arrangements as discussed above may be employed in alternative embodiments.

In various other embodiments described herein, heating circuitry is formed on an integrated circuit die to enable the temperature in the locality of insulators or other structures that exhibit progressive degeneration to be raised to a point at which the degeneration or damage is reversed (i.e., reduced or completely eliminated). This temperature-induced restoration or correction is referred to herein as annealing. In one embodiment, for example, accumulated damage within the tunneling oxides of floating gate cells in a Flash memory device may be reversed in an annealing operation by application of temperatures in the neighborhood of 400° C., a temperature that may be achieved during device operation through conduction of sufficient current (the annealing current) through the word lines, bit lines and/or other structures that form part of (or are disposed in proximity to) the Flash cell array. Similarly, annealing operations may be used to dislodge trapped carriers in an array of SONOS-type (silicon-oxide-nitride-oxide-silicon) storage cells, by delivering an annealing current sufficient to raise the temperature of the nitride-based charge storage elements to approximately 250° C. Similar operation may be carried out for other types of charge-storage layers (e.g., TANOS-type cells having a charge-storage layer formed by Si-Oxide-SiN—$Al_2O_3$-TaN.) Lower temperatures may be sufficient in both such examples, or higher temperatures may be required. Also, similar operations may be used to reverse degeneration in any use-degraded materials that are susceptible to repair through annealing including, for example and without limitation, oxides in MOSFETs (metal-oxide-semiconductor field effect transistors) or other types of transistors (thus correcting for threshold voltage mismatch and other types of wear that often limits the useful lifetime of such devices). Moreover, by providing a restorative option in the on-die annealing mechanism and control thereof, devices that are typically constrained to lower operational voltages or clock rates to limit device degradation may be freed to operate at higher voltages and/or clock rates, thereby achieving increased performance That is, by providing on-die circuitry to reverse degeneration, the performance/reliability balance inherent in most semiconductor device specifications may be shifted to higher performance, with occasional or event-driven anneal operations carried out to compensate for the increased degradation rate. Further, in the case of Flash memory and other wear-limited technologies, the ability to reverse degradation through run-time and/or startup-time annealing operations removes wear-based constraints and enables such technologies to be applied in a much larger variety of applications where their low cost-per-bit or other benefits dictate.

FIG. 28 illustrates a generalized embodiment of an on-chip (on-die) annealing circuit 900 that may be used to reverse degeneration of oxides or other materials or structures 904 disposed on or within a semiconductor or other type of substrate 903. The annealing circuit 900 includes an anneal controller 905 and heating circuitry, with the heating circuitry itself including a resistive heating element 907 and a power delivery circuit 909 for enabling an annealing current, $I_{Anneal}$, to flow through the heating element 907. Conduction of the annealing current through the heating element 907 raises the temperature of the heating element to a point at which degeneration of structures 904 and/or substrate 903 (defects, carrier traps or other types of degradation) is reversed, thus restoring the use-degraded material to an improved state, in many cases, to virgin or near-virgin condition. As shown, the anneal controller 905 provides an enable signal (Enable) to the heating circuitry 901 to enable annealing operations to be carried out at a desired time, and also may optionally receive a feedback signal (TMeas) indicative of the temperature generated in the annealing operation. The anneal controller 905 may also output a temperature control signal (TCntrl) to establish a desired annealing temperature, referred to herein as the temperature setpoint. All these and other operations of the anneal controller are described below in greater detail, as are examples of specific embodiments of the heating circuitry 901.

Heating Element Examples

FIGS. 29A-29C illustrate examples of heating elements that may be employed within an integrated circuit device to support on-die annealing operations and that correspond to generalized heating element 907 of FIG. 28. Referring first to FIG. 29A, the word lines (or control gates) 921 within a cell array (e.g., a storage cell array such as a Flash memory cell array or SONOS (silicon-oxide-nitride-oxide-silicon) array, or any other type of use-degraded semiconductor array having word lines that are used to enable concurrent parallel access to multiple cells) may be used as heating elements by providing power delivery circuitry (described below, but not shown in FIG. 29A) to enable conduction of an annealing current ($I_{Anneal}$) through the word line 921. In one embodiment, the intrinsic resistance 924 of the word line itself (typically implemented in polysilicon or polycide traces that extend across the width or at least partly across the width of the cell array) establishes the resistance of the heating element so that when a sufficient annealing current is conducted within the word line 921, structures disposed upon and within the substrate 903 beneath (or proximal to) the word line 921 may be heated to an annealing temperature and thus effect a restorative annealing operation. Alternatively, one or more resistive elements (or structures or materials) may be added in series with conductive portions or segments of the word line or other heating element to establish a desired resistance. In the particular example shown, the word line 921 forms the control gate of a row of non-volatile storage cells 923 such as Flash memory cells or SONOS memory cells, each having a charge storage layer 927 sandwiched between a control-gate insulator (above the charge storage layer) and a tunneling oxide 929 (also an insulator), with the tunneling oxide disposed over an enhancement or depletion channel of a field effect transistor (the source, drain and channel of which are not shown, but typically formed within the substrate 903). By this arrangement, when the annealing current raises the word line temperature to a sufficient level, degradative oxide traps (trapped carriers) within the tunneling oxide 929 incrementally accumulated over a sequence of program/erase cycles, may be annealed out, thus reversing the program/erase-induced degeneration (similarly, in a SONOS architecture, carrier build-up within the charge storage/trapping layer may be expelled, restoring the non-volatile cells to virgin or near virgin condition).

FIG. 29B illustrates an alternative embodiment in which bit lines 941 within a cell array (e.g., a storage cell array or any other type of use-degraded semiconductor array having bit lines that are used to enable concurrent data transfer to/from to multiple cells) are used as heating elements by providing power delivery circuitry (described below, but not shown in FIG. 29B) to enable current conduction through the bit line. As with the wordline-based heating element of FIG. 29A, the intrinsic resistance 944 of the bit line itself (typically implemented in metal layer traces that extend across the length or at least partly across the length of the cell array) may establish the resistance of the heating element so that when a sufficient annealing current is conducted within the bit line, structures disposed upon and within the substrate beneath (or proximal to) the bit line 941 may be heated to an annealing temperature and thus effect a restorative annealing operation. In the particular example shown, the bit line 941 is coupled to one or more chains 942 of Flash memory cells ($945_0$-$945_{N-1}$, N being the number of Flash memory cells in the chain) in a NAND Flash arrangement (in the example shown, including a source-select transistor 947 (ss) at the grounded end of the chain and a drain-select transistor 949 to switchably couple the Flash memory cells 945 to the bit line 941), with word lines ($WL_0$-$WL_{N-1}$) extending across the cell array in a direction transverse to the bit line 941. Bit lines in other types of Flash memories (i.e., NOR Flash) and other types of cell arrays generally may be used as heating elements in a like fashion.

FIG. 29C illustrates another heating element embodiment, in this case, a metal, polycrystalline or other conductive structure 971 dedicated for heating purposes (in contrast to the dual-purpose bit lines and word lines which, at times are used as heating elements, and at other times as control lines to enable row operations, and data lines to enable data transfer, respectively) and disposed on-die and in proximity to use-degraded semiconductor components. In this particular example, the dedicated heating element 971 is disposed in proximity to transistors used in input/output driver circuits 973 (used to drive data signals d0–d(n–1) in response to corresponding logic level data values txd0–txd(n–1), and coupled between ground and supply rails 976 and 974), thus enabling annealing operations therein to correct undesired threshold-voltage (VT) mismatch which tends to develop over time due to oxide traps in the MOS transistors.

Although a dedicated heating element 971 is shown in FIG. 29C, one or more other pre-existing conductive lines, provided for functional purposes, may be leveraged as a heating elements for annealing operations. More generally, although specific examples of heating elements have been shown in FIGS. 29A-29C, combinations of such heating elements and/or numerous other types of conductive elements may be used as anneal-operation heat sources, including structures that generate heat through phenomenon other than FR power dissipation.

Power Delivery

Voltage Mode, Current Mode

Figure 30A:
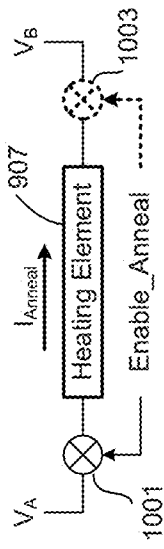
FIGS. 30A-30C illustrate examples of power delivery circuitry that may be provided within or in conjunction with an annealing circuit to power a heating element.
Figure 30B:
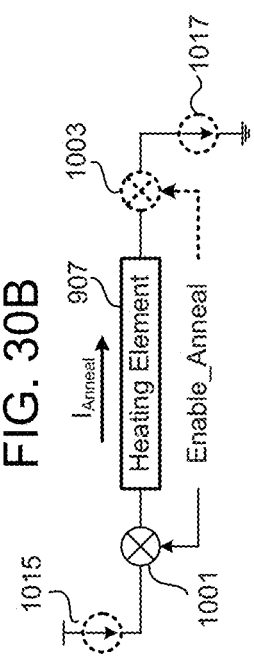
Figure 30C:
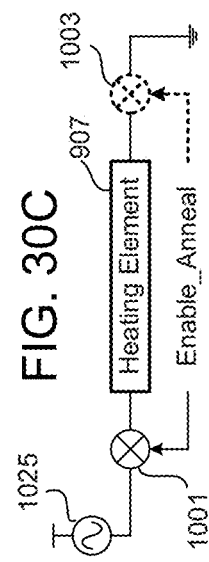

FIGS. 30A-30C illustrate examples of power delivery circuitry that may be provided within or in conjunction with an annealing circuit to power a heating element. FIG. 30A, for example, illustrates an embodiment in which a potential difference $V_A$-$V_B$ is developed across a heating element 907 by switching one or two switch elements 1001, 1003 (e.g., pass gate or other transistor-based switch) to a conducting state in response to one or more enable signals (e.g., Enable_Anneal). In one embodiment, for example, $V_A$ is established by an annealing voltage source and $V_B$ is established by a ground reference node. Other voltage-node connections may be used. Also, in a more specific embodiment, annealing potentials ($V_A$-$V_B$) on the order of 20 to 30 volts, may be applied to create the desired annealing current (and thus the desired annealing temperature). Higher or lower annealing potentials may be used in other embodiments, and the annealing potential may be created on-chip using virtually any type of DC-DC converter (e.g., charge pump, buck-converter, etc.), or may be supplied from an external source. Also, in a device having a dedicated heating element at least, one of the two switch elements may be omitted as indicated by the dashed-outline depiction of switch element 1003. The Enable_Anneal signal is asserted, in one example, by the anneal controller and thus enables the switches to be switched on or off according to the time selected for an anneal operation.

FIG. 30B illustrates an alternative embodiment of a power delivery circuit formed by a constant current source (e.g., a current mirror, current regulator or other digitally- or analog-controlled current source). As shown, the current source may be formed by circuitry 1015, 1017 on both sides of the heating element 107 or by circuitry on a single side of the heating element (hence, the dashed-outline of element 1003). Also, the switching elements 1001, 1003 (which may be a single switching element when implementation permits) are controlled by the Enable_Anneal signal or respective enable signals as described in reference to FIG. 30A.

AC Power Delivery

FIG. 30C illustrates another embodiment of a power delivery circuit, in this case formed by an alternating voltage or current source 225, thus powering the heating element 907 through an alternating current. The actual voltage sources and/or current sources may be generated on-chip in any practicable manner or supplied by an external source. Also, while the far end of the heating element 907 is depicted as being coupled to ground (i.e., switchably coupled to ground if switch element 1003 is provided), another DC or AC potential may be coupled to the far end of the heating element 907 instead.

Single-Side/Dual-Side Power-Delivery

Figure 31A:
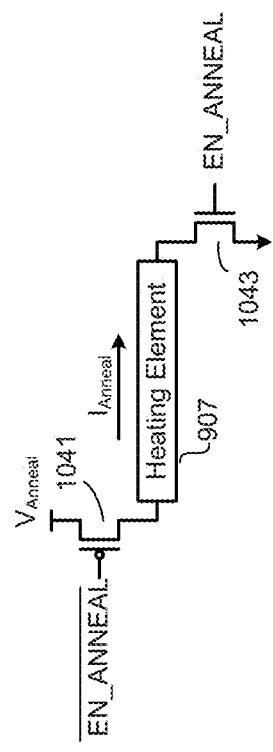
FIGS. 31A and 31B illustrate exemplary arrangements for delivering power to a heating element within an annealing circuit.
Figure 31B:
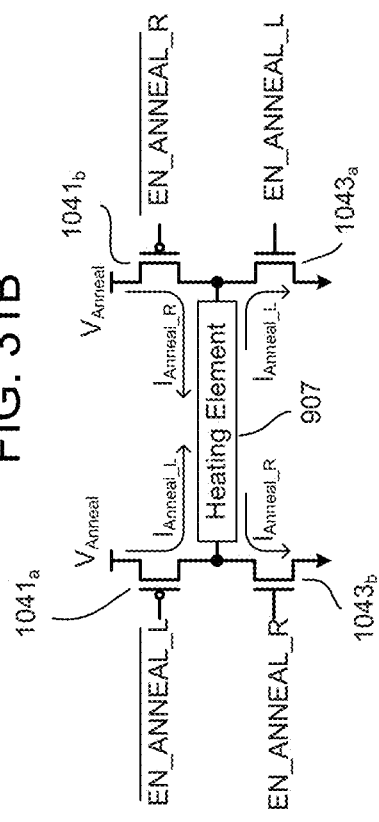

FIGS. 31A and 31B illustrate exemplary arrangements for delivering power to a heating element within an annealing circuit. More specifically, in the embodiment of FIG. 31A, referred to herein as a single-side power embodiment, current flows from left to right across the heating element 907 in response to assertion of an enable signal (EN_ANNEAL) which, in an active-low instance, switches on P-MOS transistor 1041, and in an active-high instance, simultaneously switches on N-MOS transistor 1043, thereby switchably coupling an annealing potential ($V_{Anneal}$) across the heating element 907 to produce the annealing current. In the alternative embodiment of FIG. 31B, referred to herein as a dual-side power embodiment, two different anneal-enable signals are asserted at different times (EN_ANNEAL_L and EN_ANNEAL_R), enabling left-to-right current flow, $I_{AnneaL\_L}$, through transistors 1041a and 1043a when EN_ANNEAL_L is asserted, and enabling right-to-left current flow, $I_{Anneal\_R}$, through transistors 1041b and 1043b when EN_ANNEAL_R is asserted. As discussed below in the context of a specific Flash memory implementation, the dual-side power embodiment may reduce storage-disturb effects by balancing the higher potential (a voltage gradient develops along the heating element due to distributed IR drop) between the left and right sides of the heating element, thereby halving the application of storage-disturb potential to any single side of a row of storage cells.

Heating Control

As briefly discussed above, annealing temperatures may vary according to the type of structures or materials to be annealed, the proximity of the heating element to the degraded structures/materials, the level of degradation exhibited by the degraded materials, and possibly even secondary considerations such as wear of the annealing circuitry itself and the number of times a structure or material has been annealed. Accordingly, even in embodiments, where a known annealing temperature is desired, it may be desirable to provide some control over the temperatures generated and/or the specific locale at which heat is generated.

Heating Element Geometry (Width Modulation, Segmentation)

In embodiments where known annealing temperatures are desired, and resistive heating elements with known annealing voltages are to be applied, generating the desired temperature is generally a function of the annealing element resistance, a value itself proportional to the length of the heating element and inversely proportional to the width of the heating element at any point along its length. Accordingly, in one embodiment, shown in FIG. 32A, the overall resistance ($R_{HE}$) of a heating element 1065 of given length ($L_{HE}$) may be controlled by modulating, at device fabrication time or through post-fabrication trimming, the width of the heating element ($W_{HE}$). In the case of a polysilicon heating element such as a word line, for example, the width of the heating element may be set (or trimmed) uniformly along the length of the element to establish a desired resistance ($R_{HE}$ being proportional to $L_{HE}/W_{HE}$), or the width may be modulated (tapered or varied at certain positions of interest or regular intervals along the length) to effect an average resistance of the heating element, with localized hot spots. In the embodiment of FIG. 32A, for example, the heating element width is narrowed in regions that are disposed over or are otherwise proximal to the structures/materials to be annealed 1061, thus enabling development of desired annealing temperatures within the device at specific locations instead of arbitrarily or evenly along the length of the heating element 1065.

FIG. 32B illustrates an alternative manner of establishing a desired resistance within a heating element, in this case through segmentation of an otherwise continuous structure such as a word line or bit line (or other structure which, due to its alternate, non-heating function, tends to be continuous within the integrated circuit). Taking the example of a word line as shown in FIG. 32B, instead of providing a single continuous word line that extends across a complete row of cells in an array, the word line is decomposed into multiple (X) word line segments, $WLSeg_0$-$WLSeg_{X-1}$, each having a length that provides a desired word line resistance and thus a desired level of power dissipation (heat generation) when a desired annealing current is conducted. Note also that, in contrast to a conventional word line arrangement, a transistor switch 1097 is provided on the far end of each word line segment (i.e., as part of the power delivery circuit) to enable current flow through the word line segment instead of merely charging of the word line segment. Still referring to the embodiment of FIG. 32B, each of the word line segments is coupled to an inverter driver 1093 which grounds the word line segment when a shared select signal ($S_i$, 'i' being an integer between 0 and n−1) is deasserted (high in this case) on select line 1094, and couples an annealing voltage (or read or write voltage in other operations, which read and/or write voltage may be the same as the annealing voltage) to one side of the word line segment (through P-MOS transistors controlled by the select signal ($S_i$) and the anneal-enable signal (EnA), respectively) and grounds the opposite side of the word line segment (via transistor 1097), thereby establishing the segment annealing current, $I_{SegAnneal}$, through the word line segment and thus an annealing heat source for the structures/materials in proximity to the word line (non-volatile storage cells 923 in this example). Note that transistor 1097 may also be used during other operations, for example, to more rapidly discharge the word line after a read or write operation. Also, snap-back protection circuitry or other circuit components not shown may be included within the word line driver circuitry of FIG. 32B and other word line drivers herein.

Temperature Control

As discussed briefly above, it may be desirable to provide some measure of temperature control within or as part of the annealing circuitry, thus enabling temperature to be adjusted, for example, upon determining that annealing operations are partly or wholly ineffective to reverse degradation, or to enable different temperatures to be used in different types of annealing operations. For example, it may be desirable to apply lower annealing temperatures during data-retaining anneal operations (discussed below), than non-retaining anneal operations such as erase-and-anneal operations (also discussed below). Moreover, even in the case of single-temperature anneal, it may be desirable to provide a closed-loop control to ensure that annealing temperature does not become too high (which may result in device destruction) or remain too low (resulting in partially or wholly ineffective anneal). Accordingly, in various embodiments, some manner of providing a setpoint temperature, dynamically adjusting the amount of heat generated by the heating element and/or measuring the heat or indication thereof may be provided within or as part of the annealing circuitry.

Pulse-Width Modulated Temperature Control (Closed-Loop Vs. Open Loop, Variable Setpoint Vs. One-Time-Programmed or Hardwired)

FIG. 33A illustrates an embodiment of an anneal controller 1090 that optionally receives a temperature setpoint signal, $T_{Setpoint}$ (e.g., from an on-chip register or configuration circuit or from an external source), and that modulates the duty cycle of an enable signal, EnA, to control the amount of power delivered to a heating element 907, and thus the annealing temperature. Thus, in this embodiment, the enable signal itself corresponds to the temperature control signal, $T_{Cntrl}$, in the more general embodiment of FIG. 28. Still referring to FIG. 33A, a temperature sensor 1105 (e.g., based on thermocouple principle or any other manner of measuring directly, or indirectly, the temperature of the heating element or the amount of heat energy flowing to the material/structure being annealed) may optionally be provided to feedback a temperature indication (e.g., measured-temperature signal, $T_{Meas}$) to the anneal controller 1090, thus enabling closed-loop temperature control. Considering the open-loop embodiment first (i.e., no temperature sensor or disabled feedback loop), the anneal controller 1090 may include pulse-width modulation circuitry to modulate the duty cycle of the enable signal in accordance with a digital or analog setpoint value, thus enabling different levels of annealing energy to be delivered to the heating element and thereby control the annealing temperature. Specifically, when EnA is asserted (i.e., high such that/EnA is at logic low level), transistors 1095 and 1097 are switched on and thus enable conduction of the annealing current. When EnA is deasserted, transistors 1095 and 1097 are switched off (i.e., switched to a substantially non-conducting state), halting the annealing current. Accordingly, by driving the EnA signal with lower or higher duty cycles (or, said another way, with narrower or wider pulse widths), different amounts of energy may be delivered to the heating element 907 to achieve different annealing temperatures. In the closed loop embodiment, an error signal may be generated within the anneal controller 1090 by subtracting the $T_{Meas}$ signal (or digitized version thereof) from the $T_{Setpoint}$ value (which may be a hard-coded or one-time-programmed setpoint value), and the error signal used to control the duty cycle modulation (i.e., pulse width modulation) of the enable signal, incrementally or error-proportionally increasing the enable signal duty cycle when the measured temperature falls short of the setpoint and incrementally or error-proportionally reducing the enable signal duty cycle when the measured temperature exceeds the setpoint value.

Current-Modulated Temperature Control (Closed-Loop Vs. Open Loop, Variable Setpoint Vs. One-Time-Programmed or Hardwired)

FIG. 33B illustrates an alternative temperature control arrangement in which an anneal controller 1110 outputs a temperature control signal $T_{Cntrl}$ to adjust a current source 1107 (or voltage source) and thus directly increase or reduce the annealing current flowing within heating element 907 during an anneal operation (e.g., when an enable signal, EnA, is asserted to switch on transistors 1095, 1097 and thus enable an anneal operation). The temperature control signal may be an analog signal (e.g., one or more bias voltages) or a digital signal having respective bits, for example, to switch on respective current sinking or sourcing transistors (which may be binary weighted, thermometer coded, etc. to provide current control with a desired granularity; and/or a linearity or nonlinearity). As in the embodiment of FIG. 33A, the temperature sensor 1105 may be omitted and the anneal controller 1110 enabled to function in an open loop manner in response to a temperature setpoint input ($T_{Setpoint}$). Also, if the temperature sensor 1105 and closed-loop control circuitry is provided, the temperature setpoint may be an input (e.g., from an on-chip register or configuration circuit, or from an off-chip source) or may be hardcoded or one-time-programmed within the anneal controller 1110 (or other portion of the annealing circuitry).

Annealing Operation

In the various embodiments of annealing circuits described above, the anneal controller initiates an annealing operation, for example, by outputting an enable signal to the heating circuitry. There are a variety of alternative approaches for determining when to anneal and, particularly in systems containing a large volume of structures to be annealed (e.g., cell arrays which may include many millions of cells to be annealed), how to execute the overall device anneal operation, and whether the anneal is to be performed in a manner that preserves some state (e.g., stored data) in the material/structure being annealed.

Triggering an Anneal

Two broad classes of techniques that may be employed to determine when to initiate or trigger an anneal operation include deterministic approaches in which the time for anneal is fixed relative to device power-up time, and event-driven approaches in which anneal operations are initiated in response to detecting a particular condition other than elapse of time. Within these broad classes, the circuitry for determining whether an anneal is to be initiated may be disposed within the integrated circuit device in which the anneal is to be performed (self-controlled anneal) or within an external device (externally-controlled anneal), or both.

Deterministically-Triggered Anneal

In one embodiment, an annealing operation is performed deterministically, at every device power-up. This power-up anneal may be limited to starting from a complete power-down state (when a system including the integrated circuit device to be annealed is first started up), or from one or more reduced-power modes of operation (e.g., sleep modes, standby modes, etc. in which selected circuit components may be powered down to conserve power. In another embodiment, annealing operations may alternatively or additionally be performed periodically, upon determining that a predetermined amount of time has elapsed since the most recent anneal operation. In such an embodiment, a counter may be provided (e.g., within the anneal controller 905 of FIG. 28) to count transpired clock cycles until a threshold count is reached, or other manner of determining elapsed time may be employed.

Event-Triggered Anneal

Embodiments employing event-triggered anneal include embodiments for performing an anneal in response to determining that:

other operations that may be performed concurrently with anneal operations are to be executed (opportunistic anneal)

a threshold number of degradation-inducing operations have been performed since the last anneal operation (wear-based anneal)

a threshold level or rate of error is occurring (error-triggered anneal)

a failure or near-failure has occurred (performance-triggered anneal).

Opportunistic anneal operations may be performed in response to detecting that other types of operations, compatible with simultaneous or at least concurrent (at least partly overlapping in time) execution of anneal operations, are to be performed. For example, an erase operation (e.g., a block erase) within a Flash memory device or SONOS memory device typically requires hundreds or even thousands of microseconds, and involves raising the substrate or body voltage to a potential that results in reverse tunneling of charge from the charge-storage layer (floating gate, nitride layer, etc.) back to the substrate. Simultaneously with such operations, annealing currents may be conducted within word lines, bit lines and/or other heating elements to carry out annealing operations, thus hiding the overhead required for annealing operations under the erase operation. If time required to complete the anneal operation is greater than the time required to perform the parallel (concurrent) operation, the anneal operation may be decomposed into multiple stepwise anneal operations, any number of which may be performed opportunistically (i.e., when other anneal-hiding operations are being performed) or when required for other reasons (e.g., need to restore the annealed circuitry to normal service). The piecewise anneal operations may be performed back-to-back or at times separated by one or more intervening operations. Other types of opportunistic anneal operations may be performed whenever the resources and bias voltages/currents applied in the annealing operation will not interfere with the other concurrently executed operation. Also, anneal operations may be performed after specific operations before restoring use-degraded structures to normal service. For example, anneal operations may be performed after each block erase cycle in a non-volatile memory before or after restoring an erased block to service.

Wear-based anneal operations may be performed in response to determining that a threshold number of degradation-inducing operations have been performed since the last anneal. In a Flash memory device (or system) utilizing memory cell technology such as Floating Gate (FG) or SONOS or TANOS, for example, the total number of programming operations (e.g., program/erase cycles) performed on individual storage cells, or groups or blocks or clusters of storage cells, may be tracked (e.g., by an operation counter) to determine an estimated wear level in those cells. When a threshold number of programming operations have been performed (e.g., determined by comparing the operation counter output to the threshold in a comparator circuit), an anneal operation may be initiated (e.g., scheduling or initiating anneal in response to a signal indicating need for same from the comparator circuit). Similar arrangements may be used to keep track of other wear-inducing operations and triggering anneal operations. Also, separate operation counters may be maintained for respective sets of memory cells that are annealed as a group (e.g., operation counter per storage block, with the entire block being annealed in an anneal operation or set of anneal operations performed in sequence).

Embodiments for carrying out error-triggered anneal operations generally include circuitry for detecting errors and signaling the need for one or more anneal operations in response to determining that the quantity of errors or the rate of error has reached a predetermined or programmed threshold (all such thresholds for triggering anneal may be predetermined or programmed within the anneal-controlling device). For example, in one embodiment, error detection circuitry (i.e., circuitry for detecting errors and for flagging memory sections or pages with large fail counts) is provided to determine the presence of error in a data value retrieved from memory (such error, if present, indicating either a failure to properly write or read the data value and/or failure to retain the data value) and to count the detection of that error as a function of elapsed time (error rate) and/or as a percentage of such operations performed (error quantity). As an aside, programming of a Flash memory cell may be performed iteratively with a number of short program steps followed by read operations to verify the state of the memory cells. When more programming steps are required to program a memory cell, the memory cell is impliedly beginning to wear out. If the error rate or error percentage exceeds the programmed or predetermined tolerance threshold, anneal operations may be performed or scheduled. Examples of such error detecting circuitry include circuits for evaluating parity bits, checksum values, cyclic redundancy check values, and/or error correction code (ECC) values to determine presence of data errors. Other type of error detection circuitry include circuits for comparing known data to test data (e.g., loopback testing circuits) to determine error rates and/or error quantities.

Embodiments for carrying out performance-triggered anneal operations include circuitry for detecting a failure or near failure and scheduling/performing anneal operations in response. For example, in a Flash memory device, a monitoring circuit may be provided to determine when the number of program/verify cycles (or program steps) required to program a given storage cell or group of storage cells exceeds a predetermined or programmed threshold or increases by some predetermined percentage or number of steps (triggering an anneal operation or scheduling the anneal when the threshold is exceeded), and/or program failure (unable to verify after specified number of program/verify cycles) may automatically trigger an anneal operation. Another approach for determining when an anneal is needed is to track the shift of Vt distribution with memory writes and trigger a longer anneal after a certain threshold has passed. This particular approach may be particularly useful for SONOS or TANOS memory cells. More generally, any type of circuit capable of determining performance degradation (e.g., amplitude mismatch in parallel-transmitted signals due to progressively worsening Vt mismatch) may be provided to trigger anneal operations.

Trigger Source (Self-Triggered Vs. Externally-Triggered Anneal)

Triggering circuitry, whether deterministic, event-driven or both (note that any combination of the triggering embodiments described above may be employed) may be provided within the integrated circuit device containing the annealing circuitry (the "anneal-enabled IC") and/or on a host device that issues annealing commands to the anneal-enabled IC. For example, in a self-triggered embodiment, the on-die anneal control controllers 905, 1090, 1110 described in reference to FIGS. 28, 33A and 33B, and below in reference to FIG. 34, may include circuitry for initiating any or all of the deterministic and event-driven anneal operations described above. Alternatively (or additionally), in an externally-triggered embodiment, a host device such as a Flash memory controller, processing unit, application specific-integrated circuit (ASIC), etc. may include circuitry for initiating any or all of the deterministic and event-driven anneal operations described above. In the externally-triggered case, the host device may issue global anneal commands to trigger device-wide anneal operations (or at least issue commands lacking specificity as to the region of the device to be annealed), or may issue targeted anneal commands, specifying the particular region or circuitry to be annealed within the anneal-enabled IC. For example, the host device may issue an anneal command in conjunction with an address value that specifies a row or other region of a storage array in which an anneal operation is to be performed. Alternatively, an address counter (e.g., to contain a row address) may be maintained on the anneal IC and incremented after each global anneal command.

Figure 35:
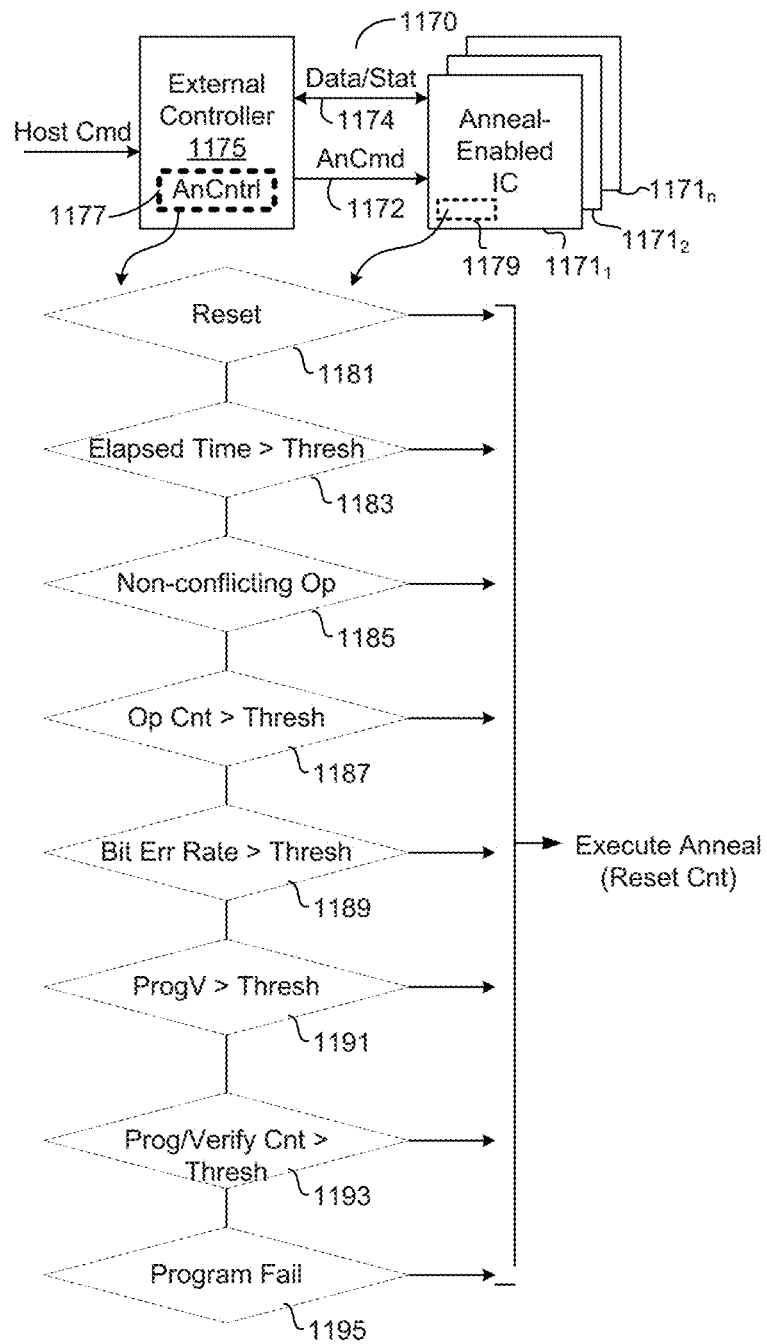
FIG. 35 illustrates an embodiment of a system that includes one or more anneal-enabled integrated circuits and an external controller, as well as anneal-triggering determinations that may be carried out within the external controller and/or anneal-enabled integrated circuits.

FIG. 35 illustrates an embodiment of a system that includes one or more anneal-enabled ICs 1171₁-1171ₙ, and an external controller 1175. Examples of such a system include a non-volatile memory system formed by one or more Flash, SONOS or other non-volatile memory devices (e.g., anneal-enabled ICs 1171) each having an on-die controller (in which an anneal controller may be disposed), and an external controller coupled to the non-volatile memory devices through a signaling interface 1170. In FIG. 35, the memory access interface is generalized to show a command path 1172 (or request path or instruction path) to convey anneal commands (AnCmd), programming/configuration commands and/or other commands from the external controller 1175 to the anneal-enabled ICs 1171, and a data/status path 1174 to enable data to be transferred between the external controller 1175 and the anneal-enabled ICs 1171. The data/status path 1174 may also be used to convey status information from the anneal-enabled ICs 1171 to the external controller 1175, including information that may be used determine whether to initiate/schedule anneal operations (i.e., issue anneal commands). Note that other types of signaling interfaces having more or fewer distinct signaling paths may be used to convey information between the external controller 1175 and anneal-enabled ICs 1171 in alternative embodiments.

In the particular embodiment of FIG. 35, anneal operations are performed, for example and without limitation, on detection of reset (1181), elapsed time (e.g., since last anneal) greater than threshold (1183), execution of or scheduling execution of a non-conflicting operation (1185) (e.g., hiding the anneal under an erase operation within a Flash memory device), number of degradative operations (Op Cnt) greater than threshold (1187) (e.g., count of program/erase operations in a Flash memory device exceeds a predetermined or programmed threshold), bit error rate greater than threshold (1189), program voltage (a value that may be incrementally increased in successive program/verify cycles within a non-volatile memory device in an effort to complete a programming operation) increased beyond a threshold (1191), program/verify cycle-count (i.e., count of program/verify operations required to achieved desired level of device programming) greater than threshold (1193), or program operation failure (1195). More or fewer triggers for anneal execution may be provided in alternative embodiments. Also, as shown, circuitry 1177, 1179 for tracking the various triggering events (and/or elapsed time) may be provided within the external controller 1175 and/or one or more of the anneal-enabled ICs 1171.

Scheduled Anneal

Note that the anneal operations described above, however triggered, may be performed in an on-demand or scheduled fashion. Following the example of a non-volatile memory device (e.g., a Flash or SONOS memory device), in an on demand anneal, anneal operations may be performed by tracking the number of non-volatile storage blocks (or other circuit regions) marked as requiring anneal and then executing one or more anneal operations upon determining that a threshold has been reached. As an aside, a storage block may be marked for anneal in a manner similar to marking a bad block in a NAND Flash memory device. That is, memory management software, executed by an on-chip or off-chip state machine or processing circuitry, may check the status of a block (or page) before using it, determine whether the block is marked as bad and/or whether it needs annealing, and then mark the block accordingly by recording status information corresponding to the block in a status memory or register.

As an alternative to on-demand anneal (i.e., performing anneal operations upon determining that a threshold has been reached), anneal operations may be scheduled for a later time. For example, in one embodiment, upon determining that a threshold has been reached (e.g., threshold number of blocks marked as requiring anneal), anneal operations are scheduled for execution during periods when memory is inactive or resources are otherwise available or underutilized.

Programmed Anneal Parameters

FIG. 34 illustrates an embodiment of a mode register 1150 (or configuration circuit) optionally provided within an anneal-enabled IC and that may be programmed in response to host commands (or one-time programmed, for example, during device production) to provide flexible control over triggering and execution of anneal operations. In the particular embodiment shown, the register 1150 includes a control field (Cntrl), power-mode field (PwrMode), execution field (Exec), data field (Data), trigger field (Trigger), and setpoint field ($T_{Setpoint}$). More or fewer fields may be provided in alternative embodiments (e.g., to provide other aspects of control), and/or any or all of the fields may be disposed within separate registers of the annealing IC.

In one embodiment, the control field enables a selection between self-control and host-controlled modes of annealing operation as discussed above (i.e., device either self-triggers anneal operations, or responds to commands from a host device). The power mode field is provided to control whether anneal operations are limited to times in which the anneal-enabled IC is powered by an external source (e.g., when a mobile device containing anneal-enabled IC is plugged into a wall outlet, docking station or otherwise receiving battery-charging power), or is full-time enabled to perform anneal operations. Finer granularity to distinguish between additional levels of power-saving modes may be provided in alternative embodiments. The execution field is used to control the manner in which annealing operations are carried out within a device having multiple separately annealable regions. For example, in a Flash memory device, each word line (or collection of word line segments) may define a separately annealable region of the device. In such an embodiment, if the execution field indicates single-operation anneal (Single-Op), all word lines may be heated simultaneously to perform an anneal operation. Conversely, if stepwise-anneal is selected (e.g., Exec=0), one region may be annealed at a time in a sequence of anneal steps (e.g., one word line after another may be selected and heated to carry out anneal operations in a stepwise fashion). In alternative embodiments, groups of annealable regions (e.g., those regions sufficiently separated from one another to avoid over-temperature conditions when simultaneously heated or those close enough to make heating of a region more power efficient) may be selected for simultaneous anneal. Also, finer control over number of simultaneously selected heating elements may be provided by expansion of the execution field to include more than a single bit).

The data field indicates whether the anneal operation is to be performed in a manner that retains data (special biasing considerations may apply as discussed below) or is a non-data retaining anneal. In some cases, this selection may be one of compromising between speed-of-anneal and avoiding loss of data, as circumstances may warrant.

The trigger field includes values that enable selection between various deterministically-triggered and event-triggered anneal operations (and to disable anneal operations altogether, Trigger-111). In the particular embodiment shown, the trigger field includes three bits, thus enabling selection of one of eight triggering modes. In alternative embodiments, additional bits may be provided to enable independent selection of the various triggering modes.

The setpoint field ($T_{Setpoint}$) enables specification of a temperature setpoint. In alternative embodiments where alternate selection between different annealing temperatures is desired, multiple temperature setpoint fields may be provided.

Note that numerous additional control values may be recorded within the register 350 (or associated registers or configuration circuits) including, without limitation, any of the triggering thresholds described above. Also, any or all of the anneal-control parameters described above may alternatively be indicated by control fields included within or associated with an anneal command received from a host device.

Data Retention During Anneal

In a number of the anneal circuit embodiments described above, voltages applied across the heating element during run-time operation may undesirably affect the state of the annealed structures. For example, where word lines (or control gates) in a non-volatile storage array are used as heating elements, the anneal voltage will appear at the word-line driver side of the array and, if high enough, may result in undesired programming (attracting charge to the charge storage layer) of the underlying non-volatile storage elements. In one embodiment, this undesired programming is avoided through biasing of the bulk substrate (or bulk, which may include any wells in which annealed structures are formed) to a potential that lowers the gate-to-bulk voltage for the non-volatile storage cells to a potential below that required for cell programming Referring to FIG. 36A, for example, in one embodiment, the bulk 1196 is charged to a voltage that is substantially centered between the voltages applied to opposite ends of the word line 921 (i.e., $V_{BULK}$ is set midway between $V_A$ and $V_B$ or $V_{BULK}$ ($V_A$+$V_B$)/2), thus halving the positive gate-to-bulk voltage, $V_{GB}$, that would otherwise be applied across non-volatile storage cell 923A (referred to herein as a near-side storage cell due to its proximity to a word line driver, not shown). Note that charging the bulk to the $V_A$ potential (assuming $V_A$ to be more positive than $V_B$) is also an option and may be carried out to ensure that no programming occurs in a fully erased row of storage cells, but that, due to the grounded end of the word line at non-volatile storage cell 923B (the far-side storage cell), a negative voltage equal in magnitude to the difference between $V_A$ and $V_B$ would appear across non-volatile storage cells 923B. Accordingly, by biasing the bulk to ($V_A$+$V_B$)/2 during an anneal operation, a balance is achieved, setting the amplitude of the positive and negative potentials across cells 923A and 923B at ($V_A$-$V_B$)/2; half the worst-case potential that would be applied across either storage cell if the bulk was biased to $V_A$ or to $V_B$. Assuming for the sake of illustration that the $V_A$ and $V_B$ potentials are 20 volts and ground, respectively, then the bulk may be biased to 10 volts to ensure that no voltage more than positive or negative than 10 volts is applied across any of the storage cells 923, thus ensuring that program and erase operations that require potentials substantially greater than 10 volts do not inadvertently occur. Accordingly, data stored in the non-volatile storage cells 923 may remain undisturbed during the anneal operation, thus permitting run-time anneal operations to be performed in regions of memory containing valid data.

Figure 36B:
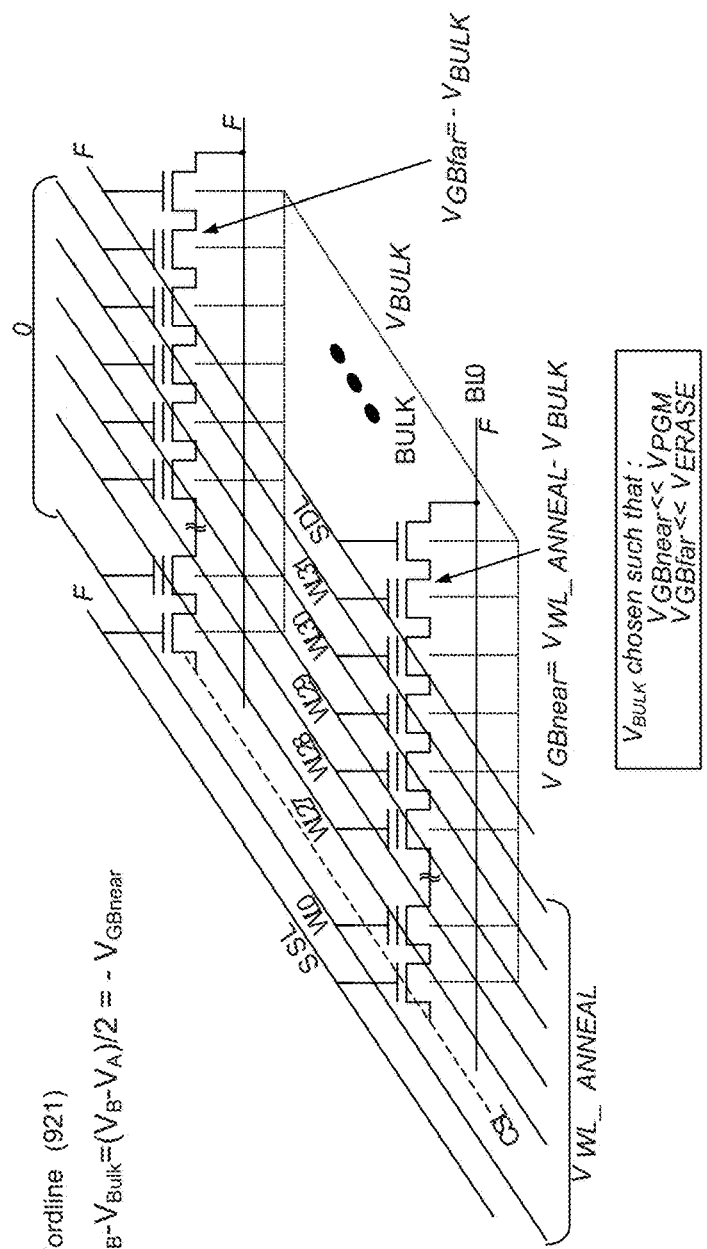
FIGS. 36A-36C illustrate biasing of a semiconductor substrate or bulk in a manner that limits or prevents disturbance of stored data, thus permitting data to be retained during anneal operations.
Figure 36A:
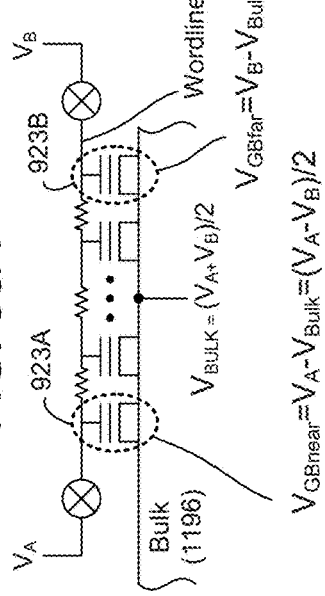

FIG. 36B provides a perspective view of the bulk programming arrangement described above in the context of a NAND-type Flash memory device, showing exemplary non-volatile storage cell chains coupled to respective word lines WL0-WL31 (there may be more or fewer word lines per cell chain in alternative embodiments) as well as select-source lines (SSL) and select-drain lines (SDL) for controlling source-select and drain-select transistors. As shown, the bulk voltage is chosen such that the gate to bulk voltage, $V_{GB}$, is midway between the applied anneal voltage ($V_{WL\_ANNEAL}$) and ground or, more generally, so that the gate to bulk voltage across each non-volatile cell is substantially lower in magnitude than both the cell program voltage, $V_{PGM}$, and the cell erase voltage, $V_{ERASE}$.

Figure 36C:
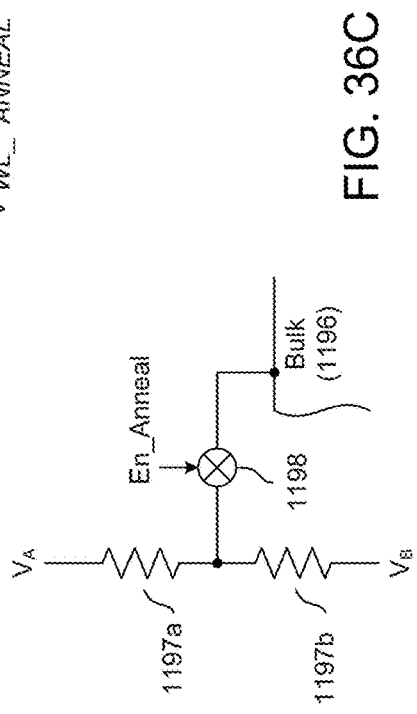

FIG. 36C illustrates an embodiment of a bulk biasing circuit that establishes the bulk voltage midway between the $V_A$ and $V_B$ potentials applied to either end of a word line (or other heating element) during an annealing operation. As shown, resistive elements 1197a and 1197b, which may be implemented on-chip or off-chip and by active and/or passive components or any combination of active and passive components, are coupled in a resistor divider configuration to establish $V_A+V_B/2$ at switch node 1198 (i.e., assuming equal resistances for elements 1197a and 1197b). By this arrangement, when an anneal operation is triggered (i.e., enable signal En_Anneal asserted), switch element 398 (i.e., a transistor switch or pass gate or any other switching structure) is switched to a conducting state to apply the desired midpoint bias voltage (($V_A+V_B$)/2) to the bulk 1196. Note that the foregoing assumes equal resistances for elements 1197a and 1197b, though the resistive values of such elements may also be unequal for example establish increased tolerance with respect to either the device programming or erase voltage. Further, the resistive values of elements 1197a and/or 1197b maybe programmatically adjusted (e.g., through production-time or run-time register programming or one-time programming operation) to establish a desired voltage divider ratio. More generally, bulk biasing circuits are not limited to the resistor-divider approach shown. Any circuit for generating the desired bulk biasing voltage may be used in alternative embodiments.

Also, other approaches for mitigating data loss during anneal operations include constructing the integrated circuit in such a manner to enable desired annealing temperatures to be reached with lower applied voltages. For example, a Flash memory chip (or other anneal-enabled integrated circuit device) may be constructed on a silicon-on-insulator (SOI) substrate to improve the ability to anneal with modest currents through the control gate.

Confirming Efficacy of Anneal Operation—Post-Anneal Generally

After an anneal operation has been performed, a number of techniques may be applied to determine whether the annealing process was successful. In one embodiment, for example, annealed circuitry is restored to normal service so that other fail/error-detect mechanisms can ensure its proper operation. For example, in a Flash memory device, annealed blocks may be marked as normal and returned to service. If the block fails later programming (or exhibits bit errors or other failures) it can be marked as bad and marked as a candidate for further anneal. A separate flag (or counter) may be provided to indicate that a block has been previously annealed (or how many anneal operations have been performed in total or since last failure detection). In this way, if the block fails after an anneal (or threshold number of anneal operations) it may be marked as permanently bad so that further anneal attempts are prevented. Note that, in this regard, anneal operations may generally be performed on blocks marked as bad (e.g., due to bit errors or other faults) to determine if they blocks may be repaired. Alternatively, anneal operations may be omitted on certain blocks (e.g., blocks factory-marked as bad blocks, as opposed to run-time marked; separate information fields may be provided to enable this distinction) since such determination may have resulted from more extensive testing. On the other hand, anneal may be used after factory test in an attempt to repair "bad" blocks or pages.

Examples of Specific Anneal-Circuit Embodiments

Figure 37:
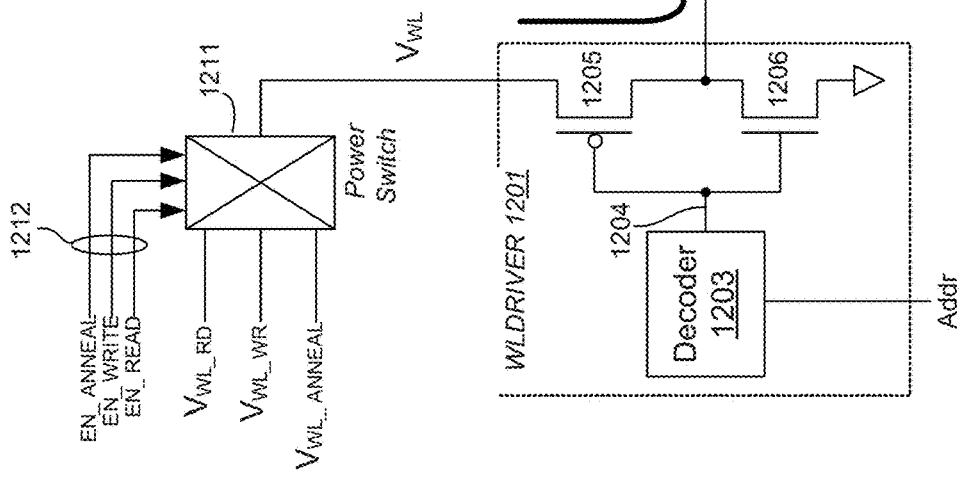
FIGS. 37, 38A and 38B illustrate particular embodiments of an annealing circuit in accordance with the principles and embodiments of FIGS. 28-36.
Figure 38A:
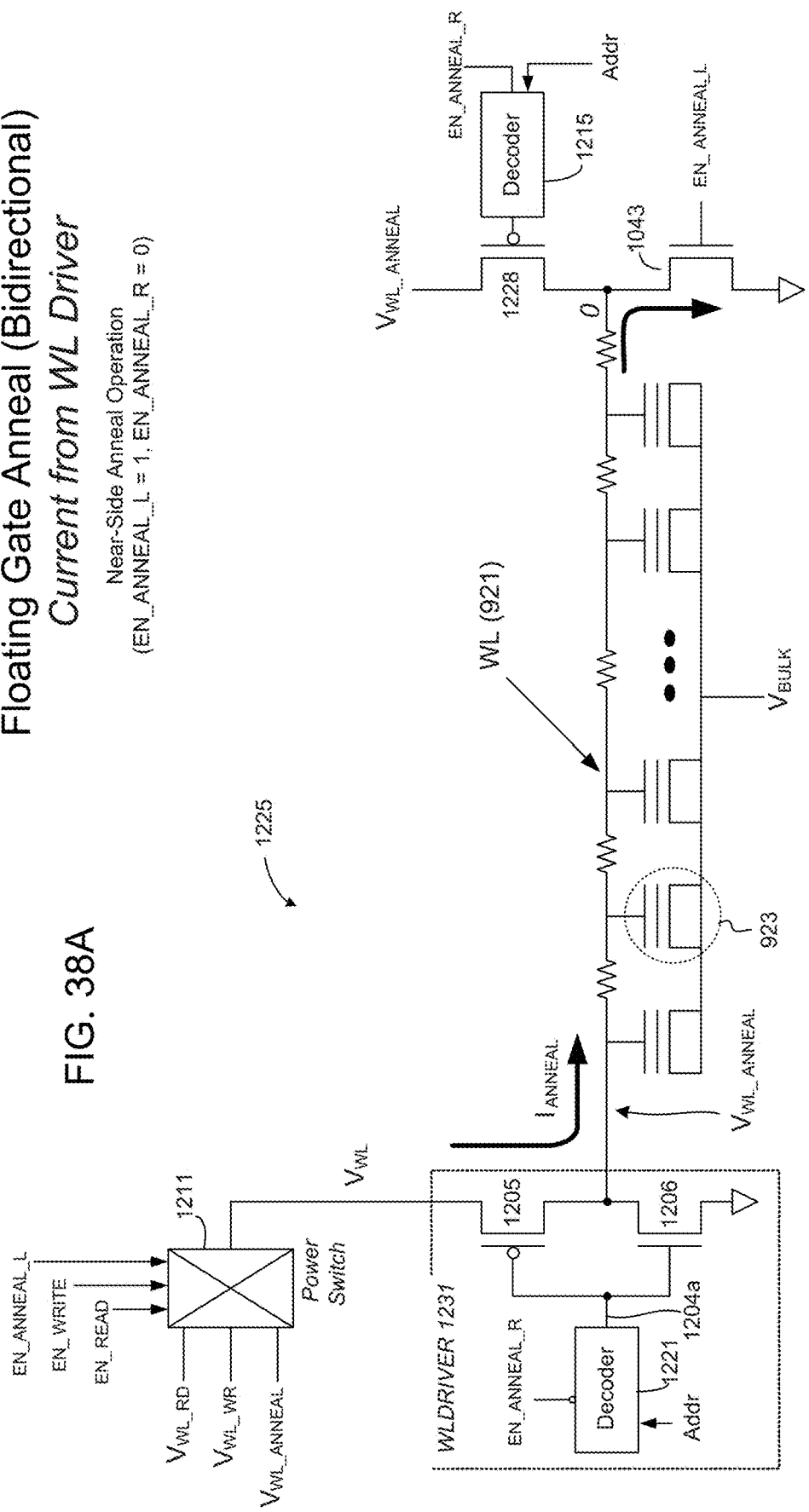
Figure 38B:
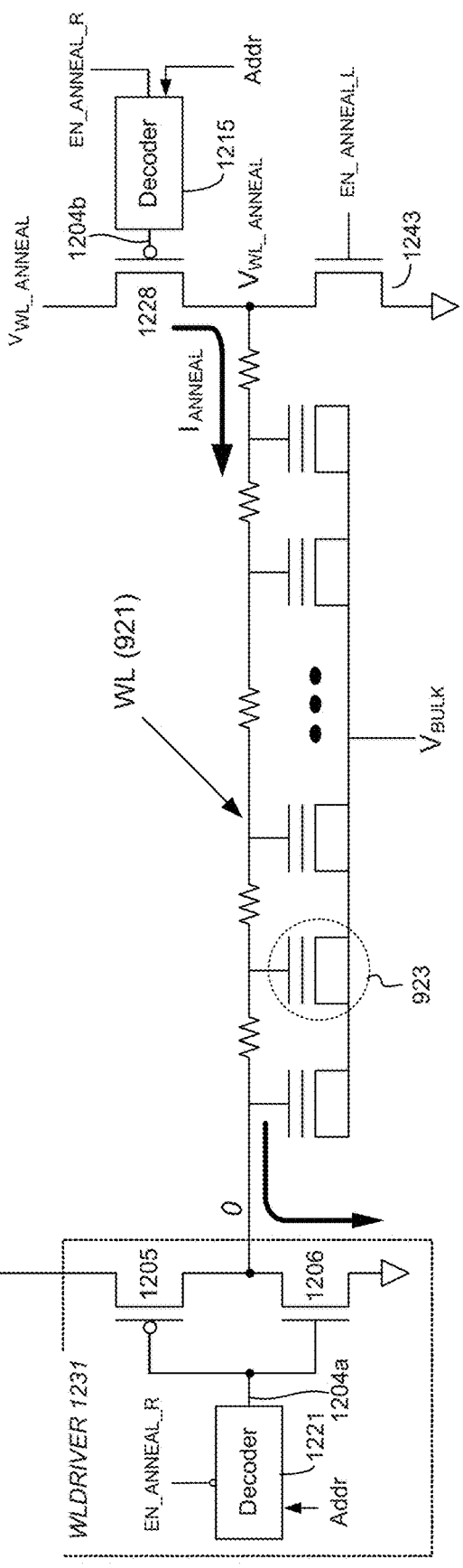

FIGS. 37, 38A and 38B illustrate particular embodiments of an annealing circuit in accordance with the principles and embodiments of FIGS. 28-36. More specifically, in the embodiment of FIG. 37, a word line 921 is accessed via word line driver 1201 and used as a heating element to anneal damaged insulators within non-volatile storage cells 923 (e.g., Flash memory cells or SONOS memory cells). The word line driver 1201 includes a decoder 1203 that asserts (i.e., lowers in this example) one of $2^M-1$ word-line-select signals 1204 (only one of which is shown in FIG. 37) in response to an M-bit address (Addr), thereby switching on word-line driver transistor 1205 and switching off word-line discharge transistor 1206. By this operation, a voltage ($V_{WL\_ANNEAL}$, $V_{WL\_WR}$ or $V_{WL\_RD}$) selected by power switch 1211 in response to an operation select signal 1212 (i.e., EN_ANNEAL, EN_WRITE, EN_READ, individually asserted according to whether an anneal, write or read operation is to be carried out) is applied to the word line 921 via transistor 1205 to enable the selected operation. In particular, during an anneal operation, EN_ANNEAL is asserted to apply the anneal voltage, $V_{WL\_ANNEAL}$ to the word line 921 and to switch on ground-path transistor 1043, thereby enabling an annealing current, $I_{ANNEAL}$ to flow through and heat the word line 921. Note that, in alternative embodiments, the write voltage ($V_{WL\_WR}$) or read voltage ($V_{WL\_RD}$) may suffice as the annealing voltage, so that a separate anneal voltage input to the power switch 1211 may be omitted. Also, the anneal voltage (or any of the voltages supplied to the power switch 1211) may be generated on-chip as discussed above, or provided from an off-chip source. Further, other on-chip structures (e.g., bit lines or dedicated heating elements) may be used as the heating element in alternative embodiments.

FIGS. 38A and 38B illustrate an alternative on-chip annealing embodiment 1225 in which annealing current may be sourced from either side of a word line 921. The annealing circuitry includes a word line driver 1231, power switch 1211 and ground-path transistor 1243 that operate generally as described in reference to FIG. 37, as well as a far-side decoder 1215 and far-side word-line driver transistor 1228. Within word line driver 1231, operation of the address decoder 1221 is selectively disabled and enabled by a far-end enable signal, EN_ANNEAL_R (enabling annealing current to be delivered from the far-end or right-side of the word line 921). Referring first to the near-side anneal operation shown in FIG. 38A, decoder 1221 is enabled to lower an address-selected one of word-line select signals 1204a when the far-end enable signal is deasserted, thereby applying a power-switch-selected voltage to the word line 921 via transistor 1205 (and shutting off transistor 1206) as discussed above. At the same time, near-side anneal enable signal (EN_ANNEAL_L) is asserted to enable $V_{WL\_ANNEAL}$ to be applied to the word line 921 via transistor 1205, and ground-path transistor 1043 is switched on to enable an annealing current ($I_{ANNEAL}$) to flow through and heat the word line 921 (and thus anneal damaged structures within non-volatile storage elements 923).

Turning to the far-side anneal operation shown in FIG. 38B, far-side enable signal, EN_ANNEAL_R, is asserted, causing decoder 1221 to deassert (raise) all word line select signals 1204a, thereby switching on transistor 1206 to provide a ground path and switching off transistor 1205 to decouple the near-side word line voltage source. The far-side enable signal, EN_ANNEAL_R, also enables operation of the far-side decoder 1215 which, in response, asserts (i.e., lowers) an address-selected one of far-side word-line select signals 1204b (only one of which is shown) to switch on far-side word-line driver transistor 1228 and thus deliver an annealing current in the direction shown.

Figure 39:
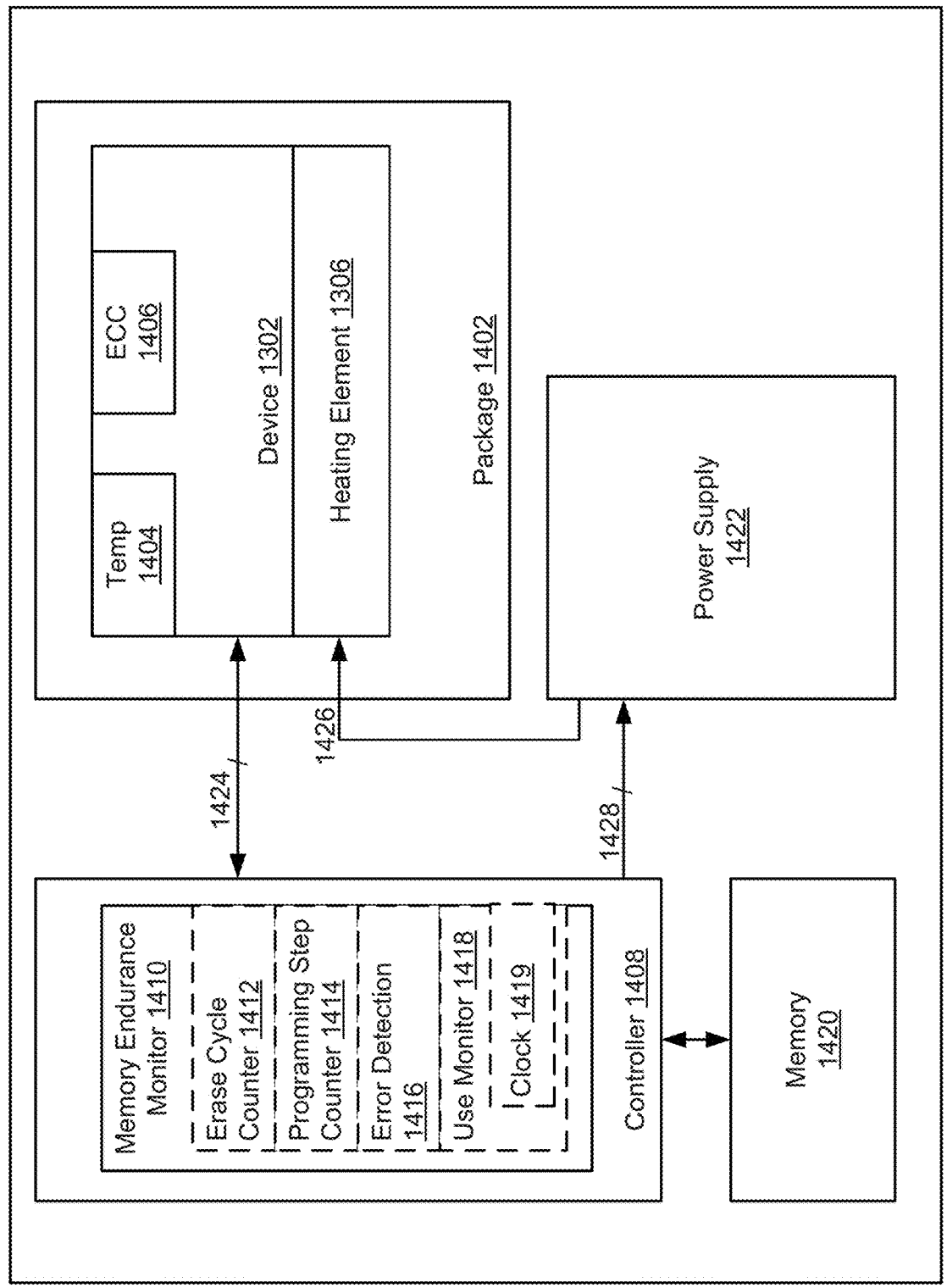
FIG. 39 is a block diagram of an electronic system that includes a semiconductor package in accordance with some embodiments.

FIG. 39 is a block diagram of an electronic system 1400 that includes a self-annealing semiconductor package 1402 in accordance with some embodiments. Examples of self-annealing semiconductor packages 1402 include packages having one or more integrated circuit dice disposed adjacent one or more heating elements. In one embodiment, for example, a die (e.g., flash memory die or SONOS die) is disposed upon a substrate and a heating element is mounted thereon with a thermally conductive adhesive layer, such as a thermally conductive tape, film, paste, adhesive, etc. In another embodiment, a heating element is disposed on the substrate with the die mounted thereon via a thermally conductive adhesive layer. In other embodiments, a stack of dice is formed within the package with at least one heating element disposed between each pair of dice (or a respective heating element provided for each die). In all such embodiments, having the heating element 1306 in the semiconductor package 1402 allows the package to be self-annealing. That is, the device 1302 may be annealed in situ in the package 1402 in its normal operating environment, after a period of operation, to reduce or eliminate defects. For example, the device 1302 may be annealed after the package 1402 has been mounted on a printed circuit board and operated for a period of time in electronic system 1400. The system 1400 may be any system that uses nonvolatile semiconductor memory such as flash memory. In some embodiments, the system 1400 is a mobile application, such as a cell phone, personal digital assistant (PDA), or music player.

The package 1402 includes a nonvolatile semiconductor memory device 1302 and a heating element 1306. In some embodiments, the package 1402 includes a temperature sensor 1404. The temperature sensor 1404 may be integrated into the device 1302. Alternatively, the temperature sensor may be integrated into the heating element 1306. The device 1302 also may include error correction coding (ECC) circuitry 1406 to detect memory errors.

The package 1402 is coupled to a controller 1408 (e.g., a microprocessor or microcontroller) via signal lines 1424. The controller 1408 is configured to determine when to anneal the device 1302 and to initiate the annealing process. For example, the controller 1408 instructs a power supply 1422 to provide power to the heating element 1306 via electrical connections 1426, thereby heating the heating element.

In some embodiments, the controller 1408 includes a memory endurance monitor 1410 that monitors a memory endurance indicator for the device 1302 to determine when to anneal the device. The monitor 1410 determines whether the indicator exceeds a predefined limit and, in response to determining that the indicator exceeds the limit, initiates the annealing process.

In some embodiments, the memory endurance monitor 1410 includes an erase cycle counter 1412 to record a count of erase cycles performed by the device 1302. The monitor 1410 compares the recorded count against a predefined count to determine whether to anneal the device 1302. The predefined count is determined, for example, by characterizing the nonvolatile memory cells of the type (i.e., of the cell design and process technology) used in the device 1302 to determine a maximum number of erase cycles that the device 1302 reliably can perform. In some embodiments, after the device 1302 has been annealed, the recorded count is reset to zero. The erase cycle counter 1412 then records a count of subsequent erase cycles performed by the device 1302. The monitor 1410 compares the count of subsequent erase cycles against the predefined count, to determine whether to anneal the device 1302 again. Alternately, instead of resetting the recorded count to zero, the erase cycle counter 1412 continues to increment the recorded count, and the monitor 1410 determines that the device is to be annealed again when the recorded count reaches an integer multiple of the predefined count.

In some embodiments, the memory endurance monitor 1410 includes a programming step counter 1414 to record a number of programming steps performed to program the device 1302. The monitor 1410 compares the recorded number of programming steps against a predefined number to determine whether to anneal the device 1302. The predefined number may be defined as a predetermined percentage or number of steps above a baseline number of steps.

In some embodiments, the memory endurance monitor 1410 includes error detection circuitry 1416 to record a count of errors detected for the device 1302. The monitor 1410 compares the recorded count of errors against a predefined number to determine whether to anneal the device 1302. Alternatively, ECC circuitry 1406 in the device 1302 records a count of errors and reports the recorded count to the controller 1408 or signals the controller 1408 when the count exceeds a predefined number. In some embodiments, after the device 1302 has been annealed, the recorded count of errors is reset to zero. The error detection circuitry 1416 then records a subsequent count of errors and the monitor 1410 compares the subsequent count of errors against the predefined number, to determine whether to anneal the device 1302 again.

In some embodiments, the memory endurance monitor 1410 includes a use monitor 1418 to record a period of use for the device 1302. The use monitor 1418 may include a clock 1419, or may be coupled to a clock external to the use monitor 1418. The monitor 1410 compares the recorded period of use against a predefined length of time to determine whether to anneal the device 1302. In some embodiments, after the device 1302 has been annealed, the recorded period of use is reset to zero. The use monitor 1418 then records a subsequent period of use and the monitor 1410 compares the subsequent period of use against the predefined length of time, to determine whether to anneal the device 1302 again. Alternately, instead of resetting the period of use to zero, the use monitor 1418 continues to record the period of use and the monitor 1410 determines that the device is to be annealed again when the recorded period of use reaches an integer multiple of the predefined length of time.

In some embodiments, the device 1302 can only be annealed a specified number of times. The controller 1408 records the number of times that the device has been annealed and will not initiate the annealing process if the recorded number of times equals or exceeds the specified number of times.

In some embodiments in which the system 1400 is a mobile application or other type of battery-powered application, the controller 1408 will delay annealing until the system 1400 is plugged into a power supply to charge the battery. The controller 1408 thus assures that sufficient power is available for annealing.

In some embodiments in which the system 1400 is a mobile application or other type of battery-powered application, the controller 1408 will anneal the system whenever 1400 is plugged into a power supply to charge the battery. This opportunistic annealing does not rely upon memory endurance monitors. Rather it only senses when power is available for annealing.

In some embodiments, during annealing, the controller 1408 monitors an annealing temperature as reported by the temperature sensor 1404. The controller adjusts the power supplied to the heating element 1306 to maintain the annealing temperature within a predetermined temperature range corresponding to a predetermined range of junction temperatures for the device 1302. For example, based on feedback from the temperature sensor 1404, the controller 1408 instructs the power supply 1422 to adjust the level of power supplied to the heating element 1306, to maintain the annealing temperature within the predetermined range. In other embodiments, instead of adjusting the level of power based on feedback, a predefined level of power is supplied to the heating element 1306.

The annealing process may corrupt data stored in the device 1302. Therefore, in some embodiments, the controller 1408 copies the data stored in the device 1302 into another memory 1420 prior to annealing, and copies the data back into the device 1302 upon completion of the annealing. The memory 1420 may be any suitable memory device within or coupled to the system 1400. For example, the memory 1420 may include one or more semiconductor memory devices or magnetic or optical disk storage devices within the system 1400. The memory 1420 may include a memory stick or memory card inserted into the system 1400. The memory 1420 may include memory in another system to which the system 1400 is coupled, either directly or through a network (e.g., through the internet). For example, the data may be transferred to a computer to which the system 1400 is coupled to charge or synchronize the system 1400. In another example, the data may be uploaded to a server and then downloaded to the device 1302 upon completion of annealing.

In some embodiments, one or more of the above-identified functions performed by the controller 1408 are implemented in software, and thus may correspond to sets of instructions for performing these functions. These sets of instructions, which may be stored in the device 1302 or other memory 1420, need not be implemented as separate software programs, procedures or modules, and thus subsets of these sets of instructions may be combined or otherwise re-arranged in various embodiments.

Although FIG. 39 describes an embodiment in which a heating element is housed within a package containing a nonvolatile semiconductor memory device to be annealed, the heating element is external to the package in alternative embodiments. For example, an external heating element is thermally coupled to the exterior of a package (or several packages) mounted on a printed circuit board. In some embodiments, the printed circuit board is a motherboard or a circuit board coupled to a motherboard, such as a module (e.g., a single- or dual-inline memory module (SIMM or DIMM)) or daughtercard. In some embodiments, the printed circuit board includes a rigid substrate; in other embodiments, the substrate is flexible. In some embodiments, the heating element is a thin-film heater, as described with respect to heating element 1306.

Figure 40:
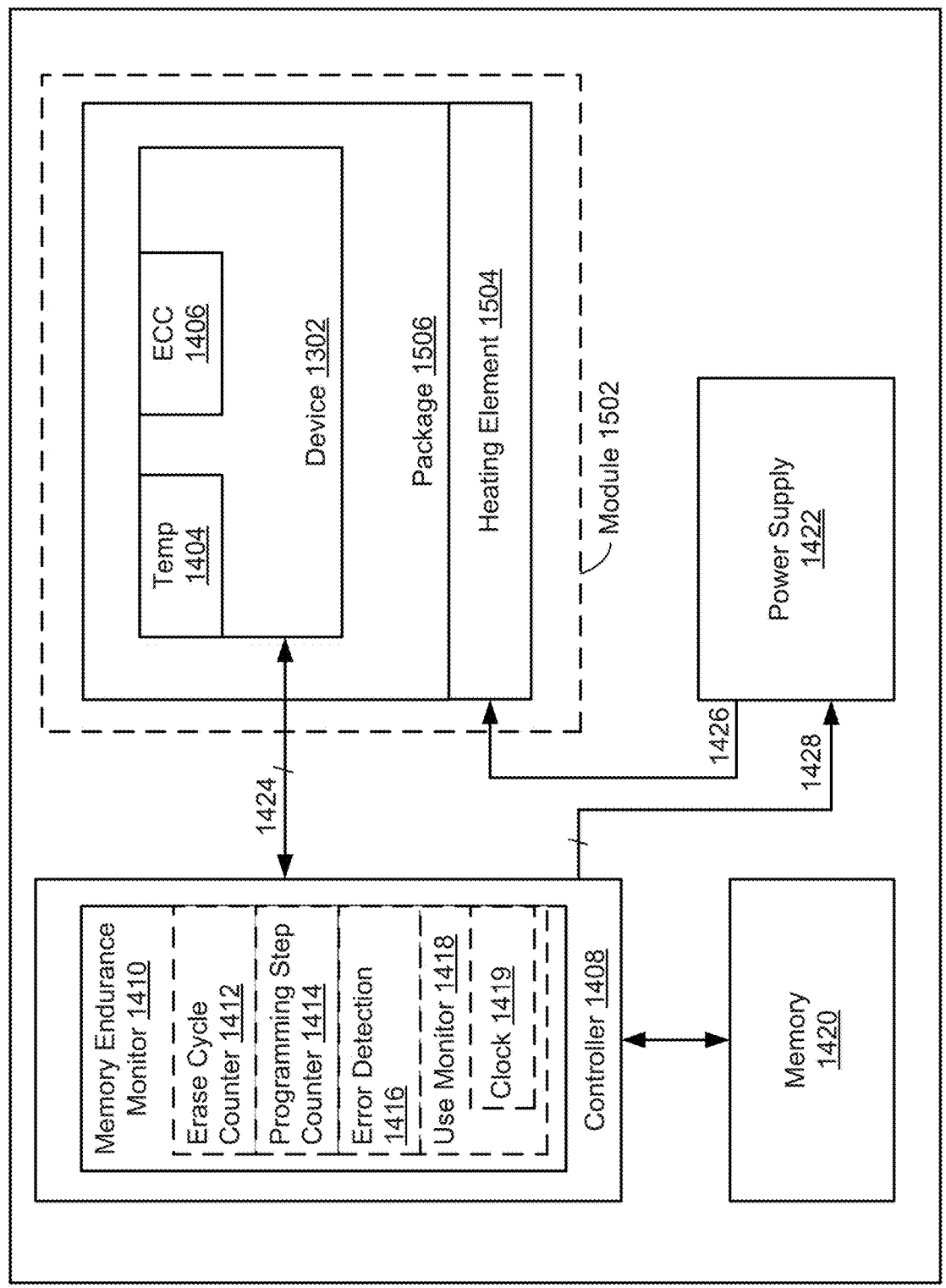
FIG. 40 is a block diagram of an electronic system that includes a module in accordance with some embodiments.

FIG. 40 is a block diagram of an electronic system 1500 that includes a self-annealing module 1502 in accordance with some embodiments. The module 1502 includes a heating element 1504 thermally coupled to a package 1506. The package 1506 includes a nonvolatile semiconductor memory device 1302. In some embodiments, the module 1502 is an in-line memory module (e.g., a dual in-line memory module or DIMM) that includes multiple packaged nonvolatile semiconductor memory devices 1506 (e.g., flash or SONOS memory devices each containing one or more integrated circuit dice) or volatile semiconductor memory devices mounted on a laminate substrate and having a respective heating elements 1504 mounted thereon (e.g., with a thermal interface material such as thermally conductive tape, film, paste, or adhesive being disposed between the packaged semiconductor memory device 1506 and heating element 1504 to conduct heat from the heating element 1504 to a respective package 1506). In other embodiments, the module 1502 is a memory module in which a single heating element 1504 covers multiple packaged semiconductor memory devices 1506 on a respective side of the laminate substrate (e.g., in a DIMM, two heating elements 1504 may be provided; one for the packaged semiconductor memory devices on each side of the substrate), with thermal interface material disposed between the heating element 1504 and packaged semiconductor memory devices to conduct heat from the heating element 1504 to the packaged devices 1506. The system 1500 may be any system that uses nonvolatile semiconductor memory such as flash memory. In some embodiments, the system 1500 is a mobile application, such as a cell phone, PDA, or music player. In some embodiments, the system 1500 is a computer system, such as a notebook or desktop PC or a server.

The system 1500 includes a controller 1408, memory 1420, and power supply 1422, which function as described for the system 1400 (FIG. 39). In some embodiments, the controller 1408, memory 1420, and/or power supply 1422 are located on the module 1502 along with the package 1506 and heating element 1504.

Figure 41:
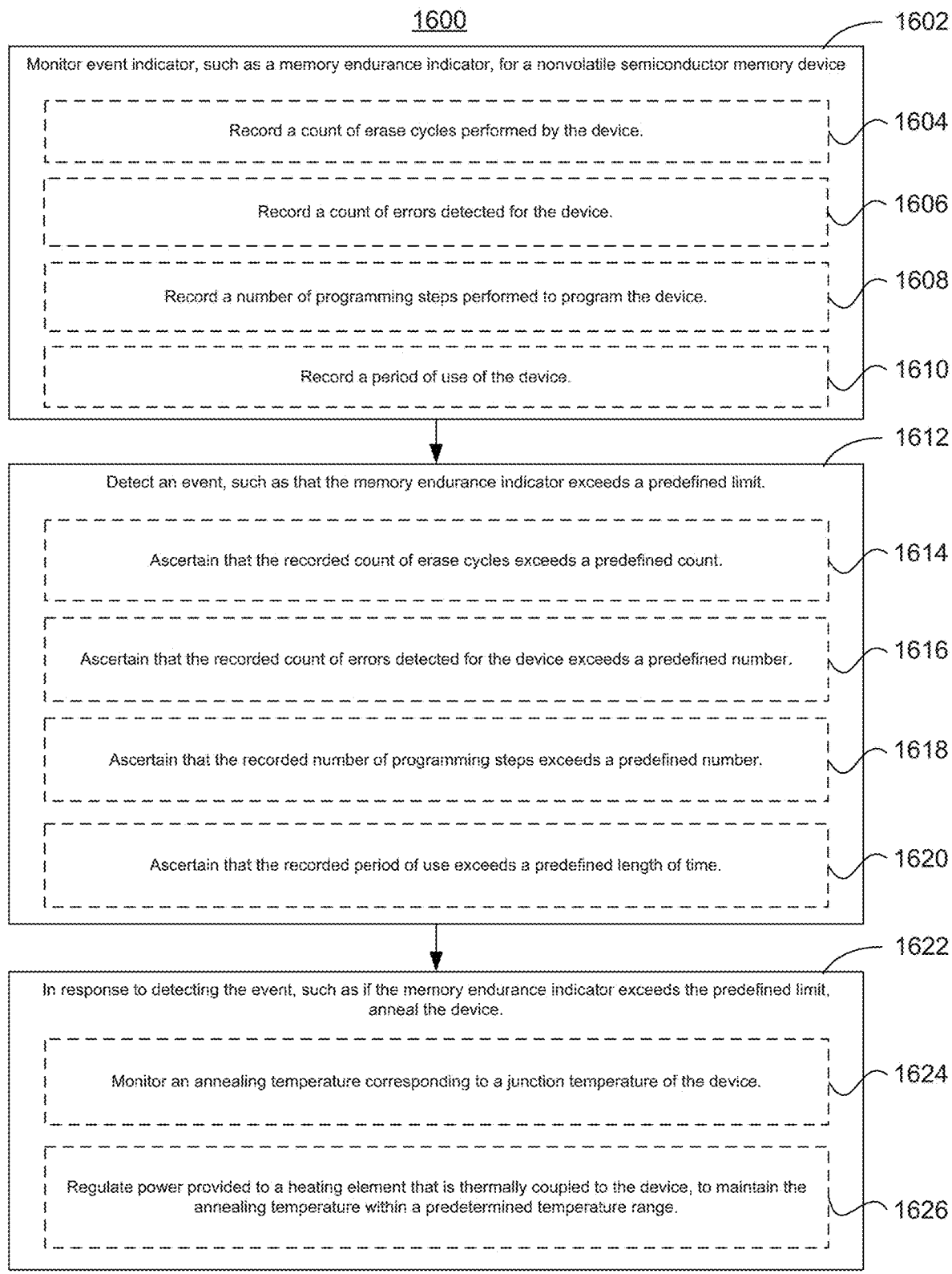
FIG. 41 is a flow diagram illustrating a method of repairing a nonvolatile semiconductor memory device in accordance with some embodiments.

FIG. 41 is a flow diagram illustrating a method 1600 of annealing a nonvolatile semiconductor memory device in accordance with some embodiments.

An event (such as a memory endurance threshold) indicator is monitored (1602) for a nonvolatile semiconductor memory device contained in a semiconductor package. In some embodiments the device corresponds to device 1302 contained in package 1402 (FIG. 39) or in package 1506 (FIG. 40). In some embodiments, the event indicator is monitored by a controller (e.g., controller 1408).

In some embodiments, monitoring the event indicator includes recording (1604) a count of erase cycles performed by the device. For example, the erase cycle counter 1412 in the controller 1408 records a count of erase cycles performed by the device 1302.

In some embodiments, monitoring the event indicator includes recording (1606) a count of errors detected for the device. For example, error detection circuitry 1416 in the controller 1408 records an error count for the device 1302.

In some embodiments, monitoring the event indicator includes recording (1608) a number of programming steps performed to program the device. For example, the programming step counter 1414 in the controller 1408 records the number of programming steps performed to program the device 1302.

In some embodiments, monitoring the event indicator includes recording (1610) a period of use of the device. For example, the use monitor 1418 in the controller 1408 records a period of use of the device 1302. Different definitions of the period of use are possible. For example, the period of use may be defined as a period of time for which the device has performed read and write operations, a period of time in which a system (e.g., 1400 or 1500) containing the device has been active, or a period of time since the system containing the device left the factory or was first activated.

In some embodiments, monitoring the event indicator includes determining whether the semiconductor device is receiving sufficient power for annealing to occur. For example, in mobile consumer electronics, such as MP3 players or cellular-telephones, the controller 1408 or power supply 1422 determines whether power is being received from an external charger plugged into a wall-outlet.

An event is then detected (1612) (e.g., by the controller 1408). For example, it is determined that the event indicator (e.g., memory endurance indicator) exceeds (1612) a predefined limit or threshold. In some embodiments, it is ascertained that the recorded count of erase cycles exceeds (1614) a predefined count. In some embodiments, it is ascertained that the recorded count of errors detected for the device exceeds (1618) a predefined number. In some embodiments, it is ascertained that the recorded number of programming steps exceeds (1618) a predefined number. In some embodiments, it is ascertained that the recorded period of use exceeds (1620) a predefined length of time.

In response to detecting the event, the device is annealed (1622). For example, it is determining that the memory endurance indicator exceeds the predefined limit. Annealing occurs, for example, by the controller 1408 instructing the power supply 1422 to supply power to the heating element 1306 (FIG. 39) or 1504 (FIG. 40), which is thermally coupled to the device.

In some embodiments, the annealing only occurs when an appropriate external physical event occurs. For example, if the nonvolatile semiconductor memory device is contained in a mobile consumer device, such as a MP3 player or cellular-telephone, and it is determined that annealing should occur, then annealing only occurs the next time that the device is coupled to an external power source, such as a charger plugged into a wall-outlet. This opportunistic annealing is useful given the limited power capability of some mobile consumer devices. Alternatively, annealing occurs even when the memory endurance monitor would not normally require annealing to occur, for example, at predetermined intervals.

In some embodiments, an annealing temperature corresponding to a junction temperature of the device is monitored (1624) (e.g., by a temperature sensor 1404). In some embodiments, power provided to a heating element (e.g., 1306 or 1504) that is thermally coupled to the device is regulated (1626) to maintain the annealing temperature within a predetermined range. For example, the controller 1408 provides instructions to the power supply 1422 to regulate power supplied to the heating element, based on feedback from the temperature sensor 1404. In some embodiments, the predefined range of annealing temperatures corresponds to a range of junction temperatures of 200° C. to 300° C., or 200° C. to 250° C., 250° C. to 300° C., or even in some instances as low as 150° C.–200° C.

In some embodiments, the device is annealed for a predetermined period of time. For example, the nonvolatile memory cells of the type (i.e., of the cell design and process technology) used in the device 1302 are characterized to determine a period of time sufficient to anneal out defects at a given junction temperature or range of junction temperatures. The controller 1408 is programmed to anneal the device for the determined period of time at the corresponding annealing temperature or range of temperatures. In some embodiments, the period of time is 60-70 seconds. In some embodiments, the period of time is as short as 5-10 seconds, while in other embodiments the period of time is as long as tens of minutes. The period of time may be based on empirical data for the particular device(s), package, etc.

It should be appreciated that in some embodiments, the annealing temperature and duration of the annealing process is determined empirically for each new semiconductor device, package, or system design. For example, a prototype semiconductor device is first benchmarked by measuring operational characteristics such as the number of program/erase operations that can be performed within a certain time period, or how long it takes to program/erase a memory cell. Then the device is operated for an extended period of time until defects occur. Again, defects are measured against the benchmarked operational characteristics. The device is then annealed at a particular temperature and for a particular duration. The operational characteristics are again measured for improvement. The process may then be repeated for different annealing temperatures and/or durations using the same or similar devices to determine the optimum annealing temperature and duration for that particular device design. The same process may be used to determine the optimum annealing temperature and duration for semiconductor packages or systems.

Electronic Representation—Computer-Readable Media

It should be noted that the user-interface 680 of FIG. 23 and the underlying program code (i.e., sequences of instructions and related data) used to present the user-interface, receive user-input and execute the underlying anneal management operations may be recorded on one or more computer-readable media for later retrieval and execution within one or more processors of a special purpose or general purpose computer system or consumer electronic device or appliance. Computer-readable media in which such instructions and data may be embodied include, but are not limited to, machine-readable storage media in various forms. Examples of such machine-readable media include, for example and without limitation, optical, magnetic or semiconductor storage media such as floppy disk, CD, DVD, active RAM within a computer, or any other type of physical device from which the instructions may be extracted under full or partial control of a machine.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, various forms of machine-readable storage media as discussed above (e.g., optical, magnetic or semiconductor storage media).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

It should readily be appreciated that various implementations of the aforementioned principles will also occur to those having skill in the art.

For example, as mentioned, passive evacuation techniques presented above may be used to prepare a device (e.g., non-volatile memory) for later replacement or other maintenance. As mentioned, techniques applicable to such evacuation may include a progressively escalated evacuation including a passive evacuation followed by an active evacuation, if desired, triggered in response to milestones or user-directed implementation. These techniques may be managed by hardware (such as an anneal controller), with some, most or all of these functions offloaded to software. Other features from the processes mentioned above may be further combined with these techniques, as appropriate.

Other architectures based on annealable devices and an anneal controller may also be used. For example, as exemplified in FIG. 26, a system may comprise a memory controller, multiple annealable devices (e.g., integrated circuits having heating elements) and an anneal controller having control paths for the heating element circuitry for each of the annealable devices. The anneal controller, among other things, may regulate a relatively high voltage supply used to drive each anneal process and serve the function of heater control circuitry. The high voltage supply can either be integrated with the anneal controller or implemented via a separate chip (IC), and the anneal controller may be combined with a memory controller, or may be implemented in a separate IC.

In addition, any of the techniques mentioned above may be implemented in a device that monitors the need for a memory maintenance event, where the memory is one element of a multiple element storage system, that permits a user to specify actions upon detection of the need for the maintenance event, and that permits a user to take actions at predetermined or programmable milestones (e.g., as the need for annealing or other maintenance becomes more acute). Such a system may include a general purpose computer system running appropriate software. A user may be provided with a set of one or more options for rerouting data from the memory, to thereby passively or actively evacuate the memory during run-time of a system; for example, a user may select a methodology for evacuation, including evacuation to other devices within the same tier (e.g., flash devices in main memory), secondary storage, or temporary storage in controller "scratch" memory, or cache. In one example, these functions may be provided as part of a computer operating system or as software distributed for installation on existing computer systems.

Yet another form of the principles exemplified above is an embodiment where multiple tiers of memory are managed, with anneal cycles being performed in one of the tiers, and evacuation and/or data rebuild following anneal relying upon one of the other tiers of memory. For example, as introduced above, the annealable devices may include multiple flash devices that make up part or all of main memory, while other tiers of memory may include processor cache and an optional secondary hard disk storage. Such an implementation facilitates the development of portable devices rooted in nonvolatile main memory (e.g., a handheld or laptop computer) with the use of anneal or memory replacement to extend portable device effective lifetime.

In another implementation, these techniques may also be used with a software utility that displays to the user an indication or gauge (e.g., a pictograph) of remaining device lifetime, based on maximum permitted write cycles, a time period, measured criteria, or using other parameters as discussed above. Such a gauge may then be further employed with logic that selectively performs data evacuation or which otherwise prepares memory for replacement or maintenance. Such a software utility can also be distributed as part of an operating system or as separately distributed software, either with or without anneal capabilities.

Generally speaking, the principles presented above provide a method of in-system annealing or otherwise performing maintenance for a memory device, where memory contents are evacuated, where the anneal or maintenance is performed, and where memory is refilled, as appropriate. For some embodiments, an evacuation step may be performed prior to an anneal; in other embodiments (e.g., where a backup of data already exists, such as in a RAID system), the evacuation step may be replaced with a post anneal (or post maintenance step), i.e., with no prior evacuation, with redundancy being reestablished through a refill step in lieu of evacuation. These techniques may be applied with flash memory or with other forms of memory.

The section headings provided in this detailed description are for convenience of reference only, and in no way define, limit, construe or describe the scope or extent of such sections. Also, while the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A data storage system comprising:
   non-volatile semiconductor memories; and
   control circuitry to detect, during operation of the data storage system, an event indicating use-related degradation of one or more of the non-volatile semiconductor memories and, in response to detecting the event, to heat the one or more non-volatile semiconductor memories to counteract the use-related degradations,
   wherein the control circuitry to detect the event indicating use-related degradation of the one or more of the non-volatile semiconductor memories comprises circuitry to detect that a threshold number of performance-degrading operations have been executed within the one or more of the non-volatile semiconductor memories.

2. The data storage system of claim 1 wherein the non-volatile semiconductor memories are disposed within respective integrated-circuit dies.

3. The data storage system of claim 2 wherein data storage system implements, at least in part, a solid-state storage drive (SSD) containing the integrated-circuit dies.

4. The data storage system of claim 2 wherein the data storage system comprises a memory-module substrate having an edge connector and having the integrated-circuit dies disposed one at least one face of the memory-module substrate and conductively coupled to the edge connector to implement a memory module that may be removably inserted into a memory-module receptacle of a data processing system.

5. The data storage system of claim 2 wherein the control circuitry comprises a plurality of heat generating circuits disposed respectively within the integrated-circuit dies to enable heating of respective ones of the non-volatile semiconductor memories.

6. The data storage system of claim 2 wherein the control circuitry comprises a plurality of heat generating circuits disposed adjacent respective ones of the integrated-circuit dies to enable heating of respective ones of the non-volatile semiconductor memories.

7. The data storage system of claim 1 wherein the non-volatile semiconductor memories comprise non-volatile storage cells that exhibit, as an aspect of use-related degradation, progressively degraded data retention times as programming operations are executed to stored data within the non-volatile storage cells.

8. The data storage system of claim 7 wherein the non-volatile storage cells comprise floating-gate field-effect-transistor storage elements.

9. The data storage system of claim 1, wherein the circuitry to detect that the threshold number of performance-degrading operations have been executed comprises a programmable register and circuitry to store a value indicative of the threshold number of performance-degrading operations within the programmable register upon receiving the value from a source external to the data storage system.

10. A data storage system comprising:
    non-volatile semiconductor memories; and
    control circuitry to detect, during operation of the data storage system, an event indicating use-related degradation of one or more of the non-volatile semiconductor memories and, in response to detecting the event, to heat the one or more non-volatile semiconductor memories to counteract the use-related degradation;
    wherein the circuitry to detect the event indicating use-related degradation of the one or more of the non-volatile semiconductor memories comprises circuitry to determine that a threshold quantity of errors have been detected during operation of the non-volatile semiconductor memories.

11. The data storage system of claim 10 wherein the circuitry to determine that the threshold quantity of errors have been detected during operation of the non-volatile semiconductor memories comprises circuitry to determine that the threshold quantity of errors have been detected within a time interval such that a threshold error rate has been reached.

12. A method of operation within a data storage system, the method comprising:
    detecting an event indicating use-related degradation of one or more of the non-volatile semiconductor memories within the data storage system; and,
    in response to detecting the event, heating the one or more non-volatile semiconductor memories to counteract the use-related degradation;
    wherein detecting the event indicating use-related degradation of the one or more of the non-volatile semiconductor memories comprises detecting that a threshold number of performance-degrading operations have been executed within the one or more of the non-volatile semiconductor memories.

13. The method of claim 12 wherein the one or more non-volatile semiconductor memories are disposed within respective integrated-circuit dies.

14. The method of claim 13 wherein the integrated-circuit dies constitute, at least in part, a data storage memory within a solid-state storage drive (SSD).

15. The method of claim 13 wherein the integrated-circuit dies are disposed on at least one face of a memory-module substrate having an edge connector conductively coupled to the integrated-circuit dies.

16. A method of operation within a data storage system, the method comprising:
 detecting an event indicating use-related degradation of one or more of the non-volatile semiconductor memories within the data storage system; and,
 in response to detecting the event, heating the one or more non-volatile semiconductor memories to counteract the use-related degradation;
 wherein the one or more non-volatile semiconductor memories are disposed within respective integrated-circuit dies;
 wherein heating the one or more non-volatile semiconductor memories to counteract the use-related degradation comprises activating one or more heat generating circuits disposed respectively within the integrated-circuit dies.

17. A method of operation within a data storage system, the method comprising:
 detecting an event indicating use-related degradation of one or more of the non-volatile semiconductor memories within the data storage system; and,
 in response to detecting the event, heating the one or more non-volatile semiconductor memories to counteract the use-related degradation;
 wherein the one or more non-volatile semiconductor memories are disposed within the respective integrated-circuit dies;
 wherein heating the one or more non-volatile semiconductor memories to counteract the use-related degradation comprises activating one or more heat generating circuits disposed adjacent respective ones of the integrated-circuit dies.

18. A method of operation within a data storage system, the method comprising:
 detecting an event indicating use-related degradation of one or more of the non-volatile semiconductor memories within the data storage system; and,
 in response to detecting the event, heating the one or more non-volatile semiconductor memories to counteract the use-related degradation;
 wherein the event indicating use-related degradation of the one or more of the non-volatile semiconductor memories comprises determining that a threshold quantity of errors have been detected during operation of the non-volatile semiconductor memories.

* * * * *